United States Patent
Leong et al.

(10) Patent No.: US 9,847,291 B2
(45) Date of Patent: *Dec. 19, 2017

(54) CIRCUITS INCORPORATING INTEGRATED PASSIVE DEVICES HAVING INDUCTANCES IN 3D CONFIGURATIONS AND STACKED WITH CORRESPONDING DIES

(71) Applicant: Marvell World Trade LTD., St. Michael (BB)

(72) Inventors: Poh Boon Leong, Cupertino, CA (US); Hou Xian Loo, Singapore (SG); Sehat Sutardja, Los Altos Hills, CA (US); Wei Ding, Singapore (SG); Huy Thong Nguyen, Singapore (SG)

(73) Assignee: Marvell World Trade Ltd., St. Michael (BB)

(*) Notice: Subject to any disclaimer, the term of this patent is extended or adjusted under 35 U.S.C. 154(b) by 218 days.

This patent is subject to a terminal disclaimer.

(21) Appl. No.: 14/627,492

(22) Filed: Feb. 20, 2015

(65) Prior Publication Data
US 2015/0289360 A1    Oct. 8, 2015

Related U.S. Application Data

(60) Provisional application No. 61/974,148, filed on Apr. 2, 2014, provisional application No. 61/994,570, filed
(Continued)

(51) Int. Cl.
*H05K 7/00* (2006.01)
*H01L 23/522* (2006.01)
(Continued)

(52) U.S. Cl.
CPC ......... *H01L 23/5227* (2013.01); *H01F 27/28* (2013.01); *H01L 23/49827* (2013.01);
(Continued)

(58) Field of Classification Search
USPC ........................ 361/782, 760, 738
See application file for complete search history.

(56) References Cited

U.S. PATENT DOCUMENTS 6,144,606 A    11/2000   Pan
6,459,554 B1   10/2002   Meiners et al.
(Continued)

OTHER PUBLICATIONS

IEEE P802.11ad / D5.0 (Draft Amendment based on IEEE P802.11REVmb D10.0) (Amendment to IEEE 802.11REVmb D10.0 as amended by IEEE 802.11ae D5.0 and IEEE 802.11aa D6.0); Draft Standard for Information Technology—Telecommunications and Information Exchange Between Systems—Local and Metropolitan Area Networks—Specific Requirements; Part 11: Wireless LAN Medium Access Control (MAC) and Physical Layer (PHY) Specifications—Amendment 3: Enhancements for Very High Throughput in the 60 GHz Band; Sponsor IEEE 802.11 Committee of the IEEE Computer Society; Sep. 2011; 601 pages.

(Continued)

*Primary Examiner* — Andargie M Aychillhum

(57) ABSTRACT

A circuit including a die and an integrated passive device. The die includes a first substrate and at least one active device. The integrated passive device includes a first layer, a second substrate, a second layer and an inductance. The inductance includes vias, where the vias are implemented in the second substrate. The inductance is implemented on the first layer, the second substrate, and the second layer. A resistivity per unit area of the second substrate is greater than a resistivity per unit area of the first substrate. The third layer is disposed between the die and the integrated passive device. The third layer includes pillars, where the pillars respectively connect ends of the inductance to the at least one active device. The die, the integrated passive device and the third layer are disposed relative to each other to form a stack.

41 Claims, 40 Drawing Sheets

Related U.S. Application Data on May 16, 2014, provisional application No. 62/032,821, filed on Aug. 4, 2014.

(51) Int. Cl.

| | | |
|---|---|---|
| *H01F 27/28* | (2006.01) | |
| *H01L 23/498* | (2006.01) | |
| *H05K 1/02* | (2006.01) | |
| *H05K 1/18* | (2006.01) | |
| *H01L 23/64* | (2006.01) | |
| *H01L 23/66* | (2006.01) | |
| *H01L 25/16* | (2006.01) | |
| *H03H 7/42* | (2006.01) | |
| *H01L 23/00* | (2006.01) | |

(52) U.S. Cl.
CPC ...... *H01L 23/5221* (2013.01); *H01L 23/5226* (2013.01); *H01L 23/645* (2013.01); *H01L 23/66* (2013.01); *H01L 24/17* (2013.01); *H01L 24/94* (2013.01); *H01L 25/16* (2013.01); *H05K 1/0213* (2013.01); *H05K 1/181* (2013.01); *H01L 24/05* (2013.01); *H01L 24/13* (2013.01); *H01L 24/16* (2013.01); *H01L 24/48* (2013.01); *H01L 2223/6672* (2013.01); *H01L 2224/0401* (2013.01); *H01L 2224/05624* (2013.01); *H01L 2224/131* (2013.01); *H01L 2224/13147* (2013.01); *H01L 2224/16265* (2013.01); *H01L 2224/17051* (2013.01); *H01L 2224/17181* (2013.01); *H01L 2224/48091* (2013.01); *H01L 2224/48227* (2013.01); *H01L 2224/73204* (2013.01); *H01L 2224/73253* (2013.01); *H01L 2224/73257* (2013.01); *H01L 2224/73265* (2013.01); *H01L 2224/94* (2013.01); *H01L 2924/00014* (2013.01); *H01L 2924/19107* (2013.01); *H03H 7/42* (2013.01); *H05K 2201/1003* (2013.01)

(56) References Cited

U.S. PATENT DOCUMENTS

| | | |
|---|---|---|
| 6,714,067 B1 | 3/2004 | Farrenkopf |
| 6,891,426 B2 | 5/2005 | Zeng et al. |
| 6,975,164 B1 | 12/2005 | Matsui et al. |
| 7,356,213 B1 | 4/2008 | Cunningham et al. |
| 7,439,798 B2 | 10/2008 | Kouno et al. |
| 7,817,880 B1 | 10/2010 | Drost et al. |
| 7,840,136 B1 | 11/2010 | Cunningham et al. |
| 7,859,325 B2 | 12/2010 | Chiu et al. |
| 8,952,747 B1 | 2/2015 | Shreeve |
| 9,444,510 B2 | 9/2016 | Leong et al. |
| 2010/0127345 A1 | 5/2010 | Sanders et al. |
| 2010/0225436 A1 | 9/2010 | Papavasiliou et al. |
| 2010/0315157 A1 | 12/2010 | Na et al. |
| 2011/0042798 A1 | 2/2011 | Pagaila et al. |
| 2011/0080150 A1 | 4/2011 | Wang et al. |
| 2011/0163414 A1 | 7/2011 | Lin et al. |
| 2011/0291786 A1 | 12/2011 | Li et al. |
| 2012/0049334 A1 | 3/2012 | Pagaila et al. |
| 2012/0181673 A1 | 7/2012 | Pagaila et al. |
| 2013/0069239 A1 | 3/2013 | Kim et al. |
| 2013/0201316 A1 | 8/2013 | Binder et al. |
| 2013/0201406 A1 | 8/2013 | Ling et al. |
| 2013/0229926 A1 | 9/2013 | Lu et al. |
| 2014/0070422 A1 | 3/2014 | Hsiao et al. |
| 2015/0289360 A1 | 10/2015 | Leong et al. |
| 2015/0364418 A1* | 12/2015 | Leong ................. H01L 23/5221 257/531 |

OTHER PUBLICATIONS

IEEE Std 802.20-2008; IEEE Standard for Local and metropolitan area networks; Part 20: Air Interface for Mobile Broadband Wireless Access Systems Supporting Vehicular Mobility—Physical and Media Access Control Layer Specification; IEEE Computer Society; Sponsored by the LAN/MAN Standards Committee; Aug. 29, 2008; 1032 pages.

IEEE Std. 802.11-2012; IEEE Standard for Information technology—Telecommunications and information exchange between systems Local and metropolitan area networks—Specific requirements; Part 11: Wireless LAN Medium Access Control (MAC) and Physical Layer (PHY) Specifications; IEEE Computer Society; Sponsored by the LAN/MAN Standards Committee; Mar. 29, 2012; 2793 pages.

"Specification of the Bluetooth System" Master Table of Contents & Compliance Requirements—Covered Core Package version: 4.0; Jun. 30, 2010; 2302 pages.

IEEE P802.11ah / D1.0 (Amendment to IEEE Std 802.11REVmc / D1.1, IEEE Std 802.11ac / D5.0 and IEEE Std 802.11af / D3.0) Draft Standard for Information technology—Telecommunications and information exchange between systems Local and metropolitan area networks—Specific requirements; Part 11: Wireless LAN Medium Access Control (MAC) and Physical Layer (PHY) Specifications; Amendment 6: Sub 1 GHz License Exempt Operation; Prepared by the 802.11 Working Group of the LAN/MAN Standards Committee of the IEEE Computer Society; Oct. 2013; 394 pages.

IEEE Std. 802.3-2002 (Revision of IEEE Std. 802.3, 2000 Edition); IEEE Standard for Information technology—Telecommunications and information exchange between systems—Local and metropolitan area networks—Specific requirements; Part 3: Carrier sense multiple access with collision detection (CSMA/CD) access method and physical layer specifications; IEEE Computer Society; Sponsored by the LAN/MAN Standards Committee; Mar. 8, 2002; 1538 pages.

Invitation to Pay Additional Fees for PCT Application No. PCT/US2015/016889 dated Jun. 1, 2015; 7 pages.

Invitation to Pay Additional Fees for PCT Application No. PCT/US2015/016823 dated Jun. 1, 2015; 6 pages.

IEEE P802.11ad/D5.0, Sep. 2011; Part 11: Wireless LAN Medium Access Control (MAC) and Physical Layer (PHY) Specification.

IEEE P802.11ac/D2.0, Jan. 2012; Part 11: Wireless LAN Medium Access Control (MAC) and Physical Layer (PHY) Specification.

Part 11: Wireless LAN Medium Access Control (MAC) and Physical Layer (PHY) Specification.

IEEE P802.11; Wireless LANs, Proposed Specification Framework for TGah; Mar. 2012.

IEEE P802.20 V14; System Requirements for IEEE 802.20 Mobile Broadband Wireless Access Systems Version 14; Jul. 2014.

IEEE Part 16: Air Interface Broadband Wirless Access Systems.

\* cited by examiner

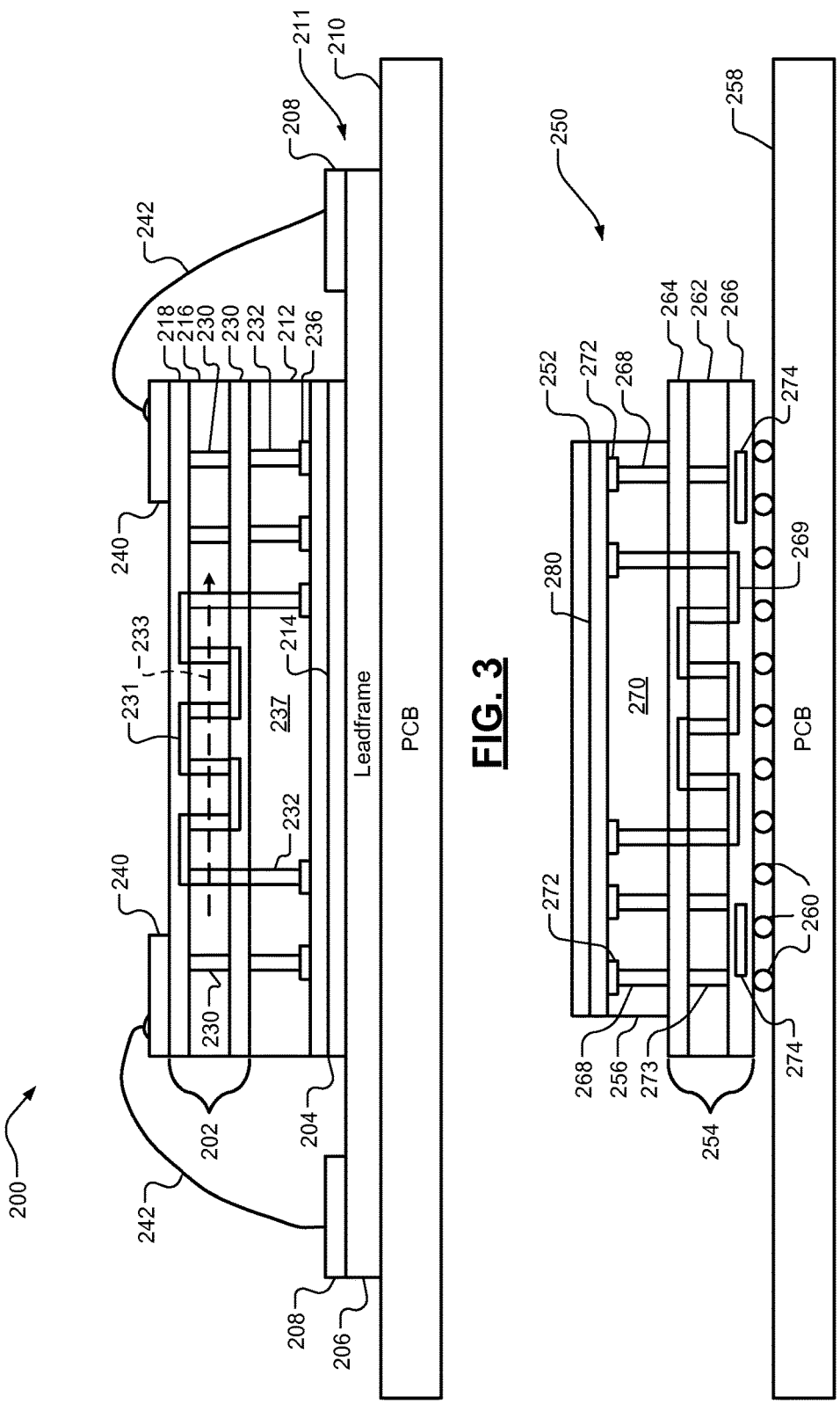

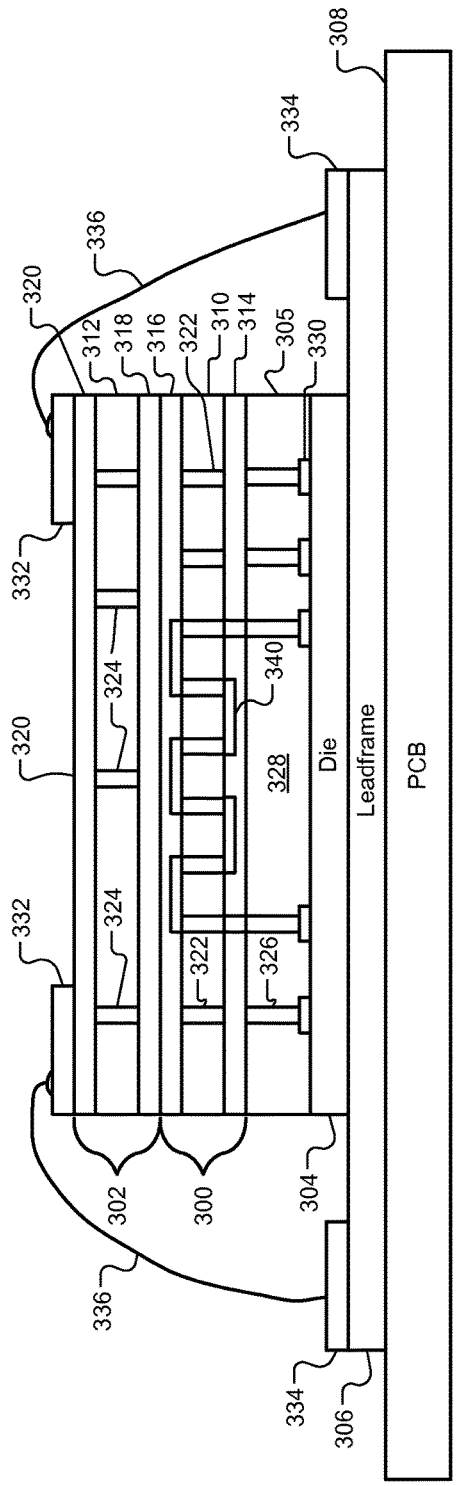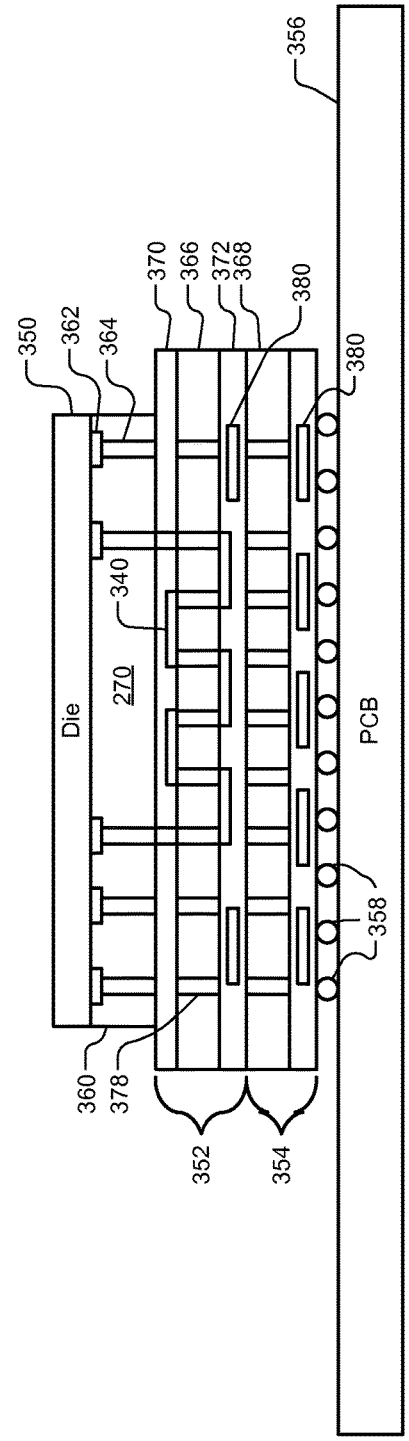

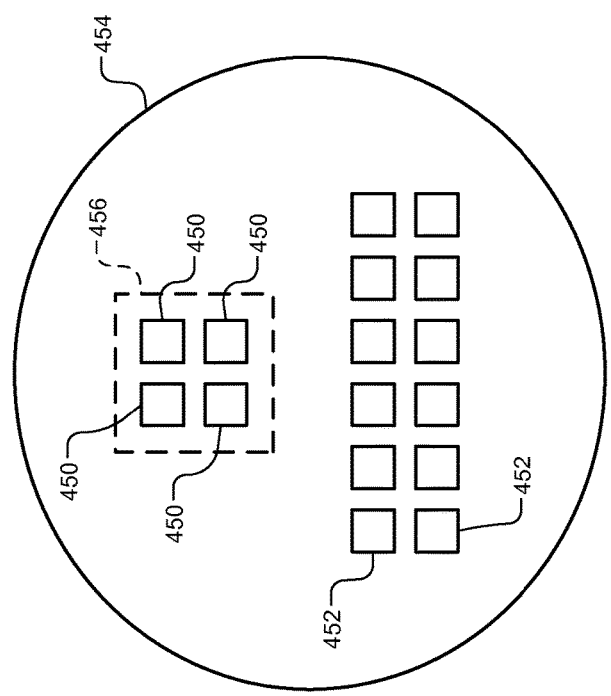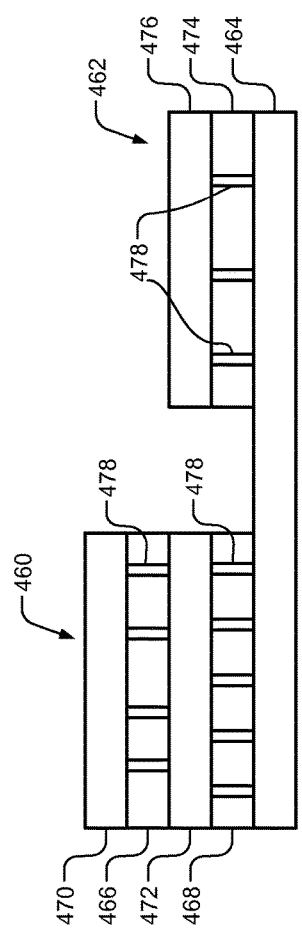

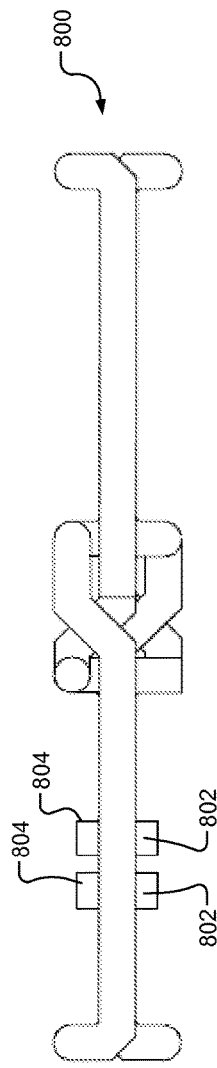
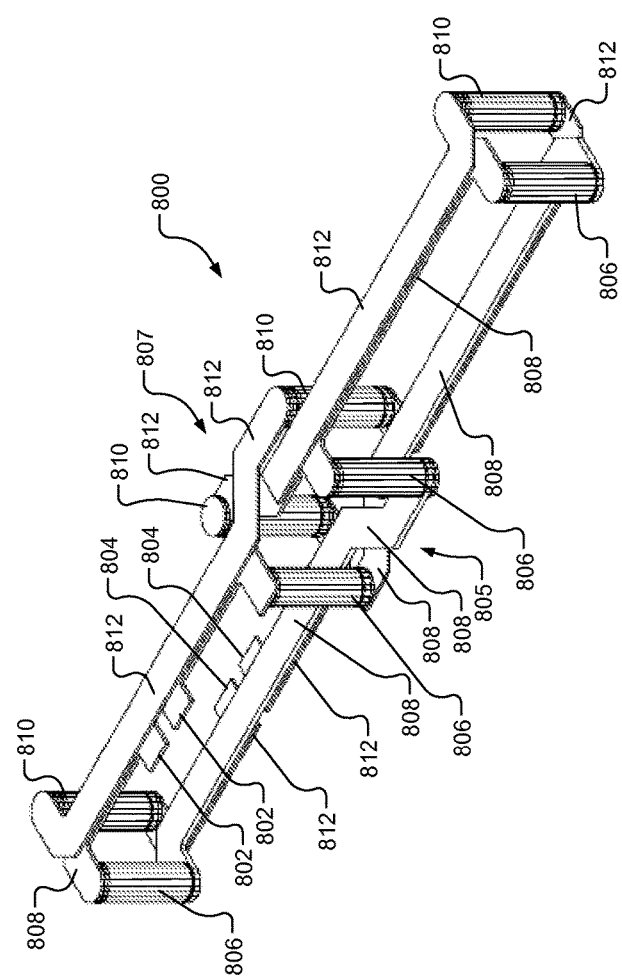
FIG. 25
FIG. 26

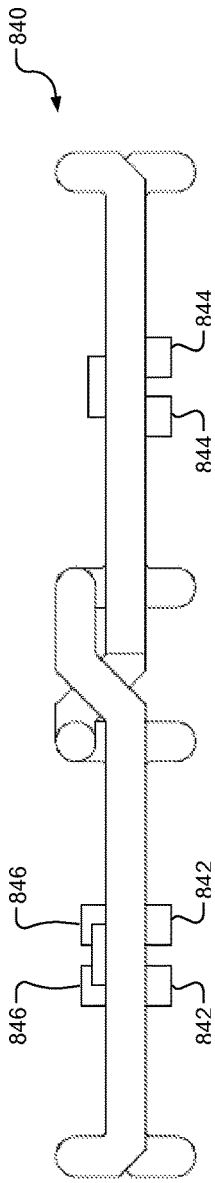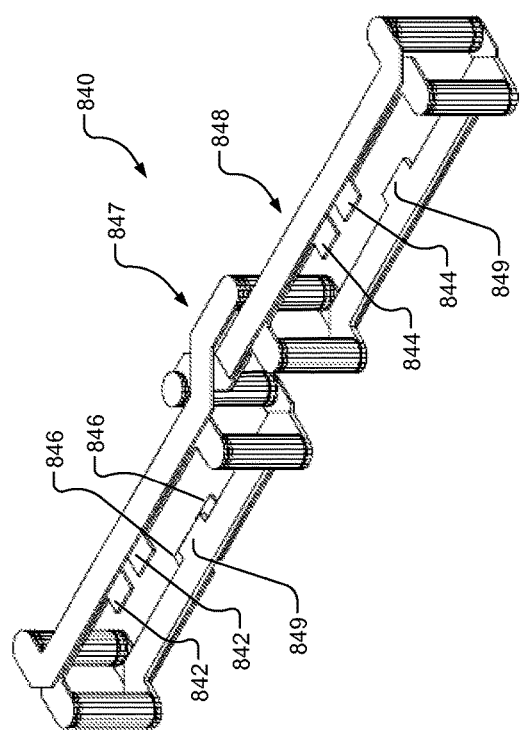

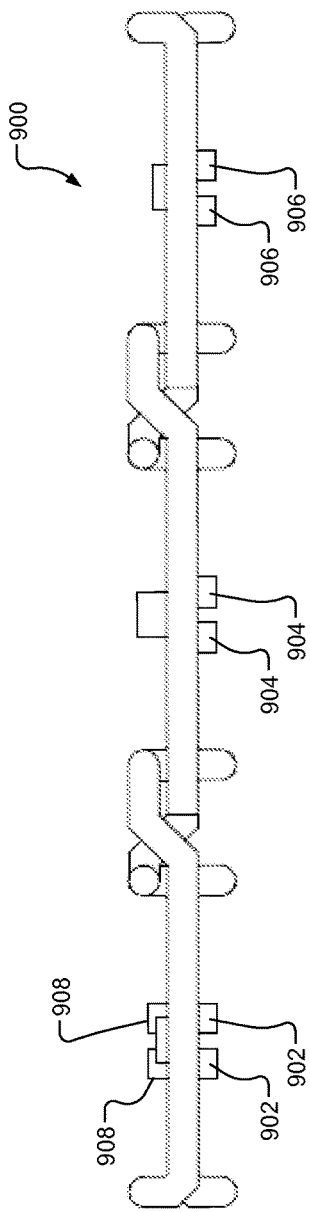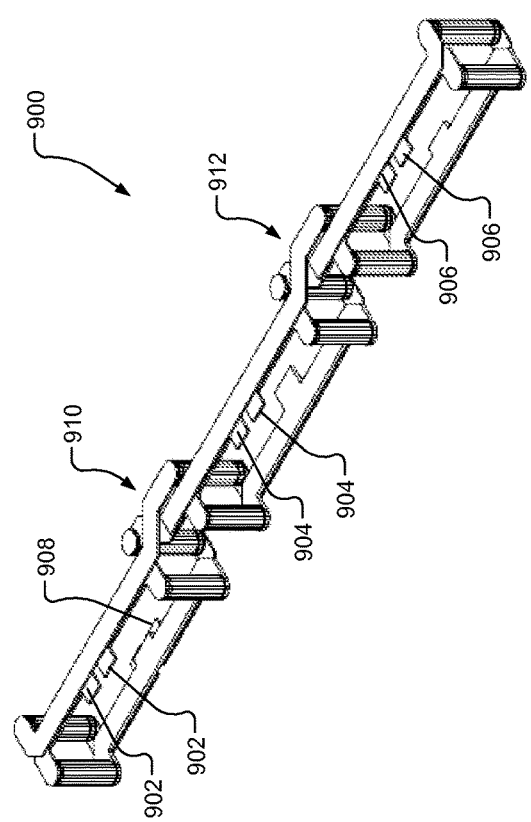

CIRCUITS INCORPORATING INTEGRATED PASSIVE DEVICES HAVING INDUCTANCES IN 3D CONFIGURATIONS AND STACKED WITH CORRESPONDING DIES

CROSS-REFERENCE TO RELATED APPLICATIONS

This application claims the benefit of U.S. Provisional Application No. 61/974,148, filed on Apr. 2, 2014, U.S. Provisional Application No. 61/994,570, filed on May 16, 2014, and U.S. Provisional Application No. 62/032,821, filed on Aug. 4, 2014. This application is related to co-pending U.S. Non-provisional application Ser. No. 14/627,354, filed on Feb. 20, 2015. The entire disclosures of the applications referenced above are incorporated herein by reference.

FIELD

The present disclosure relates to wireless communication circuits, and more particularly to radio frequency transceiver circuits.

BACKGROUND

A wireless network device can include a physical layer module that includes a radio frequency (RF) switch circuit, a filter and an antenna. The RF switch circuit switches between (i) connecting a transmit circuit to the filter, and (ii) connecting a receive circuit to the filter. The filter is connected to an antenna and filters signals transmitted from or received by the antenna. The transmit circuit may include one or more amplifiers including a power amplifier. The receive circuit may include one or more amplifiers including a low noise amplifier. The physical layer module may include active devices (e.g., switches and amplifiers) and passive devices (e.g., inductances, transformer, capacitances, resistances, and couplers).

The RF switch circuit typically includes one or more impedance matching circuits. As an example, an impedance matching circuit may be provided between (i) the filter, and (ii) the transmit circuit and the receive circuit. The impedance matching circuit directs a high-power transmit signal from the transmit circuit to the antenna while at the same time preventing the high-power transmit signal from being received by the receive circuit.

SUMMARY

A circuit is provided and includes a die and an integrated passive device. The die includes a first substrate and at least one active device. The integrated passive device includes a first layer, a second substrate, a second layer and an inductance. The inductance includes vias, where the vias are implemented in the second substrate. The inductance is implemented on the first layer, the second substrate, and the second layer. A resistivity per unit area of the second substrate is greater than a resistivity per unit area of the first substrate. The third layer is disposed between the die and the integrated passive device. The third layer includes pillars, where the pillars respectively connect ends of the inductance to the at least one active device. The die, the integrated passive device and the third layer are disposed relative to each other to form a stack.

In other features, a method of forming a stack of a circuit is provided. The method includes: providing a die including a first substrate and at least one active device; and providing an integrated passive device including a first layer, a second substrate, a second layer and an inductance, where the inductance includes vias, where the vias are implemented in the second substrate. The inductance is implemented on the first layer, the second substrate, and the second layer. A resistivity per unit area of the second substrate is greater than a resistivity per unit area of the first substrate. A third layer is disposed between the die and the integrated passive device. The third layer includes pillars, where the pillars respectively connect ends of the inductance to the at least one active device. The die, the integrated passive device and the third layer are disposed relative to each other to form the stack.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF DRAWINGS

FIG. 3 is a cross-sectional side view of a bond wire package including an integrated passive device stacked on a die in accordance with the present disclosure.

FIG. 4 is a cross-sectional side view of a flip chip package including a die stacked on an integrated passive device in accordance with the present disclosure.

FIG. 5 is a cross-sectional side view of multiple integrated passive devices stacked on a die in accordance with the present disclosure.

FIG. 6 is a cross-sectional side view of a die and multiple stacked integrated passive devices in accordance with the present disclosure.

FIG. 8 is a top view of dies stacked on a wafer in accordance with the present disclosure.

FIG. 9 is a cross-sectional side view of stacked integrated passive devices and dies in accordance with the present disclosure.

FIG. 25 is a single-turn 3D balun having a figure-8 configuration according to an embodiment of the present disclosure.

FIG. 26 is a perspective view of the single-turn 3D balun of FIG. 25.

FIG. 30 is a top view of a single-turn 3D combiner having a figure-8 configuration according to an embodiment of the present disclosure.

FIG. 31 is a perspective view of the single-turn 3D combiner of FIG. 30.

FIG. 35 is a top view of a single-turn 3D combiner having three sets of inputs according to an embodiment of the present disclosure.

FIG. 36 is a perspective view of the single-turn 3D combiner of FIG. 35.

In the drawings, reference numbers may be reused to identify similar and/or identical elements.

DESCRIPTION

Figure 1:
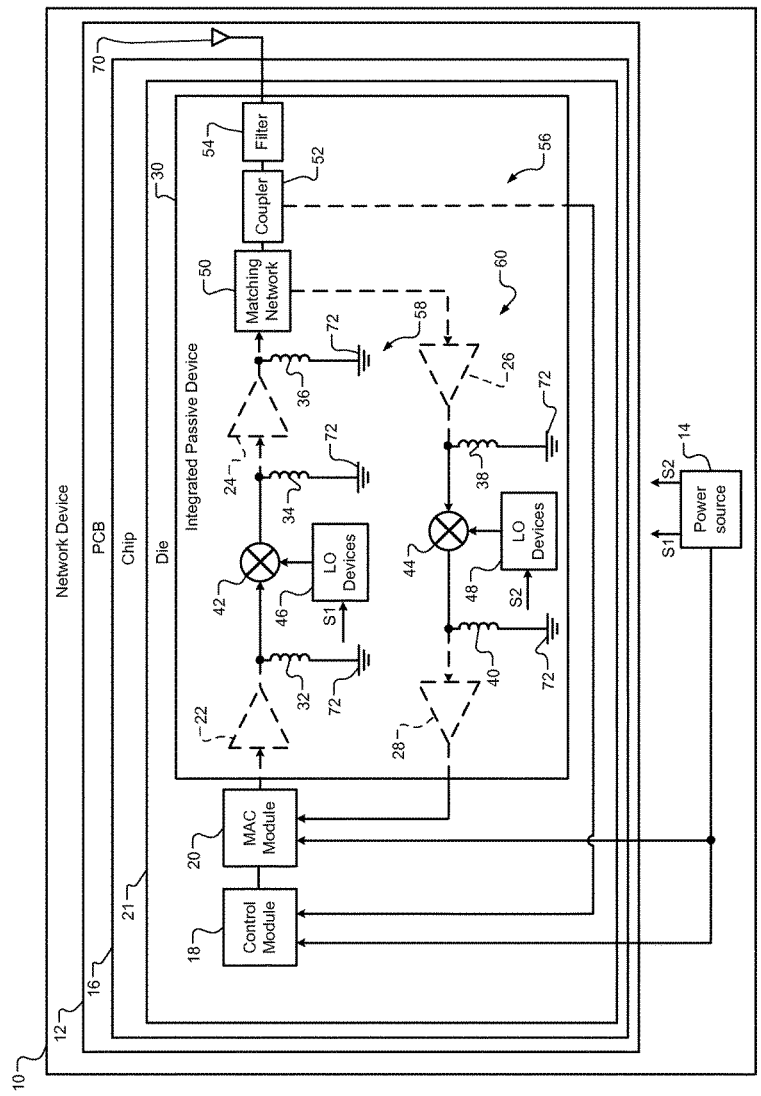
FIG. 1 is a functional block diagram of a network device including an integrated passive device with single-ended transmitter devices and single-ended receiver devices in accordance with the present disclosure.

The active devices and passive devices of a physical layer module of a wireless network device may be incorporated in a single chip. This is a two-dimensional implementation, as all of the active devices and the passive devices are implemented on a single chip. Incorporation of both passive devices and active devices on a single chip results in a highly lossy PHY module due to low resistivity of a substrate of a chip. The substrate (e.g., a P-tap substrate or a N-tap substrate) of a chip is doped to form active devices (e.g., transistors) on the substrate. This doping and/or composition of the substrate results in a substrate having low resistivity (e.g., 10 Ohms ($\Omega$) per $cm^2$). Also, the passive devices, such as inductors take up a large amount of space (area) on the chip.

To decrease the amount of area on the chip utilized by the passive devices, a portion of the passive devices, such as a transformer, inductances, capacitances, and/or an impedance matching circuit (or network) may be implemented on a printed circuit board (PCB) separate from the chip. This is another two-dimensional implementation, as all of the active devices and passive devices are located on the chip or next to the chip on the PCB. The chip may include the remaining passive devices and the active devices. Some of the passive devices on the PCB may be connected to certain ones of the devices on the chip by bond wires. For example, a transformer on the PCB may be connected to switches, amplifiers, and/or a second impedance matching network on the chip. Although this provides space on the chip for additional devices, the corresponding PHY module is highly lossy due to the incorporation of the active devices and the passive devices on either the PCB or the chip. A PCB also has low resistivity.

A quality factor Q of a matching network device (e.g., an inductor) that is implemented on a chip or a PCB can be poor due to metal resistance and lossy properties of (i) silicon substrates in chips, and (ii) PCBs. The higher the lossy properties of a circuit, the lower the quality factor Q of a circuit. A poor quality factor Q results in limited transmit power and receive sensitivity performance.

The below described examples, include incorporation of (i) passive devices of a PHY module in one or more integrated passive devices (IPDs), and (ii) active devices of a PHY module in one or more dies. The IPDs and dies are disposed in various stacked arrangements. These arrangements are referred to as three-dimensional implementations, as the active devices and passive devices are implemented within one or more stacks. Each of the stacks includes one or more IPDs, one or more dies, active devices, and passive devices.

The disclosed IPDs include substrates with high resistivities (e.g., 1 Kilo-Ohm (k$\Omega$) per $cm^2$), as compared to substrates of a die, chip and/or PCB. A chip may include, for example, a die and a lead frame and thus as referred to herein is not equivalent to a die. By having the passive devices in the IPDs, the passive devices experience less loss and additional space is available for other devices in the corresponding dies and/or chips. This improves corresponding quality factors and as a result transmission and reception performance.

FIG. 1 shows a network device 10. The network device 10, as well as other network devices disclosed herein, may refer to a computer, a tablet, a mobile device, a cellular phone, a router, an appliance, a tool, a global positioning system (GPS) device, and/or other network device. The network devices may wireless communicate with each other or other wireless network devices using Institute of Electrical and Electronic Engineers (IEEE), Wi-Fi™, Bluetooth®, and/or other wireless protocols. Wireless signals transmitted by the network devices may be radio frequency (RF) and/or frequency modulated (FM) signals. The wireless signals may be transmitted in, for example, the Industrial, Scientific and Medical (ISM) 2.4 GHz short-range radio frequency band or other suitable band.

The network device 10 may include a PCB 12 and a power source 14. The power source 14 may be attached to the PCB 12 and provide power to modules and corresponding devices of the network device 10. A chip 16 may be mounted on the PCB 12. The chip 16 may include a control module 18, a medium access control (MAC) module 20, and a die 21. The die 21 and other dies disclosed herein may each be a semiconductor die (e.g., a die that includes semiconductor devices, such as transistor) and/or a silicon-on-insulator die (e.g., a die that has one or more layers of silicon and one or more insulative layers). As an example, a semiconductor die may include complementary metal-oxide semiconductor (CMOS) transistors. As another example, a silicon-on-insulator die may include metal-oxide-semiconductor field-effect transistors.

The die 21 may include active devices, such as amplifiers 22, 24, 26, 28 and/or other active devices (e.g., transistors). An IPD 30 may be stacked on the die 21 and include passive devices, such as inductances 32, 34, 36, 38, 40, mixers 42, 44, local oscillator devices 46, 48, an impedance matching network 50 (hereinafter referred to as "the matching network 50"), a coupler 52, a filter 54, and/or other passive devices (e.g., capacitances and resistances). Each of the passive devices may be implemented in one or more layers of the IPD 30. An IPD may be referred to as a passive layer, which may include one or more layers as further described below.

The IPD 30 may be stacked on the die 21, as shown in FIG. 3. Although the IPD 30 is shown as being stacked on the die 21 and the die is shown as being connected to the PCB 12, the die 21 may be stacked on the IPD 30 and the IPD 30 may be connected to the PCB 12. Various IPD and die stacked arrangements may be included, some of which are disclosed in FIGS. 3-9. The power source 14 may provide power to the control module 18, the MAC module 20 and the local oscillator devices 46, 48.

The active devices and the passive devices may be part of a physical layer (PHY) module (designated 56). The PHY module 56 includes a transmitter circuit (or path) 58 and a receiver circuit (or path) 60. The transmitter circuit 56 includes single-ended transmitter devices including the amplifiers 22, 24, the inductances 32, 34, 36, the mixer 42, and the local oscillator devices 46. The transmitter devices may include the matching network 50, the coupler 52 and/or the filter 54. The receiver circuit 60 includes single-ended receiver devices including the amplifiers 26, 28, inductances 38, 40, mixer 44, and local oscillator devices 48. The receiver circuit 60 may include the matching network 50, the coupler 52 and/or the filter 54. One or more of the passive devices of the IPD 30 and the other passive devices of other IPDs disclosed herein may be implemented in the IPD or may be implemented external to the IPDs as lumped components. The lumped components may include, for example, one or more inductances, capacitances, resistances, mixers, local oscillator devices, couplers, filters, matching network devices, etc. Lumped components refer to small circuit elements having predetermined sizes or scales. For example, lumped components may have industry standard sizes between 2512 (25 hundredths of an inch long and 12 hundredths of an inch wide) to as small as 0201 (2 hundredths of an inch long to 1 hundredth of an inch wide). The sizes may also be in metric units. The lumped components may be mounted on a PCB and connected to the IPDs and/or corresponding dies.

The amplifiers 22, 24, 26, 28 are shown with dashed lines to indicate that the amplifiers 22, 24, 26, 28 are located in the die 21 and not in the IPD 30. The inductances 32, 34, 36, 38, 40, mixers 42, 44, local oscillator devices 46, 48, matching network 50, coupler 52 and filter 54 are shown with solid lines to indicate that these items may be located in the IPD 30 and not in the die 21.

The matching network 50, the coupler 52 and/or the filter 54 may not be included in the IPD 30 and/or the network device 10. For example, the amplifier 24, the inductance 36, and the amplifier 26 may be directly connected to the matching network 50, the coupler 52, the filter 54, or an antenna 70. The antenna 70 may be implemented on the PCB 12 as shown or in the chip 16. Wireless signals are transmitted from and received by the antenna 70. The matching network 50 may be included to provide impedance matching between (i) the amplifiers 24, 26 and inductance 36 and (ii) the coupler 52, filter 54, and/or antenna 70. Although the matching network 50, the coupler 52 and the filter 54 are shown in a particular order, these devices may be in a different order. For example, the coupler 52 may be connected between the amplifier 24 and the matching network 50.

The coupler 52 may be a directional coupler that is used to tap energy out of the amplifier 24 and/or matching network 50 during transmission of a wireless signal. The control module 18 may determine power out of the amplifier 24 and/or matching network 50 based on power received from the coupler 52. As an alternative, the MAC module 20 may be connected to the coupler 52 and determine power out of the amplifier 24 and/or the matching network 50 during transmission of a wireless signal.

The oscillator devices 46, 48 may include voltage controlled oscillators. The voltage controlled oscillators may include inductance/capacitance (LC) tank networks. For example, each of the voltage controlled oscillators may include an inductance connected in parallel with a capacitance.

The amplifier 22 is connected to an output of the MAC module 20. The inductance 32 may be connected between an output of the amplifier 22 and a reference terminal 72, which may be at a ground potential or other reference potential. The mixer 42 is connected between (i) the amplifier 22 and the inductance 32 and (ii) the amplifier 24 and the inductance 34. The amplifier 24 is connected between the (i) mixer 42 and the inductance 34 and (ii) the inductance 36 and the matching network 50. The inductances 34 and 36 may be connected to the reference terminal 72.

The amplifier 26 is connected to an output of the matching network 50. The inductance 38 is connected between (i) an output of the amplifier 26 and (ii) the reference terminal 72. The mixer 44 is connected between (i) the amplifier 26 and the inductance 38 and (ii) the amplifier 28 and the inductance 40. The inductances 38, 40 may be connected to the reference terminal 72. The amplifier 28 is connected between (i) the mixer 44, the inductance 40 and (ii) the MAC module 20.

During transmission, the control module 18 may output data to the MAC module 20. The MAC module 20 may generate an initial signal having frames (or packets), which include the data. The amplifier 22 amplifies the initial signal to generate an amplified signal. The mixer 42, based on a local oscillator signal having a local oscillator frequency and received from the local oscillator devices 46, upconverts the amplified signal to a RF signal. The amplifier 24 may be a power amplifier and amplify an upconverted signal out of the mixer 42. An amplified signal out of the amplifier 24 is filtered by the filter 54 and transmitted by the antenna 70.

During reception, the antenna 70 receives a wireless signal, which is filtered by the filter 54. The amplifier 26 amplifies a filtered signal out of the filter 54, coupler 52 or matching network 50. An amplified signal out of the amplifier 26 is downconverted to a baseband signal by the mixer 44. The mixer 44 performs the downconversion based on a local oscillator signal from the local oscillator devices 48. The amplifier 28 amplifies a downconverted signal out of the mixer 44. An amplified signal out of the amplifier 28 is provided to the MAC module 20.

Figure 2:
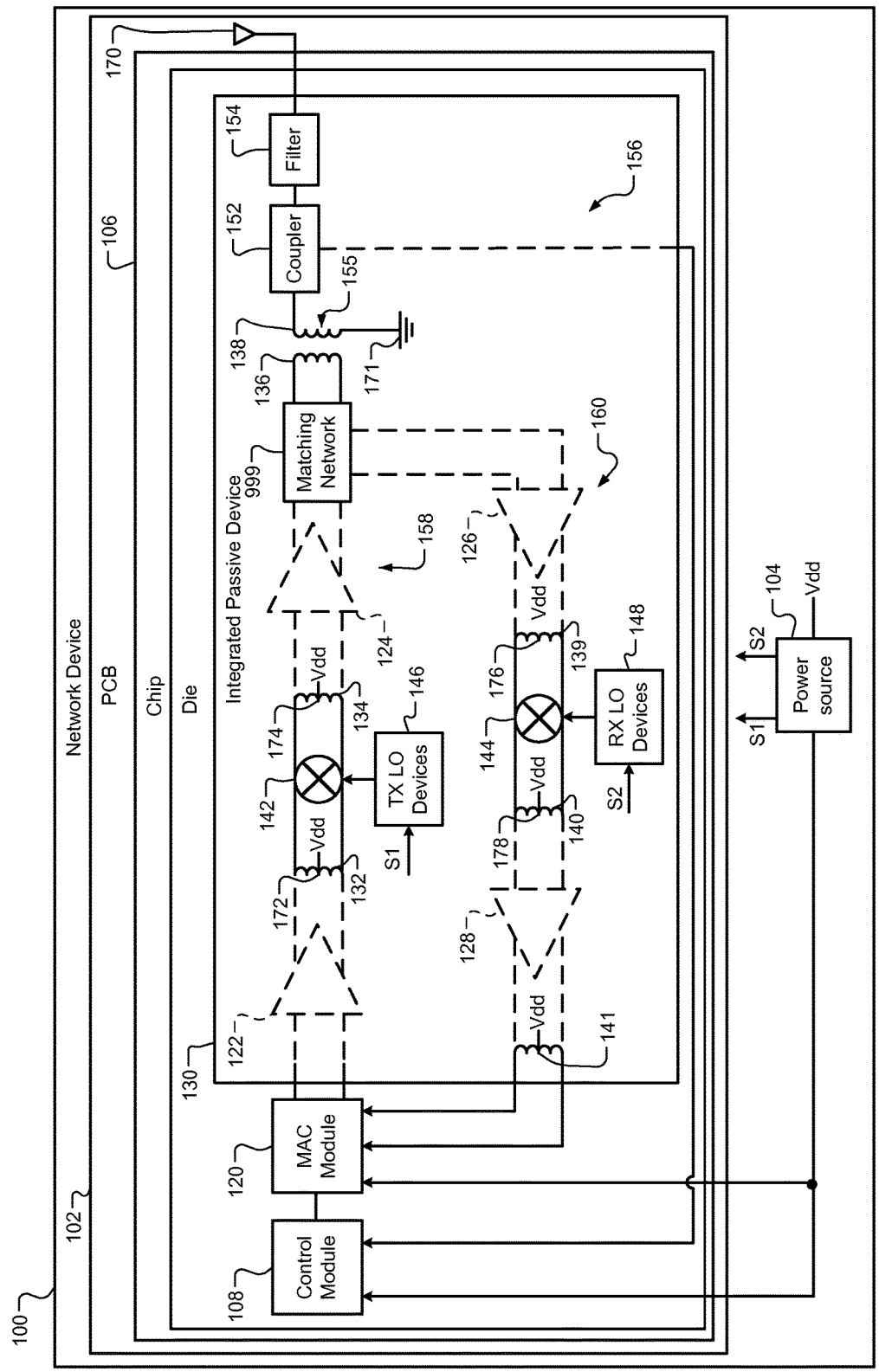
FIG. 2 is a functional block diagram of a network device including an integrated passive device with differential transmitter devices and differential receiver devices in accordance with the present disclosure.

FIG. 2 shows another network device 100 may include a PCB 102 and a power source 104. The power source 104 may be attached to the PCB 102 and provide power to modules and corresponding devices of the network device 100. A chip 106 may be mounted on the PCB 102. The chip 106 may include a control module 108, a MAC module 120, and a die 121. The die may include active devices, such as amplifiers 122, 124, 126, 128 and/or other active devices (e.g., transistors). An IPD 130 may be stacked on the chip 106 and include passive devices, such as inductances 132, 134, 136, 138, 139, 140, 141, mixers 142, 144, local oscillator devices 146, 148, an impedance matching network 150 (hereinafter referred to as "the matching network 150"), a coupler 152, a filter 154 and/or other passive devices (e.g., capacitances and resistances). Each of the passive devices may be implemented in one or more layers of the IPD 130. The IPD 30 may be stacked on the die 121, as shown in FIG. 3. Although the IPD 130 is shown as being stacked on the die 121, the die 121 may be stacked on the IPD 130 and the IPD 130 may be connected to the PCB 102. Various IPD and chip stacked arrangements may be included, some of which are disclosed in FIGS. 3-9. The power source 104 may provide power to the control module 108, the MAC module 120 and the local oscillator devices 146, 148.

The active devices and the passive devices may be part of a PHY module (designated 156). The PHY module 156 includes a transmitter circuit (or path) 158 and a receiver circuit (or path) 160. The transmitter circuit 156 includes differential transmitter devices including the amplifiers 122, 124, the inductances 132, 134, 136, 138, the mixer 142, the local oscillator devices 146. The transmitter devices may include the matching network 150, the coupler 152 and/or the filter 154. The receiver circuit 160 includes differential receiver devices including the amplifiers 126, 128, inductances 136, 138, 139, 140, 141, mixer 144, and local oscillator devices 148. The receiver circuit 160 may include the matching network 150, the coupler 152 and/or the filter 154. The inductances 136, 138 may be primary and secondary inductances of a transformer (designated 155). The transformer 155 may be implemented as and/or include a balun, which converts a differential signal to a single-ended signal for transmission by an antenna. The balun may be included in the matching network 150. If an impedance ratio between the receive circuit 160 and the antenna is high, the matching network 150 and/or balun is included for impedance transformation.

The amplifiers 122, 124, 126, 128 are shown with dashed lines to indicate that the amplifiers 122, 124, 126, 128 are located in the die 121 and not in the IPD 130. The inductances 132, 134, 136, 138, 139, 140, 141, mixers 142, 144, local oscillator devices 146, 148, matching network 150, coupler 152 and filter 154 are shown with solid lines to indicate that these items may be located in the IPD 130 and not in the die 121.

The matching network 150, the coupler 152 and/or the filter 154 may not be included in the IPD 130 and/or the network device 100. For example, the amplifier 124 and the amplifier 126 may be directly connected to the matching network 50 or the inductance 136 (or corresponding transformer). The inductance 138 (or corresponding transformer) may be directly connected to the coupler 152, the filter 154, or an antenna 170. The inductance 138 is connected to a reference terminal 171 that is at a reference potential. The antenna 170 may be implemented on the PCB 102 as shown or in the chip 106. Wireless signals are transmitted from and received by the antenna 170. The matching network 150 may be included to provide impedance matching between (i) the amplifiers 124, 126 and (ii) the inductance 136 or transformer 155. Although an impedance matching network is shown between the amplifiers 124, 126 and the transformer 155, an impedance matching network may alternatively or in addition be located between the transformer 155 and the coupler 152, filter 154, and/or antenna 170. The matching network 150 may not be included and the amplifiers 124, 126 may be directly connected to the inductance 136. Although the transformer 155, the coupler 152 and the filter 154 are shown in a particular order, these devices may be in a different order.

The coupler 152 may be a directional coupler that is used to tap energy out of the transformer 155 during transmission of a wireless signal. The control module 108 may determine power out of the transformer 155 based on power received from the coupler 152. As an alternative, the MAC module 120 may be connected to the coupler 152 and determine power out of the transformer 155 during transmission of a wireless signal.

The oscillator devices 146, 148 may include voltage controlled oscillators. The voltage controlled oscillators may include inductance/capacitance (LC) tank networks. For example, each of the voltage controlled oscillators may include an inductance connected in parallel with a capacitance.

The amplifier 122 is connected to an output of the MAC module 120. The inductance 132 may be connected to outputs of the amplifier 122. The mixer 42 is connected between the inductance 132 and the inductance 134. The inductances 132, 134 may have center taps 172, 174 connected to a power supply terminal that is at a potential Vdd. The amplifier 124 is connected between the inductance 134 and the matching network 150.

The amplifier 126 is connected to an output of the matching network 150. The inductance 139 is connected between (i) outputs of the amplifier 126 and (ii) the mixer 144. The mixer 144 is connected between (i) the amplifier 126 and the inductance 139 and (ii) the inductance 140. The inductances 38, 40 may have center taps 176, 178 connected to the power supply terminal that is at the potential Vdd. The amplifier 128 is connected between the inductance 140 and the inductance 141. The inductance 141 is connected between the amplifier 128 and inputs of the MAC module 120.

During transmission, the control module 108 may output data to the MAC module 120. The MAC module 120 may generate an initial signal having frames (or packets), which include the data. The amplifier 122 amplifies the initial signal to generate an amplified signal. The mixer 142, based on a local oscillator signal having a local oscillator frequency and received from the local oscillator devices 146, upconverts the amplified signal to a RF signal. The amplifier 124 may be a power amplifier and amplify an upconverted signal out of the mixer 142. An amplified signal out of the amplifier 124 is transformed by the transformer 155 (e.g., transformed from having a first voltage to having a second voltage), filtered by the filter 154, and transmitted by the antenna 170.

During reception, the antenna 170 receives a wireless signal, which is filtered by the filter 154. The amplifier 126 amplifies a filtered signal out of the filter 154, coupler 152, transformer 155, or matching network 150. An amplified signal out of the amplifier 126 is downconverted to a baseband signal by the mixer 144. The mixer 144 performs the downconversion based on a local oscillator signal from the local oscillator devices 148. The amplifier 128 amplifies a downconverted signal out of the mixer 144. An amplified signal out of the amplifier 128 is provided to the MAC module 120.

FIG. 3 shows a bond wire package 200 including an IPD 202 stacked on a die 204. The die 204 is disposed on a leadframe 206. The leadframe 206 may be a pin grid array (PGA) package, a quad flat non-leaded (QFN) package or other package. The leadframe 206 has first pads 208 and may be mounted on a PCB 210. An intermediate layer 212 may be disposed between the IPD 202 and the die 204 and connect the IPD 202 to the die 204. The IPD 202, the die 204, and the intermediate layer 212 may replace the IPD and die shown in FIG. 1 and/or FIG. 2. The PCB 210 may replace the PCB shown in FIG. 1 and/or FIG. 2.

The die 204 may include a first substrate 214. The IPD 202 may include a second substrate 216. The first substrate 214 may be a P-tap or N-tap substrate, which is doped for formation of active devices (e.g., transistors and amplifiers) thereon. As an example, the transistors of the first substrate 214 may be CMOS transistors. The second substrate 216 may not be doped and is configured for passive devices. The second substrate 216 may have one or more metallization layers formed thereon. Example metallization layers 218, 220 are shown. The second substrate 216 may have any number of metallization layers and/or insulation layers disposed (i) on the second substrate 216, and/or (ii) under the second substrate 216 between the second substrate and the intermediate layer 212. The metallization layers may include passive devices (e.g., the passive devices shown in FIGS. 1-2), portions of passive devices, and/or interconnect devices (e.g., couplers, jumpers, traces, etc.). The second substrate 216 has higher resistivity than the first substrate 214 and the PCB 210. As an example, the second substrate 216 may have a resistivity of 1 k$\Omega$/cm$^2$. The first substrate 214 may have a resistivity of 10 $\Omega$/cm$^2$. The first substrate 214 may be formed of silicon. The second substrate 216 may be formed of silicon and/or glass. The second substrate 216 may have more glass per cm$^2$ than the first substrate 214 and/or the PCB 210.

The IPD 202 includes the second substrate 216 and the metallization layers 218, 220. As shown, the second substrate 216 is disposed between the metallization layers 218, 220. The second substrate 216 may include vias 230. The vias 230 may be through glass vias (TGVs) or through silicon vias (TSVs). The vias 230 may connect the first metallization layer and/or passive devices on the first metallization layer 218 to the second metallization layer and/or passive devices on the second metallization layer 220. Each of the passive devices may be implemented on one or more layers of the IPD 202. As an example, an inductance 231 is shown as being implemented in the IPD 202. The inductance 231 may include traces (or conductive elements) in the metallization layers 216, 218 and some of the vias 230. Any of the inductances of FIGS. 1-2 may be implemented in layers of an IPD 202, similar to the inductance 231. Due to the configuration of the inductance 231 having conductive elements on multiple layers as shown, a magnetic field generated by the inductance 231 may be directed in a direction laterally across the IPD 202 (this is shown by arrow 233), as opposed to in a direction towards the die 204. This prevents the magnetic field generated by the inductance 231 from affecting the active devices and/or corresponding signals in the die 204, which reduces interference experienced by the active devices. If an inductance were to be implemented as a planar structure in the IPD 202, then the inductance may generate a magnetic field that is directed perpendicular to and towards the die 204, which would result in interference.

The intermediate layer 212 includes pillars 232. The pillars 232 connect the vias 230 and/or passive devices in the metallization layers 218, 220 to devices in the die 204. The metallization layer 218 may include conductive elements that connect some of the vias 230 to the pillars 232. The pillars may be formed of one or more conductive materials (e.g., copper Cu). The intermediate layer 212 may include pads 236. The pads 236 may be disposed between the pillars 232 and the die 204, as shown, or may be disposed between the pillars 232 and the IPD 202. The pads 236 may be formed of one or more conductive materials (e.g., aluminum Al). The intermediate layer 212 may include insulative material (designated 237), which surrounds the pillars 232. As an alternative, the pillars 232 may stand alone without insulative material surrounding the pillars 232. In this example alternative, an intermediate layer is not disposed between the IPD 202 and the die 204, but rather simply pillars and/or any corresponding coupling elements (e.g., pads) are disposed between the IPD 202 and the die 204.

A cross-sectional area of the IPD 202 may be different than the cross-sectional area of the die 204. As an example, the cross-sectional area of the IPD 202 may be larger than the cross-sectional area of the die 204, such that the IPD 202 overhangs the die 204 in one or more directions.

Additional pads 240 may be disposed on the IPD 202. The pads 240 may be connected to the first pads 208 by bond wires 242. The pads 240 may be connected to the metallization layer 218 and/or passive devices in the metallization layer 218.

FIG. 4 shows a flip chip package 250 including a die 252 stacked on an IPD 254. An intermediate layer 256 may be disposed between the die 252 and the IPD 254. The IPD 254 may be mounted on a PCB 258 and connected to the PCB 258 by solder balls 260. The die 252 may include active devices. The IPD 254 may include a substrate 262 and one or more metallization layers 264, 266. The metallization layers 264, 266 may include passive devices, portions of passive devices, and/or interconnect devices. An inductance 269 is shown as an example.

The intermediate layer 256 may include pillars 268 and insulative material 270. As an alternative, the pillars 268 may stand alone without insulative material surrounding the pillars 268. The intermediate layer 256 may also include pads 272, which may be disposed between the pillars 268 and the die 252 or between the pillars 268 and the metallization layer 264. The IPD 254 may include vias 273 (e.g., TGVs and/or TSVs). The vias 273 may be connected to the pillars 268. The metallization layers 264, 266 may include interconnect devices (interconnect devices 274 are shown).

The die 252 may include a first substrate 280. The IPD 254 may include the substrate 262. The first substrate 280 may be a P-tap or N-tap substrate, which is doped for formation of active devices (e.g., transistors and amplifiers) thereon. As an example, the transistors of the first substrate 280 may be CMOS transistors. The second substrate 262 may not be doped and is configured for passive devices. The second substrate 262 may have one or more metallization layers formed thereon, as shown. The second substrate 262 may have any number of metallization layers and/or insulation layers disposed (i) on the second substrate 262, and/or (ii) under the second substrate 262 between the second substrate and the intermediate layer 256. The metallization layers may include passive devices (e.g., the passive devices shown in FIGS. 1-2) and/or interconnect devices (e.g., couplers, jumpers, traces, etc.). Each of the passive devices may be implemented on one or more layers of the IPD 254. The second substrate 262 has higher resistivity than the first substrate 280 and the PCB 258. As an example, the second substrate 262 may have a resistivity of 1 k$\Omega$/cm$^2$. The first substrate 280 may have a resistivity of 10 $\Omega$/cm$^2$. The first substrate 280 may be formed of silicon. The second substrate 262 may be formed of silicon and/or glass. The second substrate 262 may have more glass per cm$^2$ than the first substrate 280 and/or the PCB 258.

Additional stacked IPD and die arrangements are shown in FIGS. 5-9. The dies may include active devices and the IPDs may include passive devices. The active device and the passive devices may include respectively the active devices and the passive devices of FIGS. 1-2. FIG. 5 shows multiple IPDs 300, 302 stacked on a die 304. An intermediate layer 305 is disposed between the IPD 300 and the die 304. The die is mounted on a leadframe 306, which is mounted on a PCB 308. The IPDs 300, 302 include respective substrates 310, 312, metallization layers 314, 316, 318, 320, and vias 322, 324. The intermediate layer 305 may include pillars 326 and insulative material 328. As an alternative, the pillars 326 may stand alone without insulative material surrounding the pillars 326. The intermediate layer 305 may include pads 330. Pads 332 may be disposed on the IPD 302 and may be connected to pads 334 on the leadframe 306. The pads 332 are connected to the pads 334 by bond wires 336. As an example, an inductance 340 is shown as being implemented in the IPD 300.

FIG. 6 shows a die 350 and multiple stacked IPDs 352, 354. The IPD 354 is mounted on a PCB 356 and connected to the PCB by solder balls 358. The die 350 is stacked on an intermediate layer 360, which is stacked on the IPDs 352, 354. The intermediate layer 360 includes pads 362 and pillars 364. The IPDs 352, 354 include substrates 366, 368, metallization layers 370, 372, 374, and vias 378. The metallization layers may include interconnect devices 380.

Figure 7:
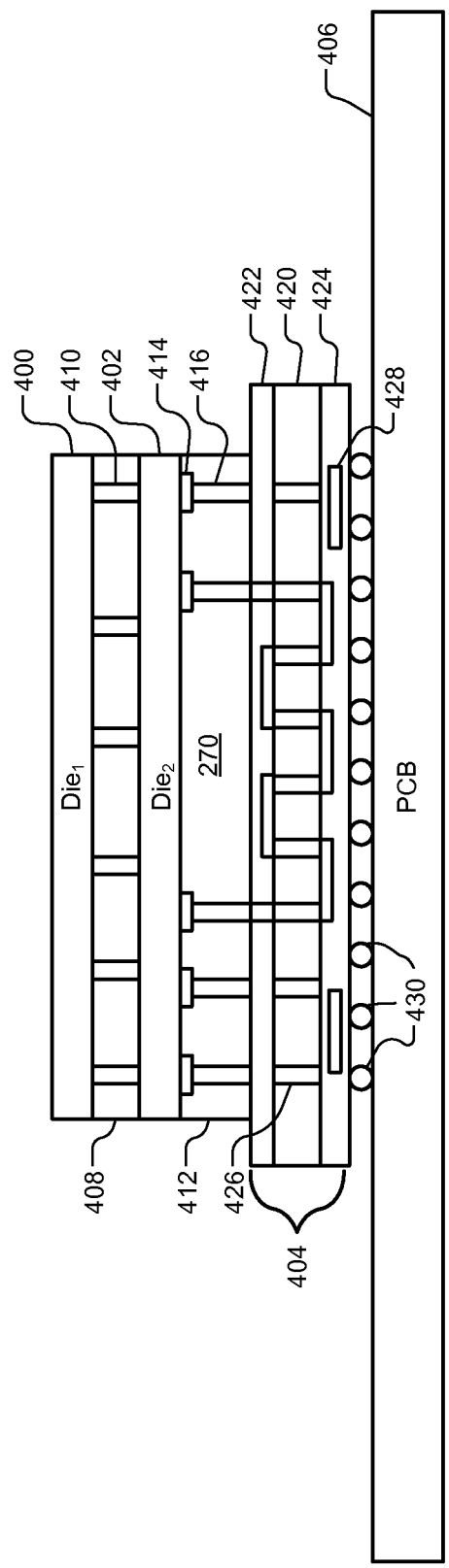
FIG. 7 is a cross-sectional side view of multiple dies stacked on an integrated passive device in accordance with the present disclosure.

FIG. 7 shows multiple dies 400, 402 stacked on an IPD 404. Die 400 is stacked on die 402, which is stacked on IPD 404. The IPD 404 is mounted on a PCB 406. A first intermediate layer 408 is disposed between the dies 400, 402. The first intermediate layer 408 includes pillars 410. A second intermediate layer 412 is disposed between the die 402 and the IPD 404. The second intermediate layer 412 includes pads 414 and pillars 416. The IPD 404 includes a substrate 420 and metallization layers 422, 424. The substrate 420 may include vias 426. The metallization layers 422, 424 may include interconnect devices 428. As an example, an inductance 430 is shown as being implemented in the IPD 404. The IPD 404 is connected to the PCB 406 by solder balls 430.

FIG. 8 shows dies 450, 452 stacked on a wafer 454 (e.g., a wafer having an 8 inch diameter). The wafer may include silicon and/or glass. The wafer may be cut to include, for example, the dies 450 in a single package. The portion of the wafer 454 that is included in the single package may be implemented as an IPD and/or include an IPD. The portion of the wafer that is implemented as an IPD may be referred to as a wafer level chip scale package (WLCSP). The WLCSP may include a substrate and metallization layers of the IPD. A WLCSP may be associated with one or more dies. As an example, four dies 450 are shown as being part of a WLCSP, which includes a portion 456 of the wafer 454. The portion 456 is cut out from the wafer 454.

FIG. 9 shows stacked IPDs and dies. The IPDs and dies disclosed herein may be stacked in various arrangements. One or more IPDs and/or one or more dies may be stacked on an IPD. Similarly, one or more IPDs and/or one or more dies may be stacked on a die. One or more stacks of IPDs and/or dies may be disposed on an IPD. Similarly, one or more stacks of IPDs and/or dies may be disposed on a die. Each of the stated stacks may include one or more IPDs and/or one or more dies.

In the example of FIG. 9, two stacks 460, 462 of layers are shown on a base layer 464. The base layer 464 may be an IPD or a die. The first stack 460 includes intermediate layers 466, 468 and substrate layers 470, 472. The second stack 462 includes an intermediate layer 474 and a substrate layer 476. Each of the intermediate layers 466, 468, 474 may include pillars (collectively designated 478). Each of the substrate layers 470, 472, 476 may be an IPD or a die. Although not shown in FIG. 9, each of the substrate layers 470, 472, 476 may include vias.

Figure 10:
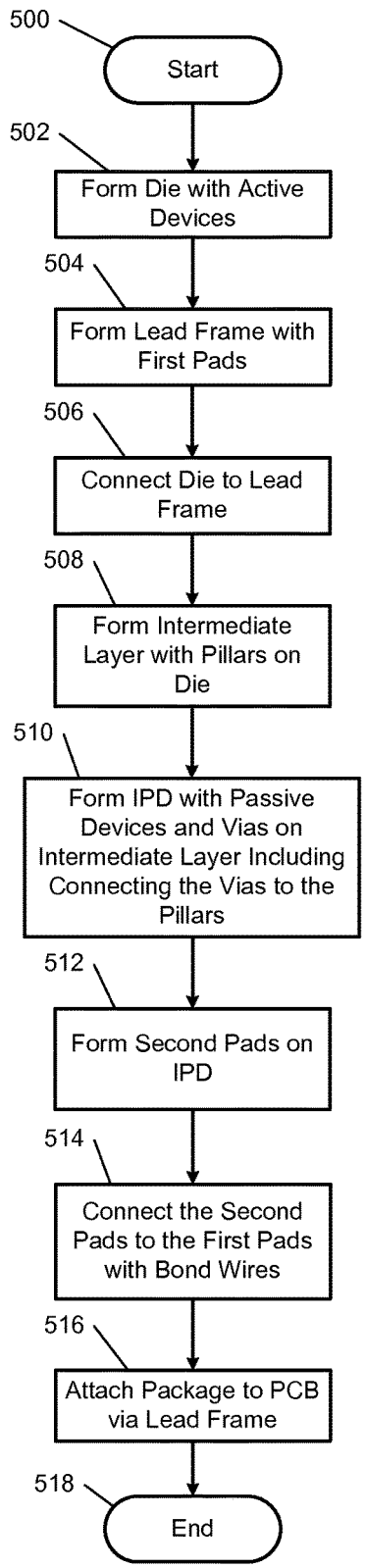
FIG. 10 illustrates a method of manufacturing a bond wire package in accordance with the present disclosure.
Figure 11:
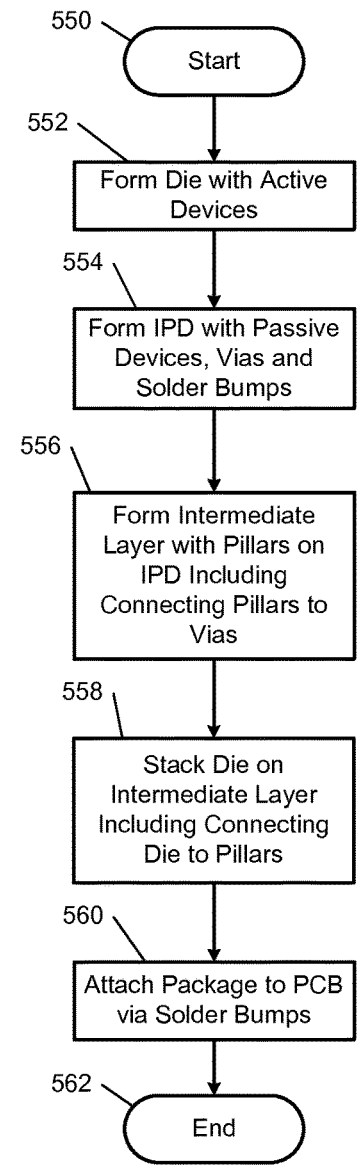
FIG. 11 illustrates a method of manufacturing a flip chip package in accordance with the present disclosure.

The circuits disclosed herein may be manufactured and/or assembled using numerous methods, example methods are illustrated in FIGS. 10-11. FIG. 10 shows a method of manufacturing a bond wire package. Although the following tasks are primarily described with respect to the implementations of FIG. 3, the tasks may be easily modified to apply to other implementations of the present disclosure. The tasks may be iteratively performed.

The method may begin at 500. At 502, the die 204 may be formed having corresponding active devices. At 504, the leadframe 206 may be formed with the pads 208. At 506, the die 204 is connected to the leadframe 206. At 508, the intermediate layer 212 is formed on the die 204. This may include connecting the pillars 232 to the active components or other components of the die 204.

At 510, the IPD 202 is formed or disposed on the intermediate layer 212. This may include connecting the vias 216 of the IPD 202 to the pillars 232. The IPD 202 includes passive devices that may be connected to the vias 216. At 512, the pads 240 are formed on the IPD. At 514, the pads 240 are connected by the bond wires 242 to the pads 208. At 516, the package (e.g., chip scale package) formed by tasks 502-514 may be attached to the PCB 210 by the leadframe 206.

FIG. 11 shows a method of manufacturing a flip chip package. Although the following tasks are primarily described with respect to the implementations of FIG. 4, the tasks may be easily modified to apply to other implementations of the present disclosure. The tasks may be iteratively performed.

The method of FIG. 11 may begin at 550. At 552, the die 252 is formed and includes active devices. At 554, the IPD 254 is formed. The IPD 254 includes passive devices, the vias 273 and the solder balls 260 (may be referred to as solder bumps). At 556, the intermediate layer 256 is formed on the IPD 254. This may include connecting the pillars 268 to the vias 273.

At 558, the die 252 may be stacked on and connected to the intermediate layer 256. This may include connecting the die 252 to the pillars 268. At 560, the package (e.g., chip scale package) formed by performing tasks 552-558 may be attached to the PCB 258 by the solder balls 260.

The above-described tasks of FIGS. 10-11 are meant to be illustrative examples; the tasks may be performed sequentially, synchronously, simultaneously, continuously, during overlapping time periods or in a different order depending upon the application. Also, any of the tasks may not be performed or skipped depending on the implementation and/or sequence of events.

In the following FIGS. 12-60 various inductances, baluns, combiners and directional couplers are disclosed. The inductances, baluns, combiners, and directional couplers may be implemented in any of the preceding IPDs and/or may replace any of the preceding passive devices such as the passive devices disclosed in FIGS. 1-11. The inductances, baluns, combiners, and directional couplers include various conductors and vias, which may be implemented in corresponding layers of the IPDs. The conductors may be implemented in, for example, metallization layers or other passive device layers. Insulative material and/or layers may be disposed between conductors of a same layer and/or between conductors of different layers. Substrates of the IPDs may be disposed on any number of stacked layers of passive devices. Any number of layers of passive devices may be stacked on each of the substrates of the IPDs. Each of the passive device layers implemented in a 3D arrangement may be thicker than metallization layers of (i) a planar structure having passive devices, and/or (ii) a silicon wafer having active devices (e.g., transistors).

Also, In FIGS. 12-60, the vias may be TSVs or TGVs and may be in corresponding substrates of the IPDs. The vias may be filled with conductive material, for example, copper or other suitable conductive material. The conductors may be referred to as traces. The conductors and the vias may be referred to as elements of the corresponding passive device. The conductors, vias, and/or other elements that are connected in series may collectively provide one or more inductances.

In addition, the baluns and combiners disclosed herein have sets of inputs and outputs. Each of the sets of inputs may be referred to as a differential input and each of the sets of outputs may be referred to as a differential output. Various crossovers are also disclosed herein having crossover conductors that cross each other. The crossover conductors are not in contact with each other. An insulative layer may be disposed between the crossover conductors of each of the crossovers.

Figure 12:
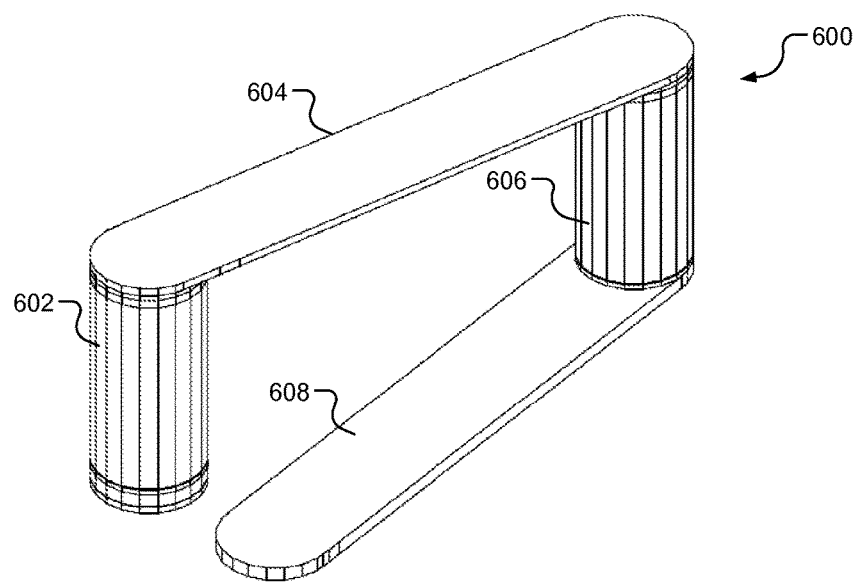
FIG. 12 is a perspective view of a single-turn 3D inductance according to an embodiment of the present disclosure.

FIG. 12 shows a single-turn 3D inductance 600. The inductance 600 includes a first via 602, a first conductor 604, a second via 606 and a second conductor 608. The first conductor 604 may be implemented in a first layer of an IPD. The vias 602, 606 may be implemented in a substrate of the IPD. The second conductor 608 may be implemented in a second layer of the IPD. The substrate may be disposed between the first layer and the second layer. The second conductor 608 may be at a predetermined angle relative to the first conductor when viewed from the top of the IPD.

Figure 13:
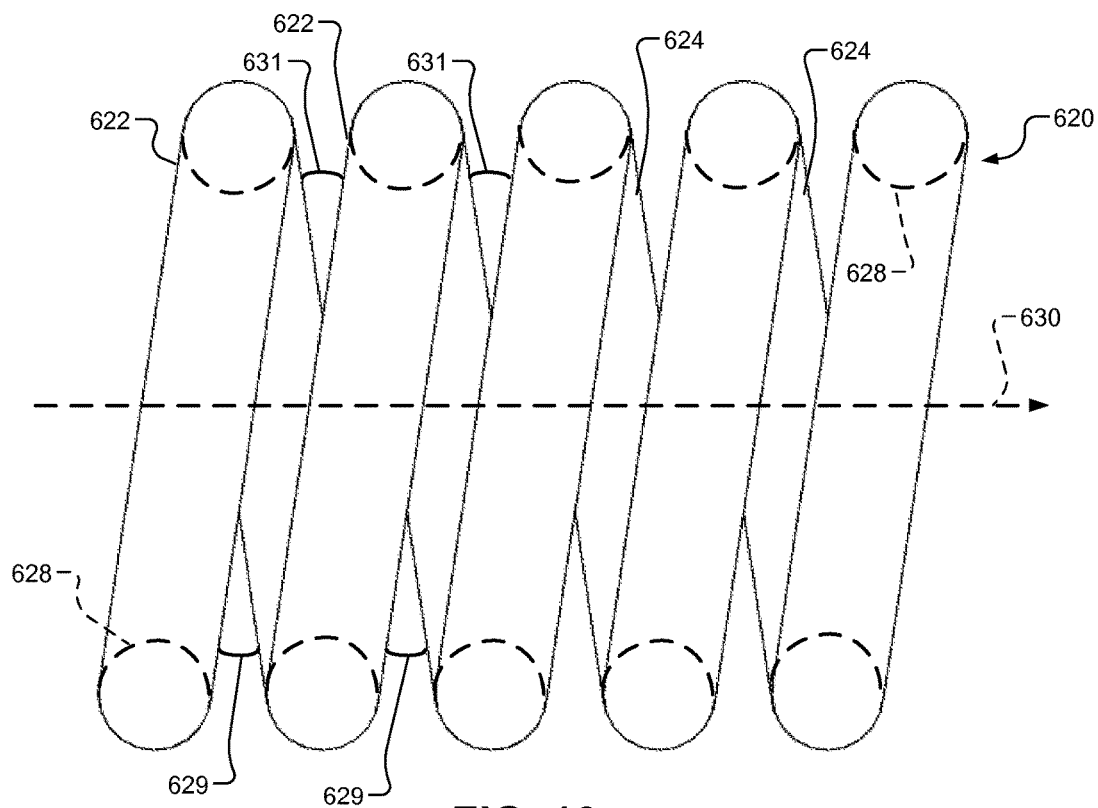
FIG. 13 is a top view of a multi-turn 3D inductance having symmetric angles according to an embodiment of the present disclosure.
Figure 14:
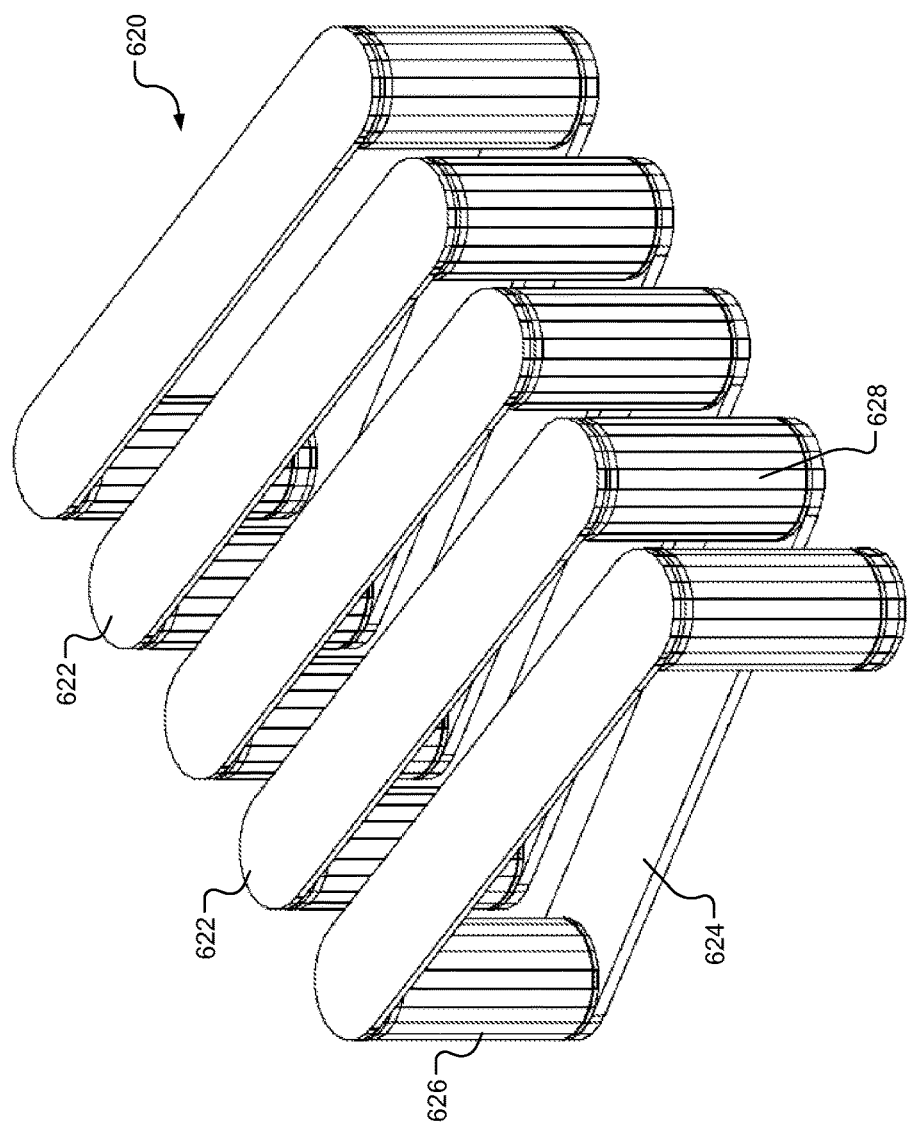
FIG. 14 is a perspective view of the multi-turn 3D inductance of FIG. 13.

FIGS. 13-14 show a multi-turn 3D inductance 620. The inductance 620 has a first set (or series) of conductors 622, a second set (or series) of conductors 624, a first set (or series) of vias 626 and a second set (or series) of vias 628. The first set of conductors 622 may extend parallel to each other. The second set of conductors 624 may extend parallel to each other. The conductors 622, 624 are in a "zig-zag" configuration. The first set of vias 626 may extend parallel to each other and parallel to the second set of vias 628. The first set of conductors 622 may be implemented in a first layer of an IPD. The vias 626, 628 may be implemented in a substrate of the IPD. The second set of conductors 624 may be implemented in a second layer of the IPD. The substrate may be disposed between the first layer and the second layer.

A pitch (or distance) between adjacent ones of the first set of conductors 622 may be the same as a pitch between adjacent ones of the second set of conductors 624. A pitch between adjacent ones of the first set of vias 626 may be the same as a pitch between the adjacent ones of the second set of vias 628. The pitch between adjacent ones of the first set of conductors 622 may be the same as the pitch between adjacent ones of the first set of vias 626.

The inductance 620 has a symmetric arrangement of conductors. Angles 629 between consecutive pairs of the conductors 622, 624 are symmetric with angles 631 between other consecutive pairs of the conductors 622, 624 when viewed from the top of the inductance 620 and relative to an x-axis (or centerline) 630, as shown in FIG. 13. Every other consecutive pair of the conductors 622, 624 has one of the angles 629 and the other remaining consecutive pairs of the conductors 622, 624 have the angles 631. The angles 629 are symmetric to the angles 631 when the angles 631 are shifted along the x-axis to be opposite the angles 629. The inductance 620 generates a magnetic field having a center that extends along and parallel to the x-axis and through the inductance 620 (i) between the first set of conductors 622 and the second set of conductors 624, and (ii) between the first set of vias 626 and the second set of vias 628. The magnetic field extends laterally across the inductance 620 between (i) the vias 622 and (ii) the vias 626. This symmetric arrangement of the angles causes a center of the magnetic field to be equidistant from each of the first set of vias 626 and each of the second set of vias 628. Since the magnetic field extends through the inductance 620 as shown, there is less interference with active devices implemented in one or more dies stacked with the IPD.

Figure 15:
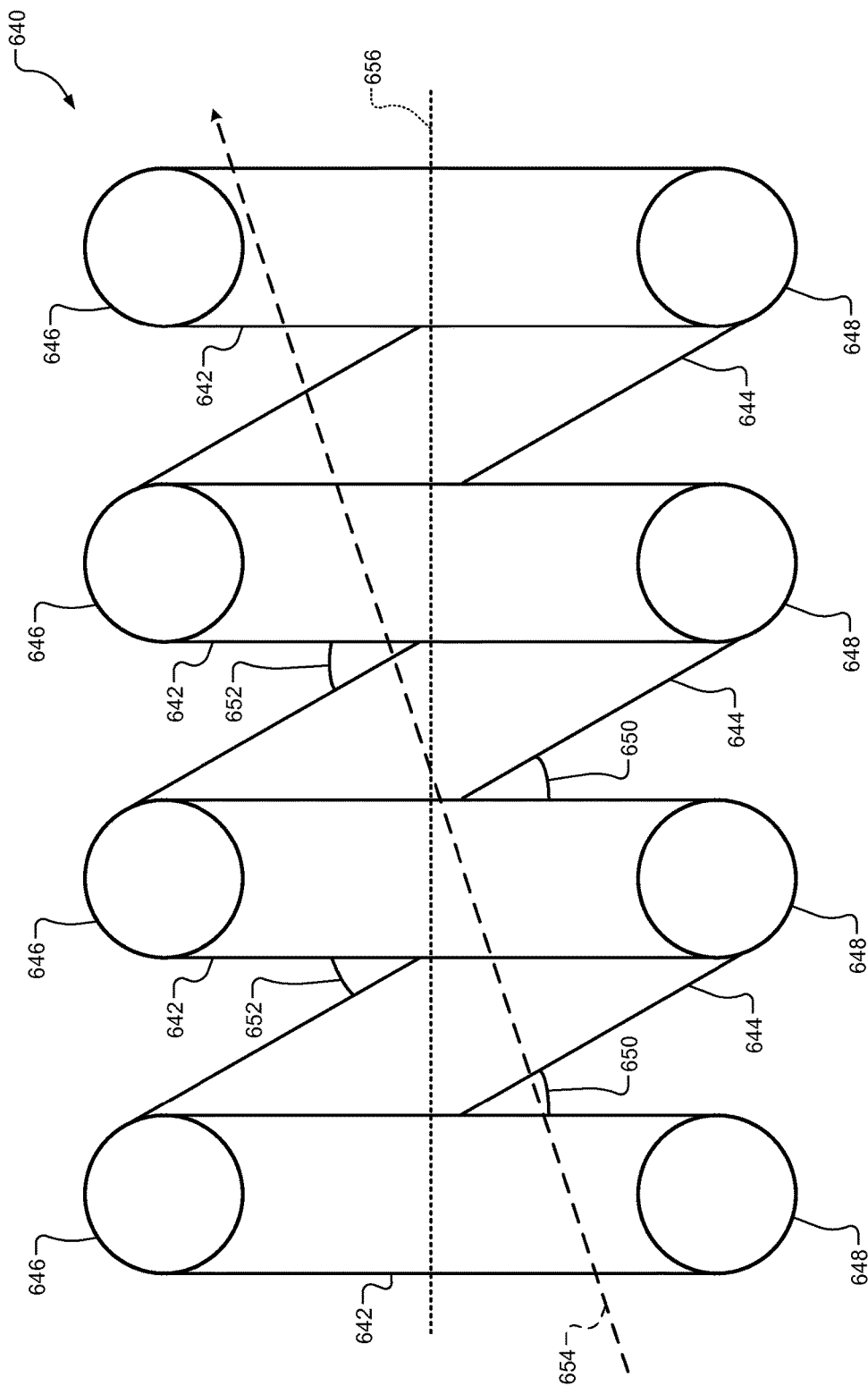
FIG. 15 is a top view of another multi-turn 3D inductance having non-symmetric angles according to an embodiment of the present disclosure.

FIG. 15 shows another multi-turn 3D inductance 640. The inductance 640 includes a first set (or series) of conductors 642, a second set (or series) of conductors 644, a first set (or series) of vias 646 and a second set (or series) of vias 648. The inductance 640 is similar to the inductance 620 of FIGS. 13-14, but angles 650 between first consecutive pairs of the conductors 642, 644 are not symmetric with angles 652 between second consecutive pairs of the conductors 642, 644. Due to this lack of symmetry, the magnetic field or a center of the magnetic field (represented by arrow 654) generated by the inductance 640 does not extend in a direction parallel to an x-axis (or centerline) 656 of the inductance 640. The magnetic field as a result extends towards some of the first set of vias 646.

Figure 16:
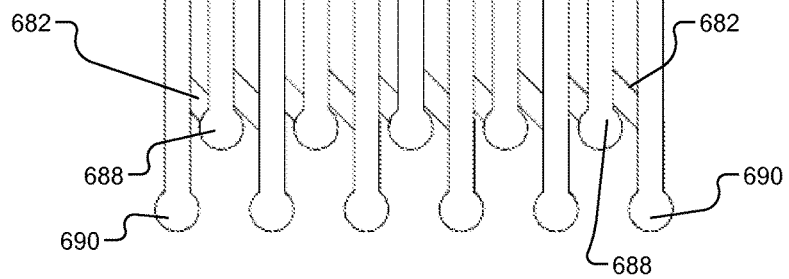
FIG. 16 is a top view of a multi-turn 3D inductance having staggered loops according to an embodiment of the present disclosure.
Figure 17:
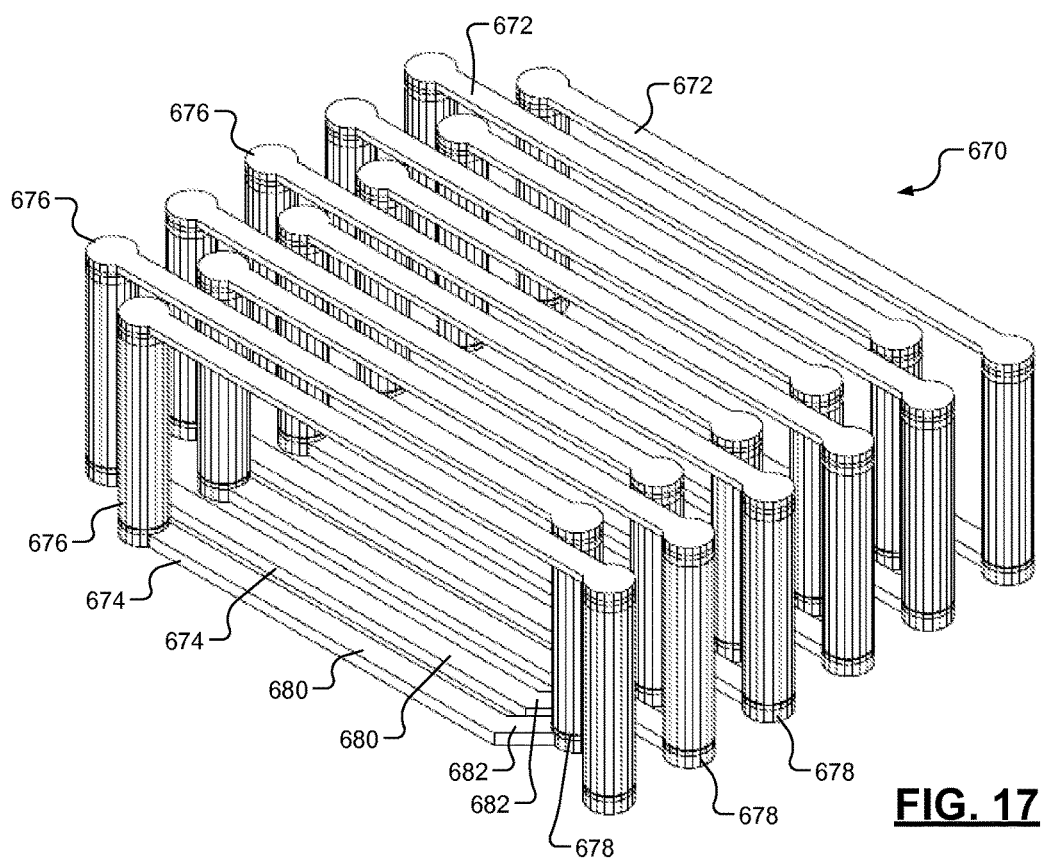
FIG. 17 is a perspective view of the multi-turn 3D inductance of FIG. 16.

FIGS. 16-17 show a multi-turn 3D inductance 670 having staggered loops. The inductance 670 includes a first set of conductors 672, a second set of conductors 674, a first set of vias 676 and a second set of vias 678. The first set of conductors 672 may be implemented in a first layer of an IPD. The vias 676, 678 may be implemented in a substrate of the IPD. The second set of conductors 674 may be implemented in a second layer of the IPD. The substrate may be disposed between the first layer and the second layer.

The second set of conductors 674 includes first portions (or members) 680 and second portions (or members) 682. The first portions 680 may extend parallel to each other and parallel to the first set of conductors 672. The second portions 682 may extend parallel to each other and away from the first portions 680 and towards corresponding ones of the second set of vias 678 (referred to as third vias below).

The first set of vias 676 may extend parallel to each other and parallel to the second set of vias 678. The first set of vias 676 includes first vias 684 and second vias 686. Every other one of the first set (or series) of vias 676 is one of the first vias 684. The second vias 686 are offset from the first vias 674. The second set of vias 678 includes third vias 688 and fourth vias 690. Every other one of the second set (or series) of vias 678 is one of the third vias 688. The third vias 688 are offset from the fourth vias 690. The offset (or staggered) locations of the vias 676, 678 and the conductors 672, 674 provide the staggered loops. Each of the loops having a respective one of each of the vias 676, 678 and conductors 672, 674. This allows the loops to be positioned closer to each other to conserve space in the IPD. The closer positioning of the conductors 672, 674 and vias 676, 678 provides increased magnetic coupling between the elements of the inductance 670. This allows a smaller sized inductance to be built having a same amount of inductance as a larger inductance, where the larger inductance has larger pitches between inductance elements (e.g., conductors and/or vias) that the smaller inductance.

Figure 18:
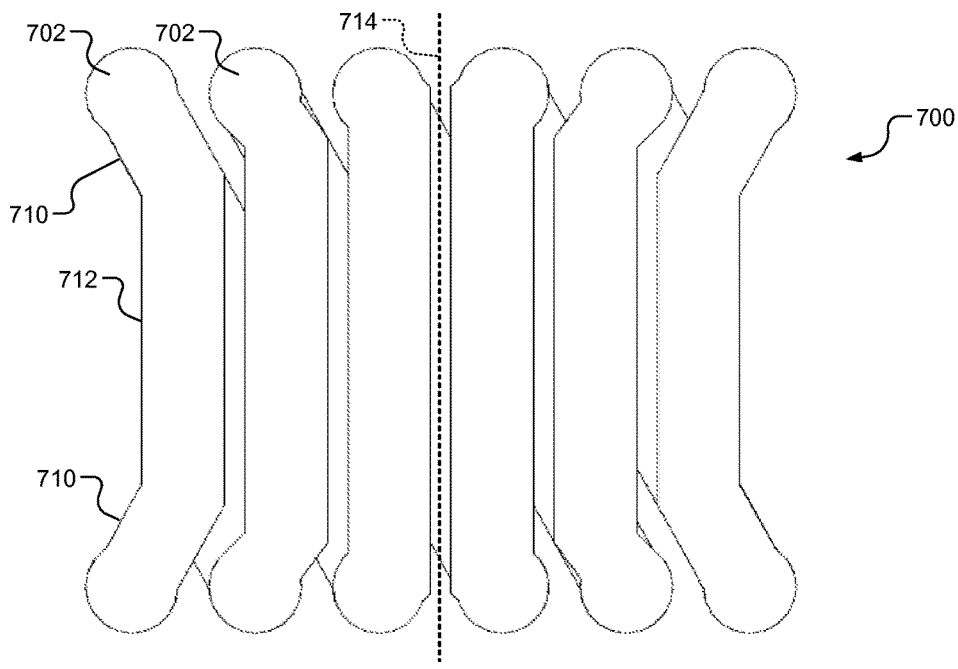
FIG. 18 is a top view of another inductance with pitch between conductors being less than pitch between vias according to an embodiment of the present disclosure.
Figure 19:
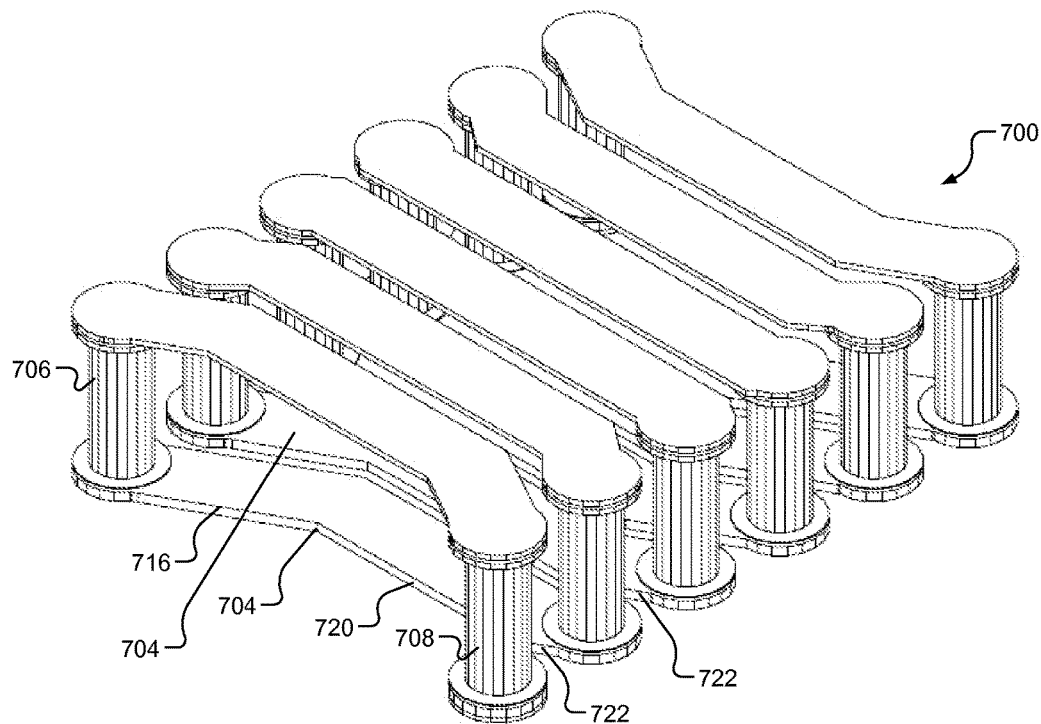
FIG. 19 is a perspective view of the inductance of FIG. 18.

FIGS. 18-19 show an inductance 700 having conductors 702, 704 and vias 706, 708. The first set of conductors 702 may be implemented in a first layer of an IPD. The second set of conductors 704 may be implemented in a second layer of the IPD. The vias 706, 708 may be implemented in a substrate of the IPD. The substrate may be disposed between the first layer and the second layer.

A pitch between adjacent ones of conductors 702 and a pitch between adjacent ones of the conductors 704 are both less than a pitch between adjacent ones of the vias 706 and a pitch between adjacent ones of the vias 708. The first set of conductors 706 has end members 710 and center members 712. The end members 710 extend away from corresponding ones of the vias 706, 708 and toward the center members 712. The center members 712 are closer to a centerline 714, which extends parallel to a y-axis of the inductance. The center members 712 may extend parallel to the centerline 714.

The second set of conductors 704 has first end members 716, center members 720 and second end members 722. A pitch between adjacent ones of the first end members 716, a pitch between adjacent ones of the center members 720, and a pitch between adjacent ones of the second end members 722 may be the same and/or may be the same as the pitch between adjacent ones of the first set of conductors 702. The configuration of the inductance 700 provides an improved quality factor Q over an inductance having a same pitch between adjacent conductors and adjacent vias.

Figure 20:
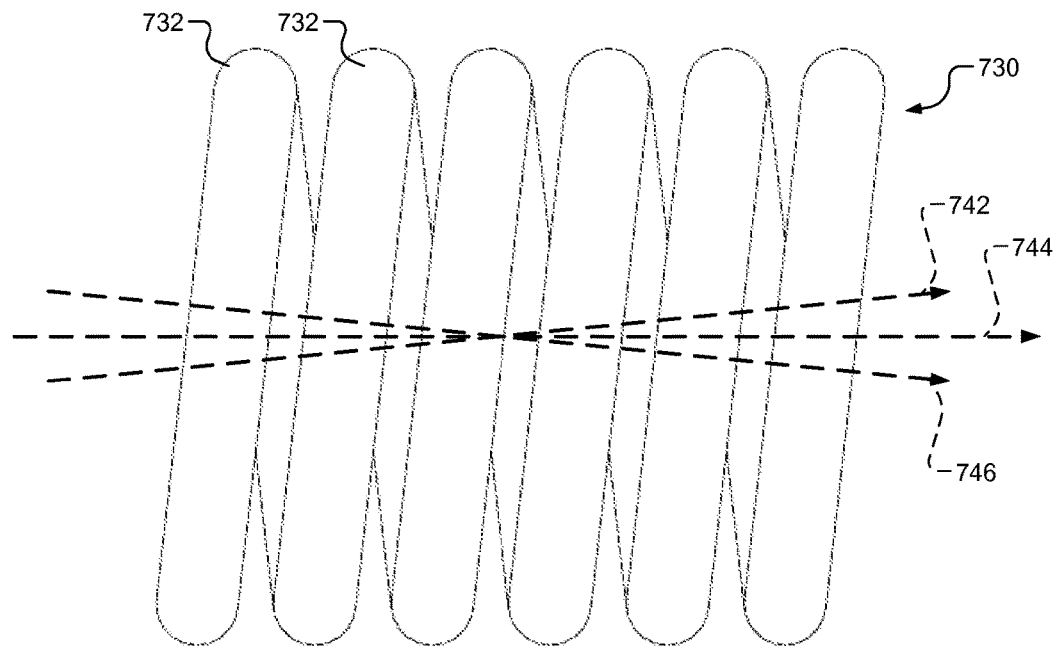
FIG. 20 is a top view of another inductance having a "saw-tooth" configuration according to an embodiment of the present disclosure.
Figure 21:
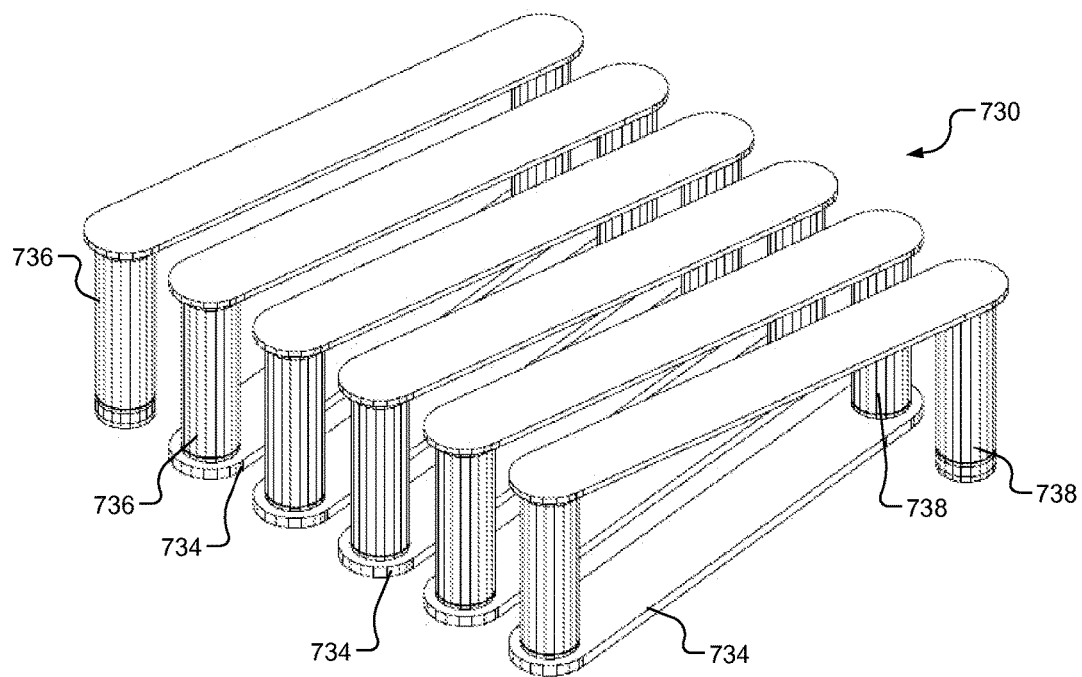
FIG. 21 is a perspective view of the inductance of FIG. 20.

FIGS. 20-21 show an inductance 730 having a "sawtooth" configuration. The inductance 730 includes a first set of conductors 732, a second set of conductors 734, a first set of vias 736 and a second set of vias 738. The first set of conductors 732 may be implemented in a first layer of an IPD. The second set of conductors 734 may be implemented in a second layer of the IPD. The vias 736, 738 may be implemented in a substrate of the IPD. The substrate may be disposed between the first layer and the second layer. The inductance 730 is similar to the inductance 620 of FIGS. 13-14, but the vias 736, 738 have smaller diameters than the vias 626, 628. Thus, radii of the vias 736, 738 are smaller than radii of ends of the conductors 732, 734. The first set of conductors 732 provides a magnetic field in a first direction (indicated by arrow 740). The second set of conductors 734 provide a magnetic field in a second direction (indicated by arrow 742). The magnetic fields combined provide a resultant magnetic field in a third direction (indicated by arrow 744).

Figure 22:
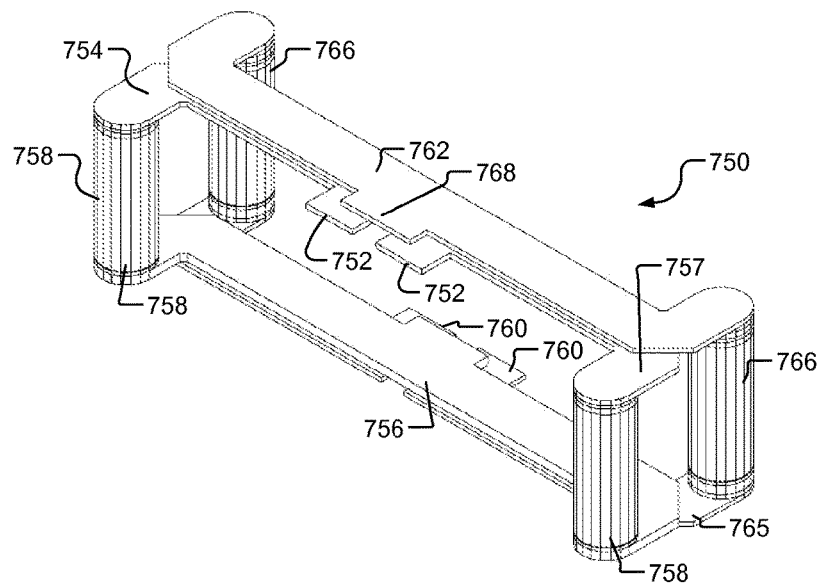
FIG. 22 is a perspective view of the single-turn 3D balun according to an embodiment of the present disclosure.

FIG. 22 shows is a perspective view of the single-turn 3D balun 750. The baluns disclosed herein may be referred to as transformers. The term "single-turn" means a single input loop and a single output loop. The balun 750 includes the input loop having inputs 752, a first conductor 754, a second conductor 756, a third conductor 757, and first vias 758. The balun 750 also includes the output (or second) loop having outputs 760, a fourth conductor 762, a fifth conductor 764, a sixth conductor 765, and fourth vias 766. The output loop is tightly magnetically coupled to the input loop. The balun 750 also includes a center tap 768. The conductors 754, 756, 762, 764 extend between (i) the vias 758 and (ii) the vias 766. The first conductor 754 and the third conductor 757 overlap the second conductor 756. The fourth conductor 762 overlaps the fifth conductor 764 and the sixth conductor 765.

The fourth conductor 762 may be implemented in a first layer of an IPD. The first conductor 754 and the third conductor 757 may be implemented in a second layer of the IPD. The vias 758, 766 may be implemented in a substrate of the IPD. The second conductor 756 may be implemented in a third layer of the IPD. The conductors 764, 765 may be implemented in a fourth layer of the IPD. The substrate may be disposed between the second layer and the third layer.

Figure 23:
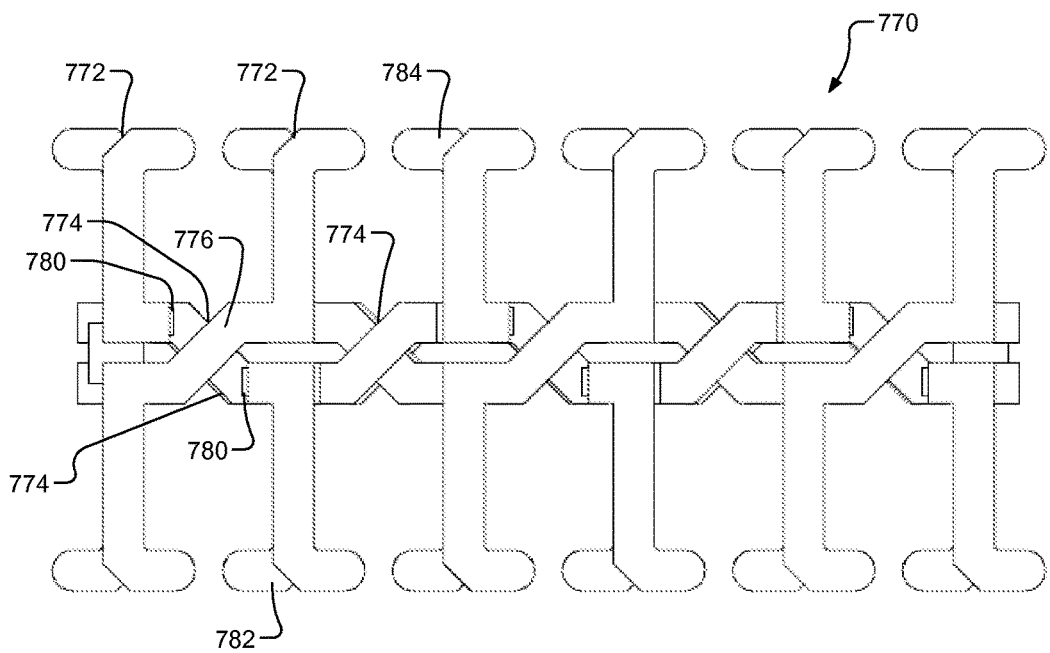
FIG. 23 is a top view of a multi-turn 3D balun according to an embodiment of the present disclosure.
Figure 24:
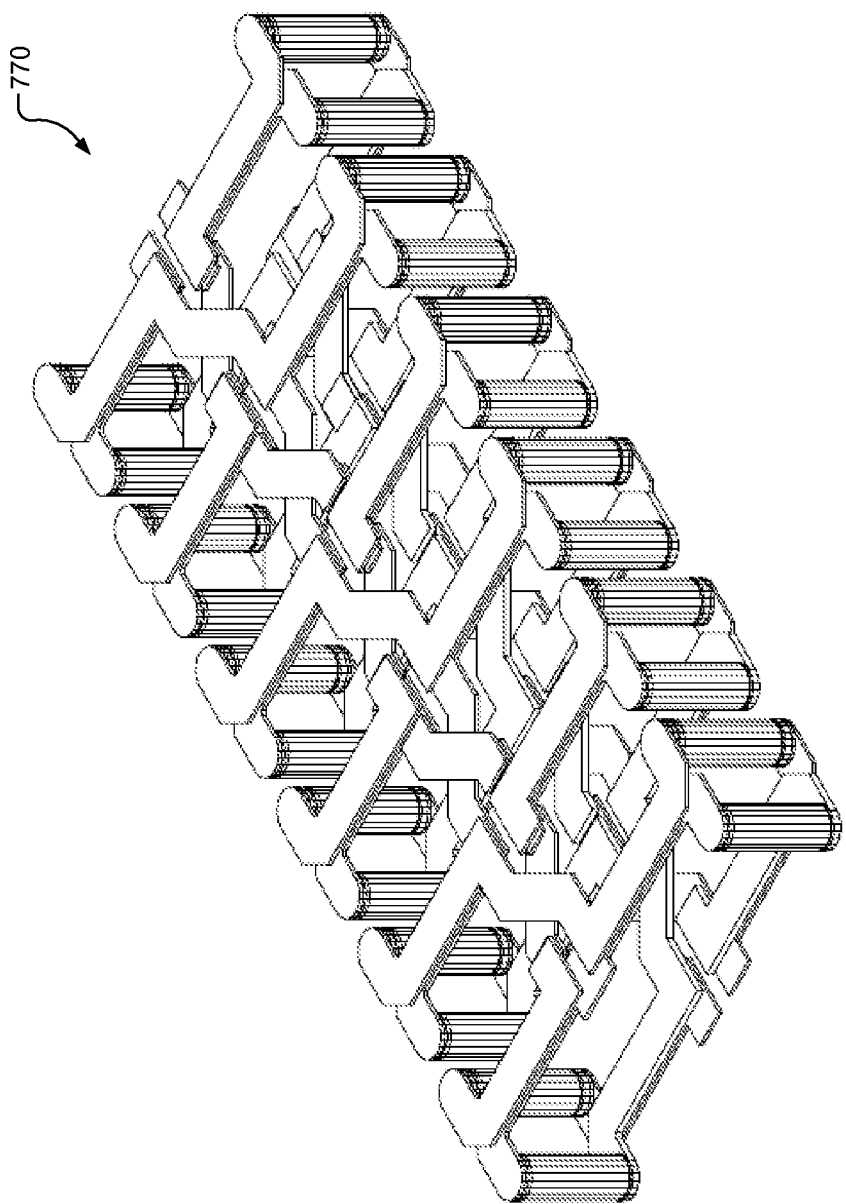
FIG. 24 is a perspective view of the multi-turn 3D balun according to an embodiment of the present disclosure.

FIGS. 23-24 show a multi-turn 3D balun 770. The balun 770 includes multiple loop pairs 772 that are connected by crossovers 774. Each of the loop pairs 772 corresponds to a turn of the balun 770 and includes an input loop and an output loop. The loops are similar to the loops of the single-turn 3D balun 750 of FIG. 22. Each loop pair is connected to an adjacent loop pair by two of the crossovers 774. Each of the crossovers 774 includes two conductors (e.g., conductors 776, 778) that cross each other, but do not contact each other. The conductors of the crossovers 774 are connected to respective conductors of a first loop pair and a loop pair adjacent to the first loop pair. The conductors of each of the crossovers 774 may be implemented in different layers. One of the conductors (e.g., the conductor 778) in each of the crossovers 774 may be implemented in a same layer as corresponding conductors of the loop pairs. The other one of the conductors (e.g., 778) of each of the crossovers 774 may be implemented in a different layer than corresponding conductors of the loop pairs. Conductive elements may be disposed between one conductor of each of the crossovers 774 and the corresponding conductors of the loop pairs. As an example, conductive elements 780 may be disposed between the conductor 776 and corresponding conductors 782, 784.

Figure 27:
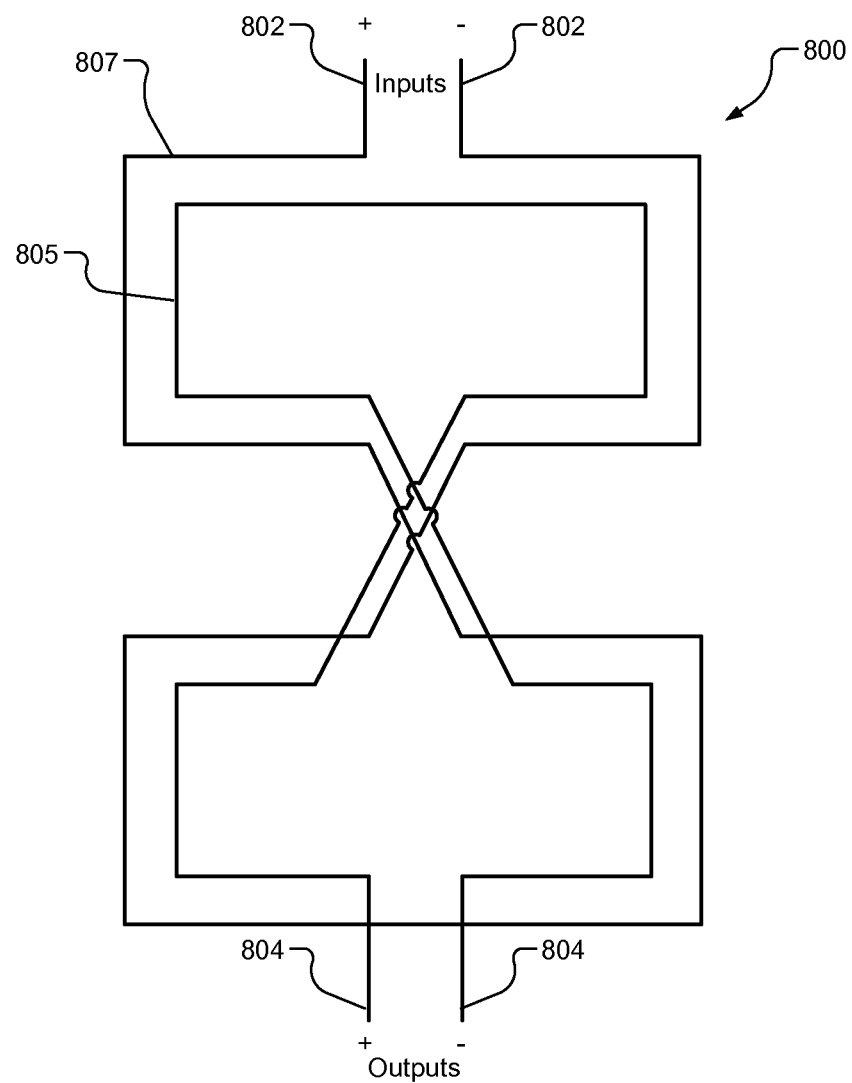
FIG. 27 is a schematic view of an equivalent circuit representation of the single-turn 3D balun of FIG. 25.

FIGS. 25-26 show is a single-turn 3D balun 800 having a figure-8 configuration. The balun 800 includes inputs 802 and outputs 804. The inputs 802 have a first corresponding figure-8 structure 805, which includes corresponding vias 806 and conductors 808. The outputs 804 have a second corresponding figure-8 structure 807, which includes corresponding vias 810 and conductors 812. FIG. 27 shows a representation of an equivalent circuit of the single-turn 3D balun 800 of FIG. 25. The balun 800 has the inputs 802, the outputs 804, the first figure-8 structure 805 and the second figure-8 structure 807. Eddy currents in the loops of the first figure-8 structure 805 are in opposite directions. As a result, induced current in each of the loops of the second figure-8 structure 807 due to interference are minimized and/or cancelled. This provides isolation from other nearby inductances.

To increase inductance additional loops are provided in the following structures of FIGS. 28-29, 33-34, and 37-38. This allows for high frequency application use of these structures. For example, these structures may be used in cellular applications in which 2-3 gigahertz (GHz) signals are transmitted.

Figure 28:
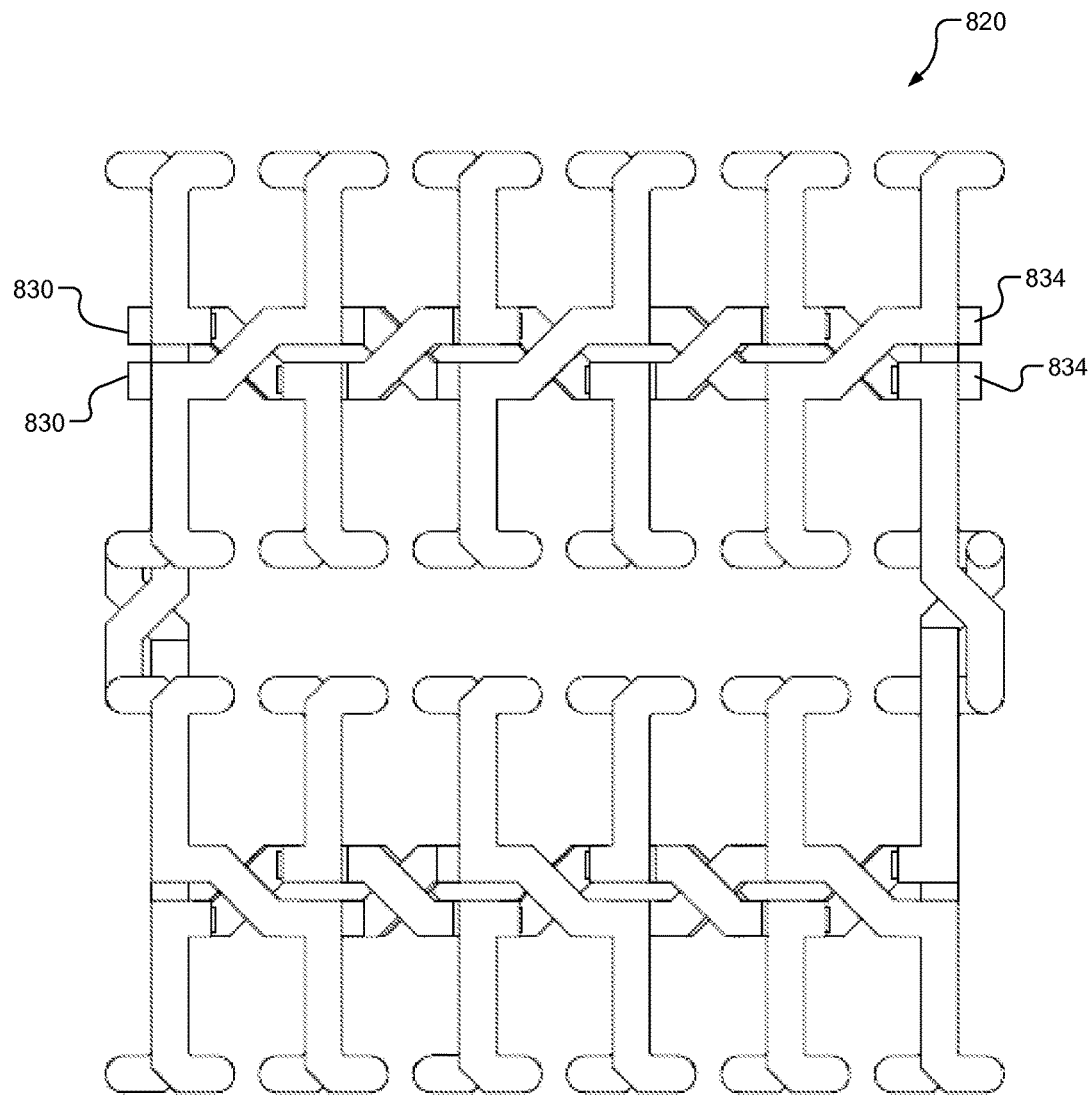
FIG. 28 is a top view of a multi-turn 3D balun having a figure-8 configuration according to an embodiment of the present disclosure.
Figure 29:
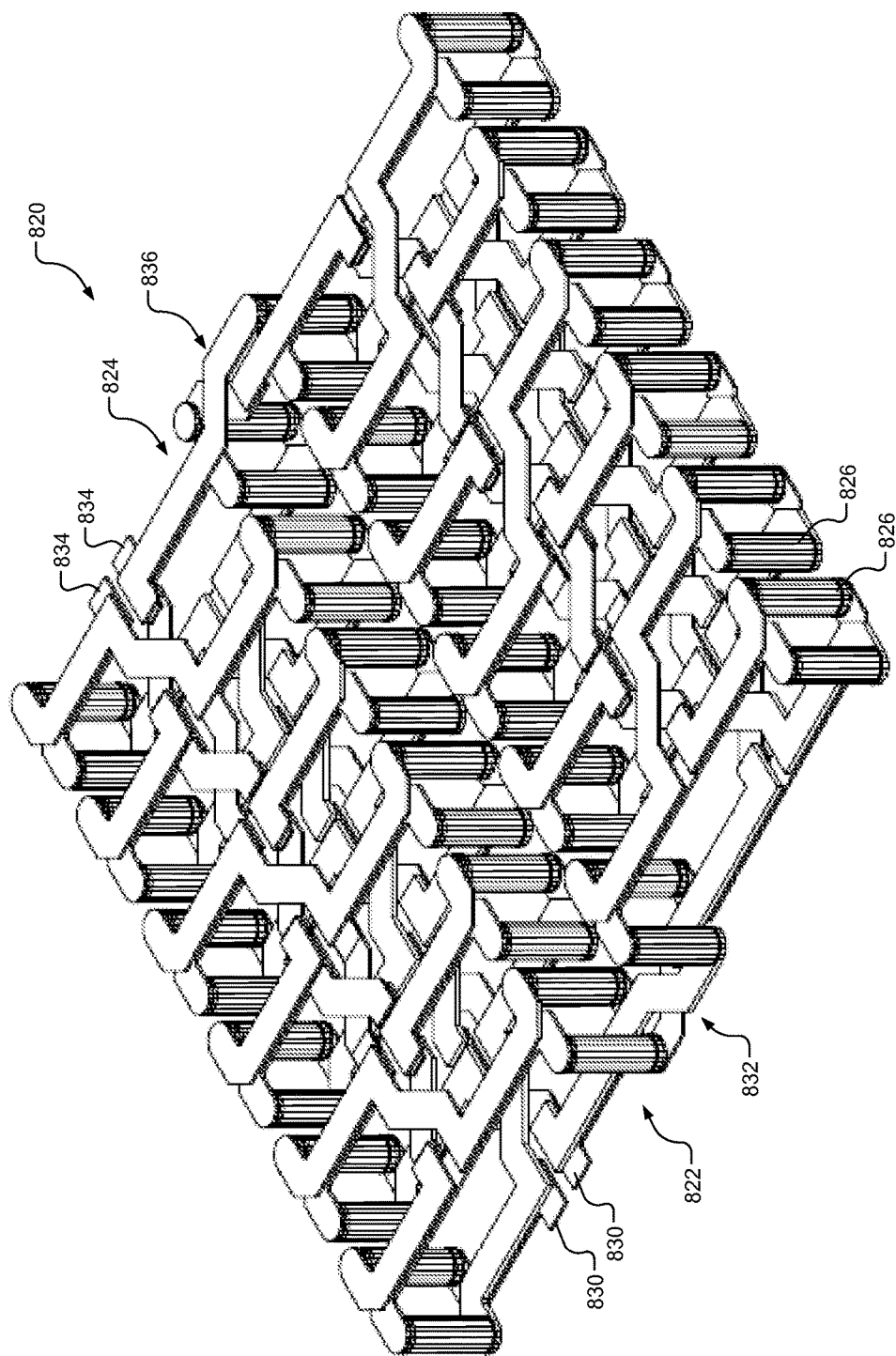
FIG. 29 is a perspective view of the multi-turn 3D balun of FIG. 28.

FIGS. 28-29 show a multi-turn 3D balun 820 having a figure-8 configuration. The balun has two figure-8 structures 822, 824, where each ring of each of the figure-8 structures 822, 824 has multiple loops. As used herein, a ring "refers to a single continuous connection between input terminals or output terminals. Each ring may include conductors, vias and one or more loops. The first figure-8 structure 822 includes conductors shown for lower layers of an IPD. The second figure-8 structure 824 includes conductors shown for upper layers of the IPD. A substrate of the IPD includes vias 826, which are disposed between the lower layers and the upper layers. The first figure-8 structure 822 also includes inputs 830 and a first crossover 832 at a first end of the balun 820. The second figure-8 structure 824 includes outputs 834 and a second crossover 836 at a second end of the balun 820.

Figure 32A:
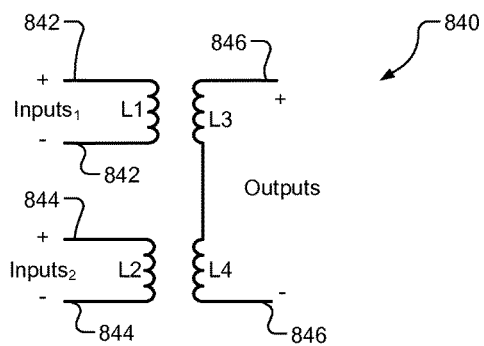
FIG. 32A is a schematic view of an equivalent circuit representation of the single-turn 3D combiner of FIG. 30.
Figure 32B:
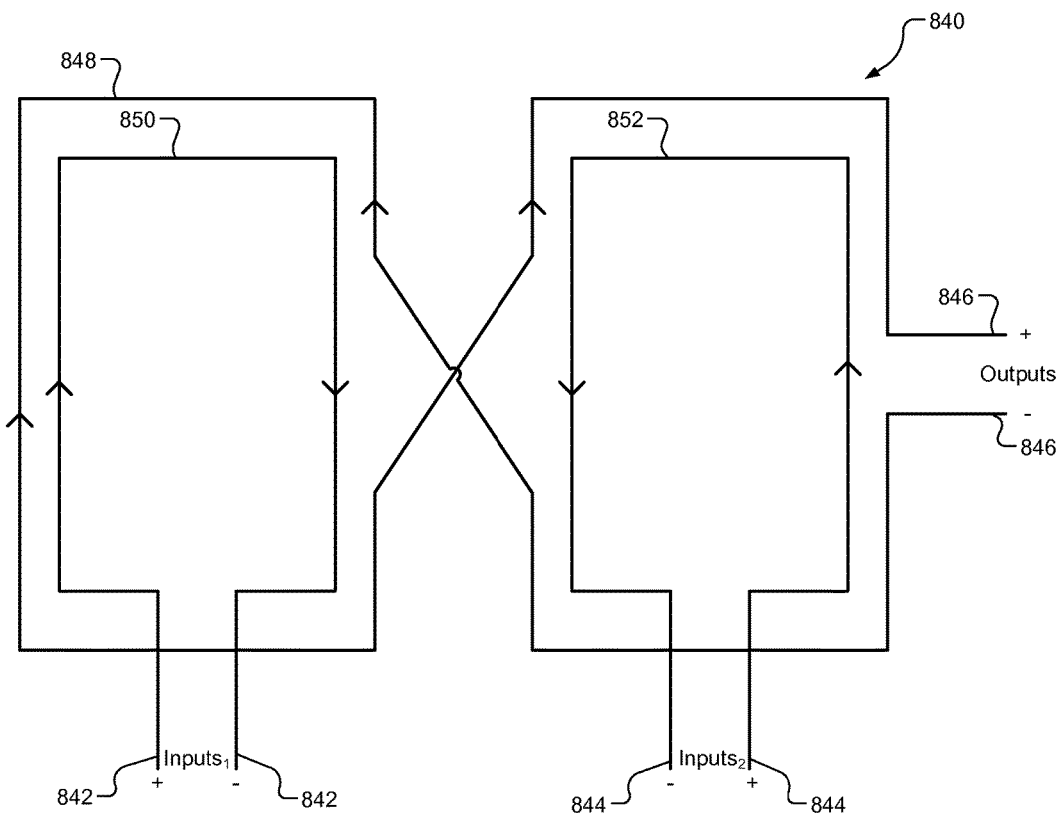
FIG. 32B is a planar schematic view of a figure-8 representation of the single-turn 3D combiner of FIG. 30.

FIGS. 30-31 show a single-turn 3D combiner 840 having a figure-8 configuration. The combiner 840 includes two sets of inputs 842, 844 and one set of outputs 846. Conductors and vias corresponding to the outputs 846 collectively provide a figure-8 structure 848 having a crossover 847. The combiner 840 also includes center taps 849. FIG. 32A shows a representation of an equivalent circuit 850 of the single-turn 3D combiner of FIG. 30. Conductors and vias corresponding to the first set of inputs 842 of the combiner 840 have an inductance representation L1. Conductors and vias corresponding to the second set of inputs 844 of the combiner 840 have an inductance representation L2. Conductors and vias corresponding to the outputs 846 of the combiner 840 have inductance representations L3 and L4. FIG. 32B shows a figure-8 representation of the single-turn 3D combiner 840 of FIG. 30. As shown, the combiner 840 includes the first figure-8 structure 848. The conductors and vias corresponding to the inputs 842 provide a first loop 850. The conductors and vias corresponding to the inputs 844 provide a second loop 852.

Figure 33:
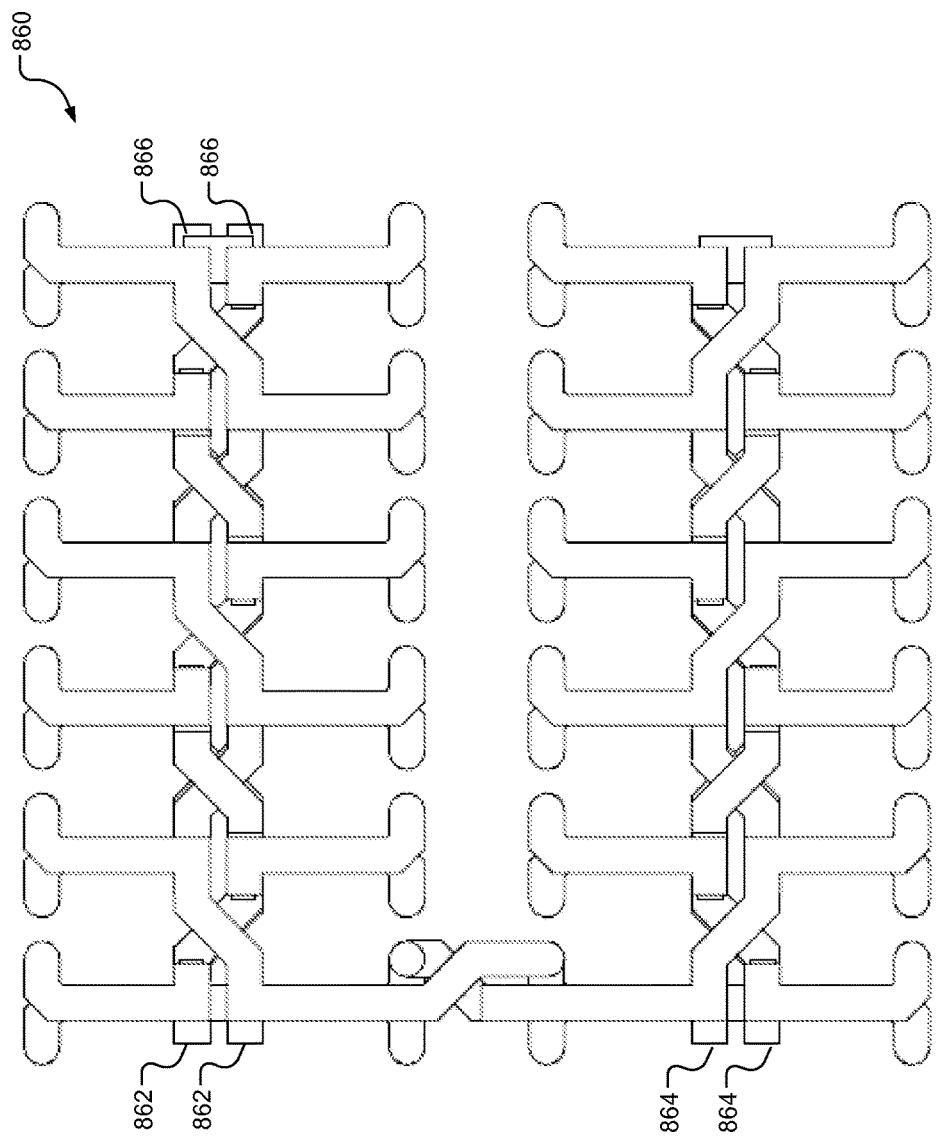
FIG. 33 is a top view of a multi-turn 3D combiner having a figure-8 configuration according to an embodiment of the present disclosure.
Figure 34:
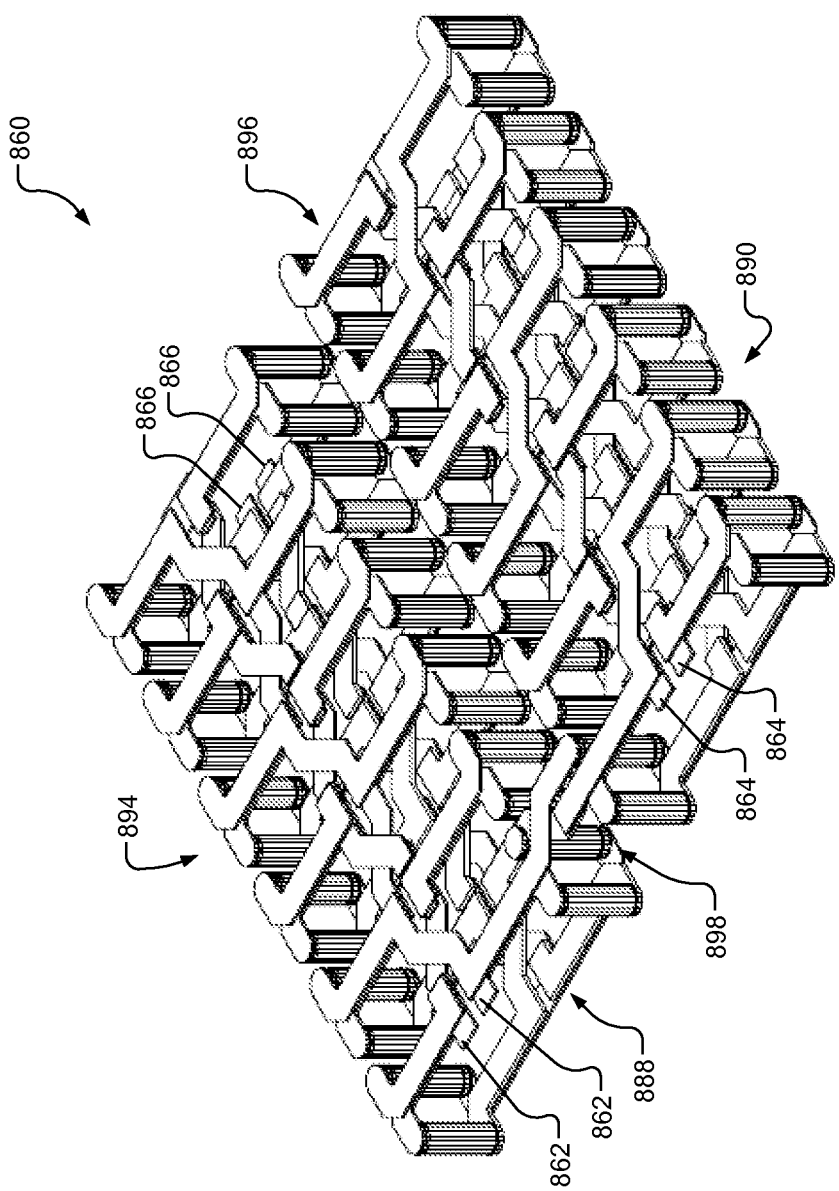
FIG. 34 is a perspective view of the multi-turn 3D combiner of FIG. 33.

FIGS. 33-34 show a multi-turn 3D combiner 860 having a figure-8 configuration. The combiner 860 includes a first set of inputs 862, a second set of inputs 864, and a set of outputs 866. The first set of inputs 862 are connected to a first ring 888. The second set of inputs 864 are connected to a second ring 890. The outputs 866 are connected to a figure-8 structure 892 having two rings 894, 896 and a crossover 898.

The combiner 860 is similar to the combiner 840 of FIGS. 30-31, however the combiner 860 includes multiple turns. As a result, each of the rings 894, 896 of the figure-8 structure 892 includes multiple loops. Also each of the rings 888, 890 connected to the inputs 862, 864 has multiple loops.

FIGS. 35-36 show a single-turn 3D combiner 900 that includes three sets of inputs 902, 904, 906 and a single set of outputs 908. Thus, the combiner 900 includes three input inductances and three output inductances. The output inductances are connected in series via crossovers 910, 912 and have the set of outputs 908.

Figure 37:
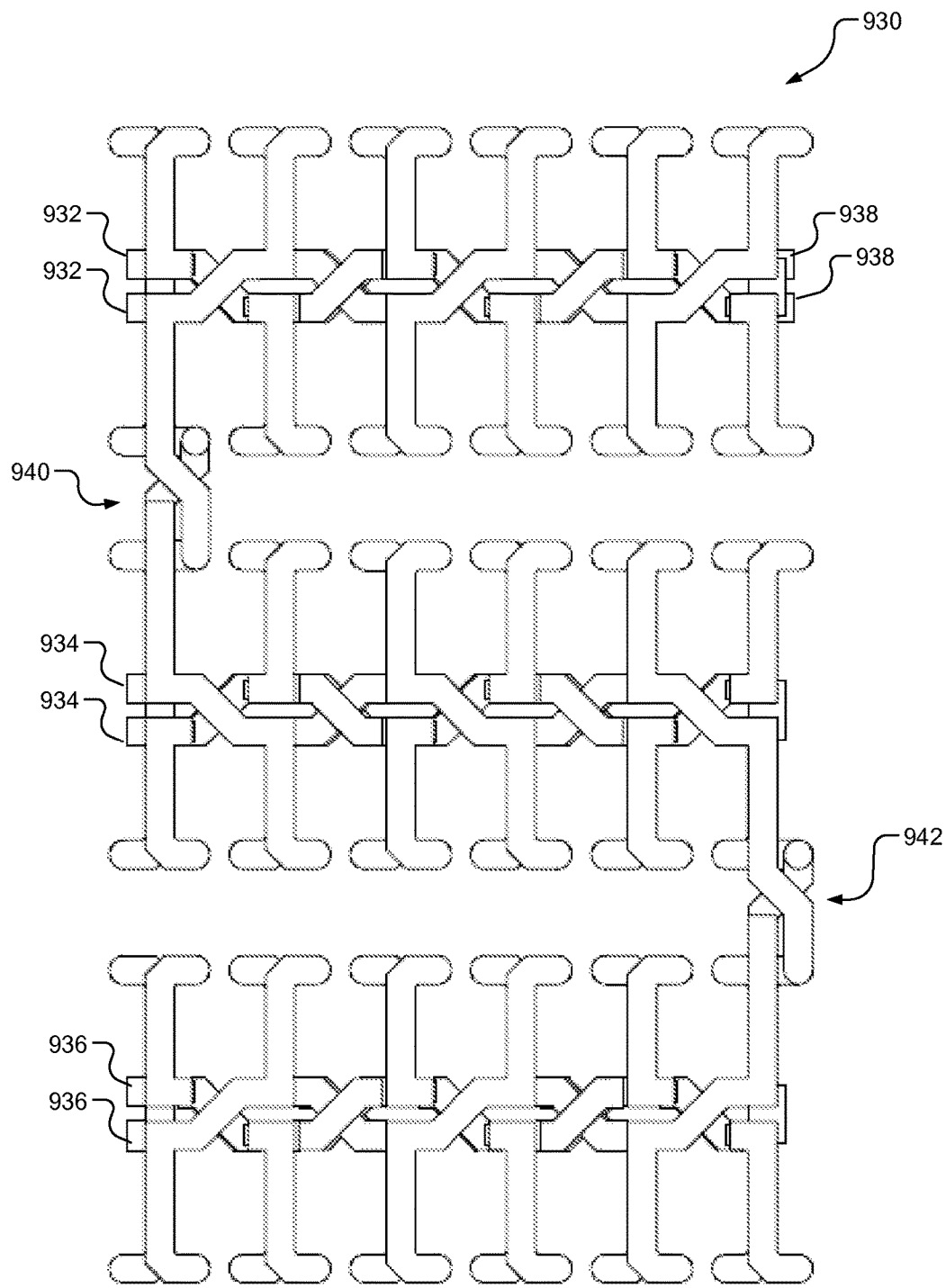
FIG. 37 is a top view of a multi-turn 3D combiner having three sets of inputs according to an embodiment of the present disclosure.
Figure 38:
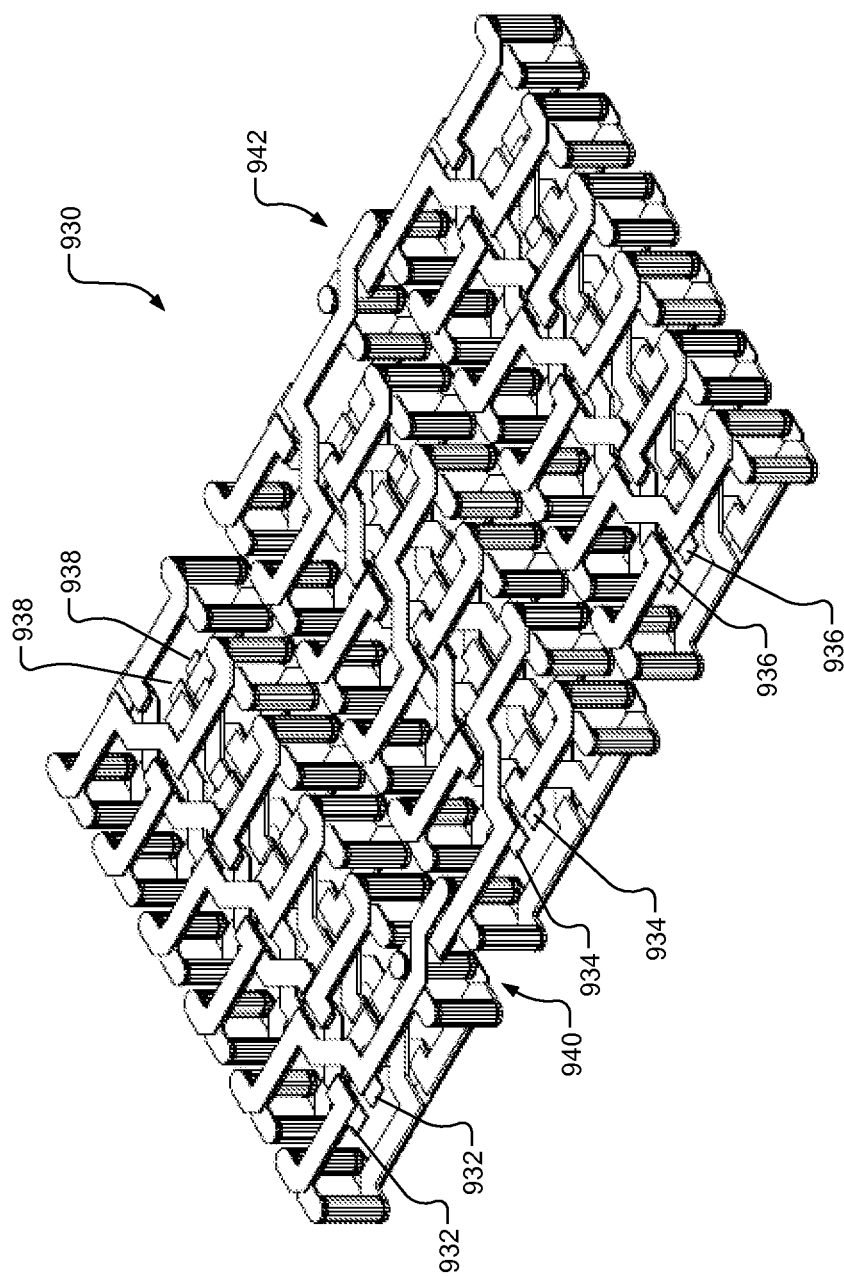
FIG. 38 is a perspective view of the multi-turn 3D combiner of FIG. 37.

FIGS. 37-38 show a multi-turn 3D combiner 930 having three sets of inputs 932, 934, 936 and a set of outputs 938. Thus, the combiner 900 includes three input inductances and three output inductances. The output inductances are connected in series via crossovers 940, 942 and have the set of outputs 938. Each ring of the combiner 930 has multiple loops with respective crossovers.

Figure 39:
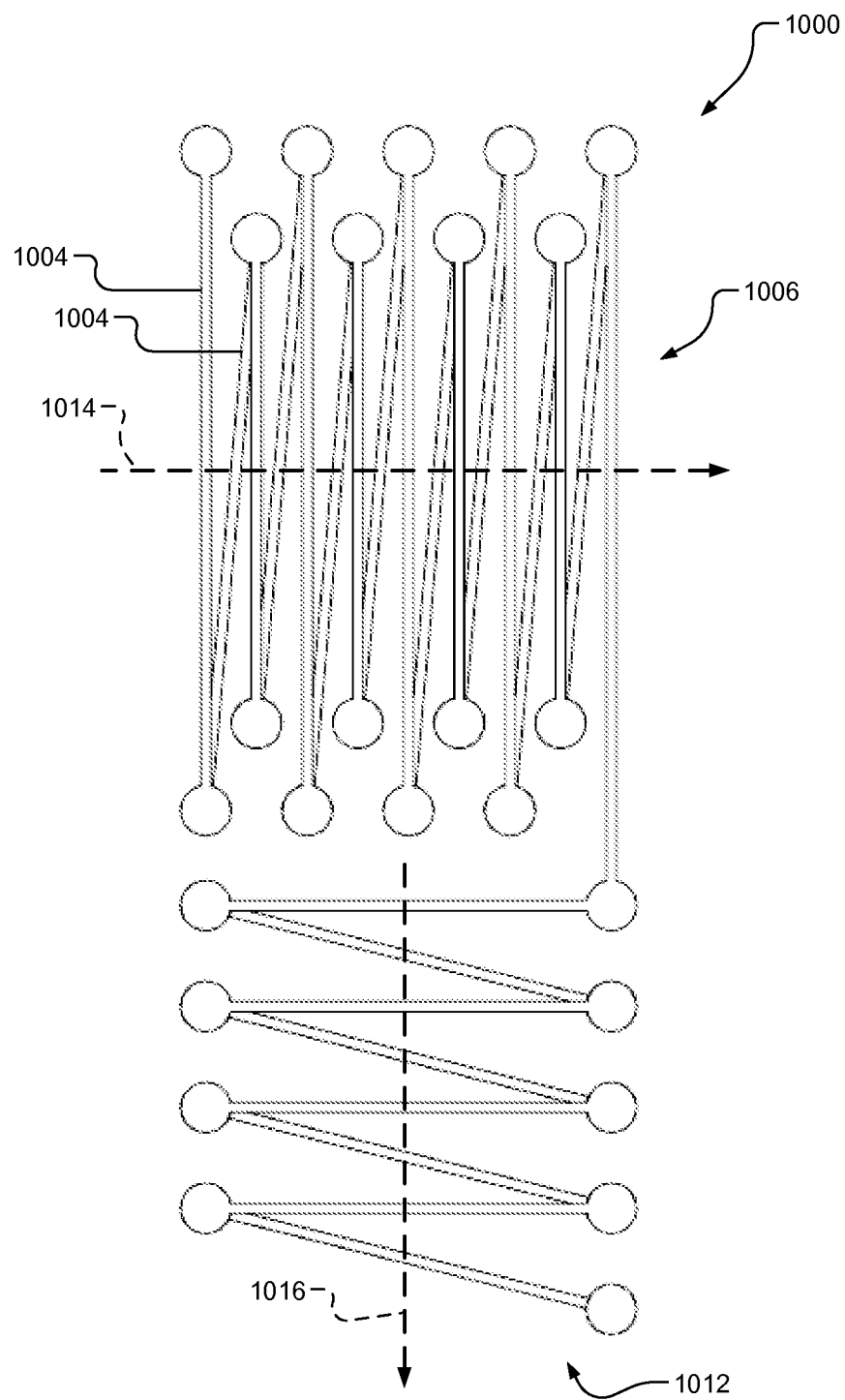
FIG. 39 is a top view of an electrostatic discharge inductance having multi-perpendicular magnetic fields according to an embodiment of the present disclosure.
Figure 40:
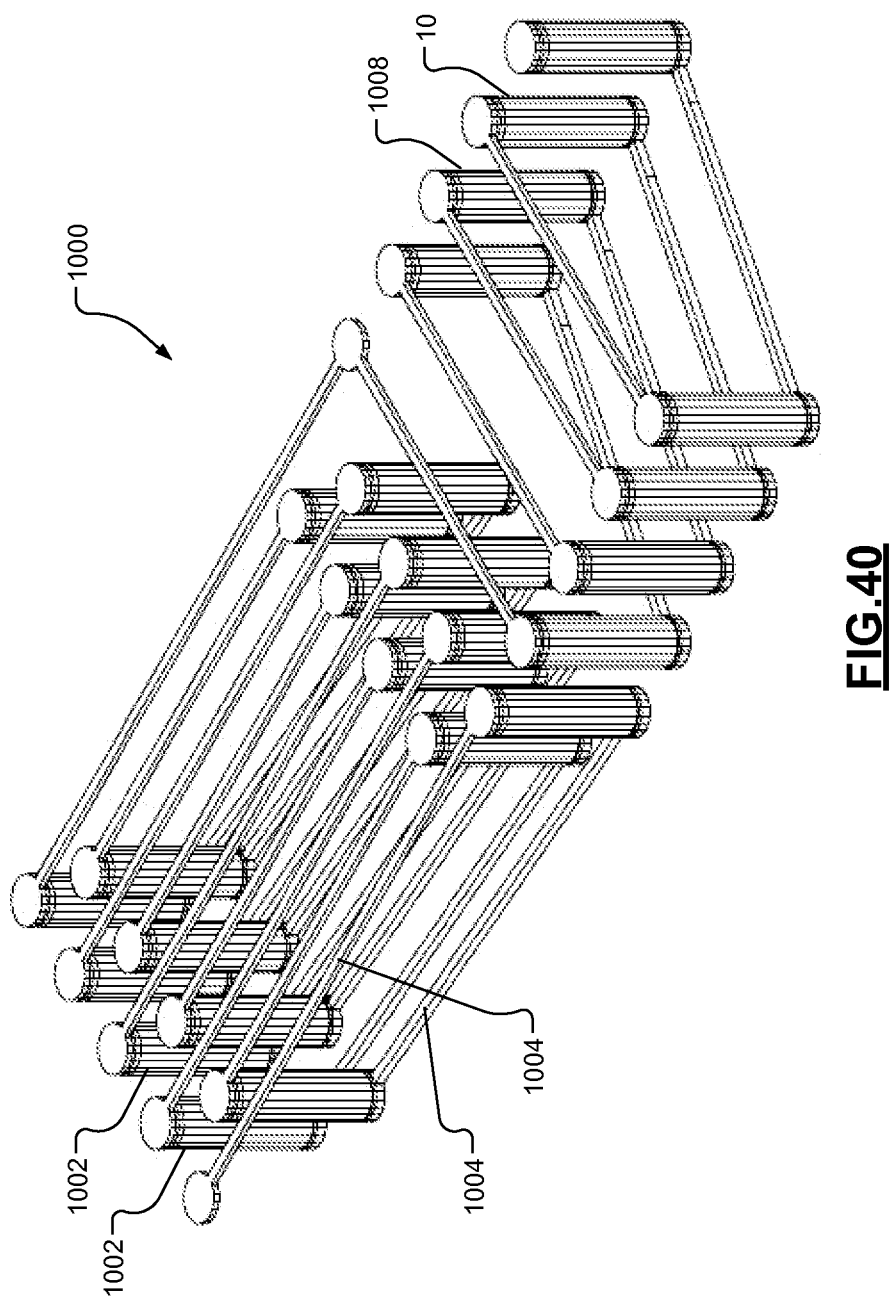
FIG. 40 is a perspective view of the electrostatic discharge inductance of FIG. 39.

FIGS. 39-40 show an electrostatic discharge inductance 1000 having multi-perpendicular magnetic fields. The inductance 1000 includes a first set of vias 1002 and a first set of conductors 1004, which provide a first set of loops 1006. The inductance 1000 also includes a second set of vias 1008 and a second set of conductors 1010, which provide a second set of loops 1012. The first set of loops 1006 provides a first magnetic field (indicated by arrow 1014). The second set of loops 1012 provides a second magnetic field (indicated by arrow 1016). First ones of the first set of conductors 1004 extend in a perpendicular direction to first ones of the second set of conductors 1010. Second ones of the first set of conductors 1004 extend in a perpendicular direction to second ones of the second set of conductors 1010.

Figure 41:
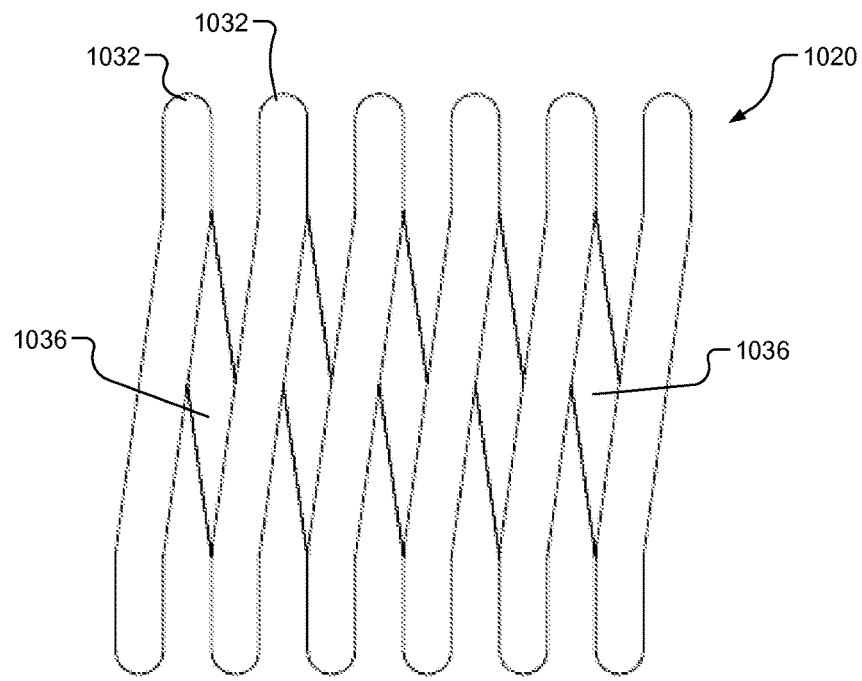
FIG. 41 is a top view of a stacked 3D balun according to an embodiment of the present disclosure.
Figure 42:
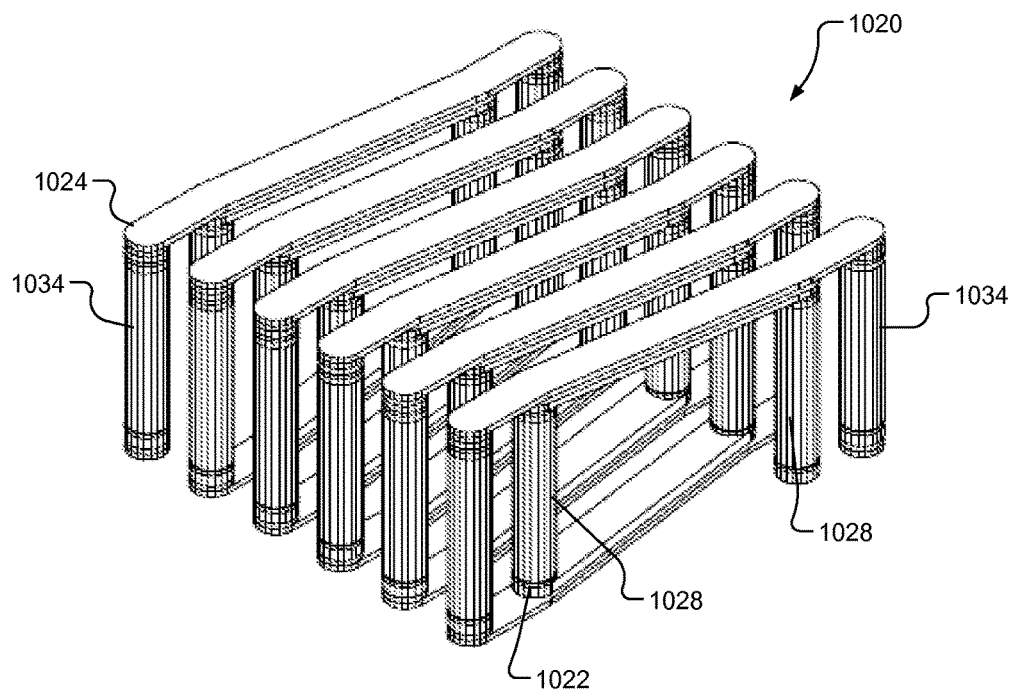
FIG. 42 is a perspective view of the stacked 3D balun of FIG. 41.

FIGS. 41-42 show a stacked 3D balun 1020, which includes two inductances 1022, 1024. The first inductance 1022 may be a primary coil and the second inductance 1024 may be a secondary coil. Each loop of the first inductance 1022 may be in alignment with and in a corresponding loop of the second inductance 1024. The first inductance 1022 is within the second inductance 1024. The first inductance 1022 includes a first set of conductors 1026, first vias 1028 and a second set of conductors 1030. The second inductance 1024 includes a third set of conductors 1032, second vias 1034 and a fourth set of conductors 1036. The first set of conductors 1026 overlap the third set of conductors 1032. The second set of conductors 1030 overlap the fourth set of conductors 1036. The first set of conductors 1026, the second set of conductors 1030, the third set of conductors 1032 and the fourth set of conductors 1036 may be in respective layers of an IPD. The vias 1028, 1034 may be implemented in a substrate of the IPD between the layers of the conductors 1030, 1032. Each of the vias 1028 may be in alignment with a respective one of the vias 1034. Each of the conductors 1026, 1030 may be in alignment with each of the conductors 1032, 1036. Each of the conductors 1032 extends over two of the vias 1028. Each of the conductors 1036 extends under each of the vias 1028.

Figure 43:
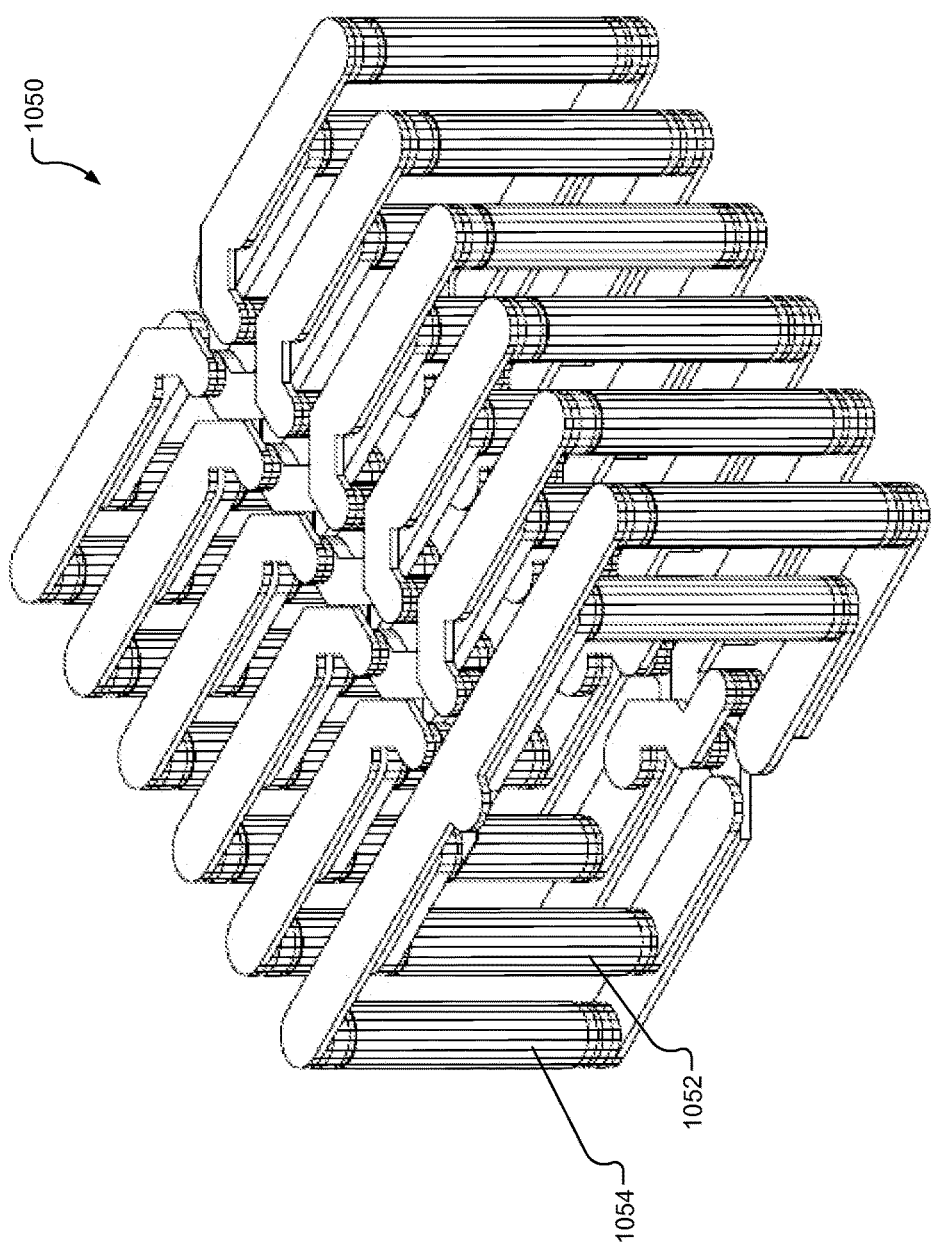
FIG. 43 is a perspective view of a double-loop 3D balun according to an embodiment of the present disclosure.
Figure 45:
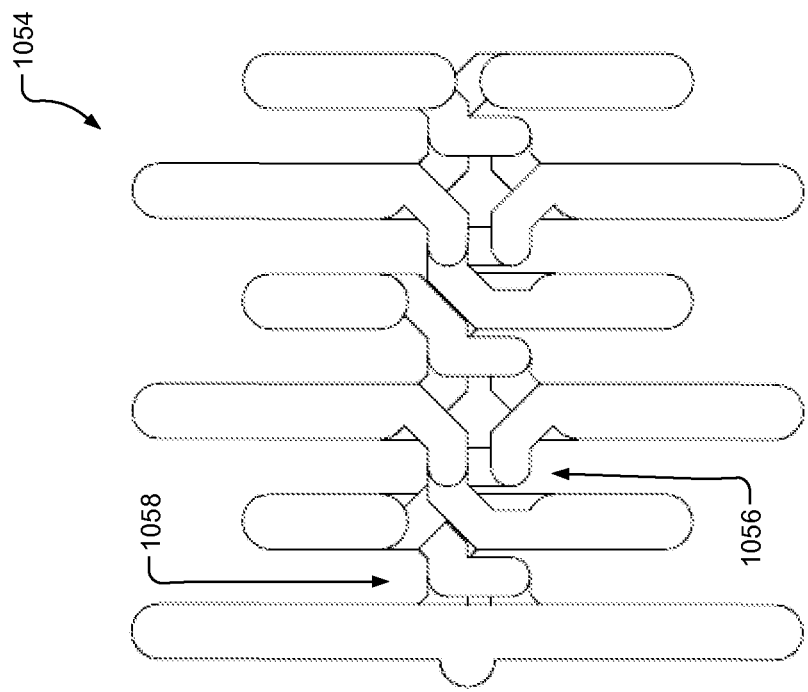
FIG. 45 is a top view of a secondary inductance of the double-loop 3D balun of FIG. 33.
Figure 44:
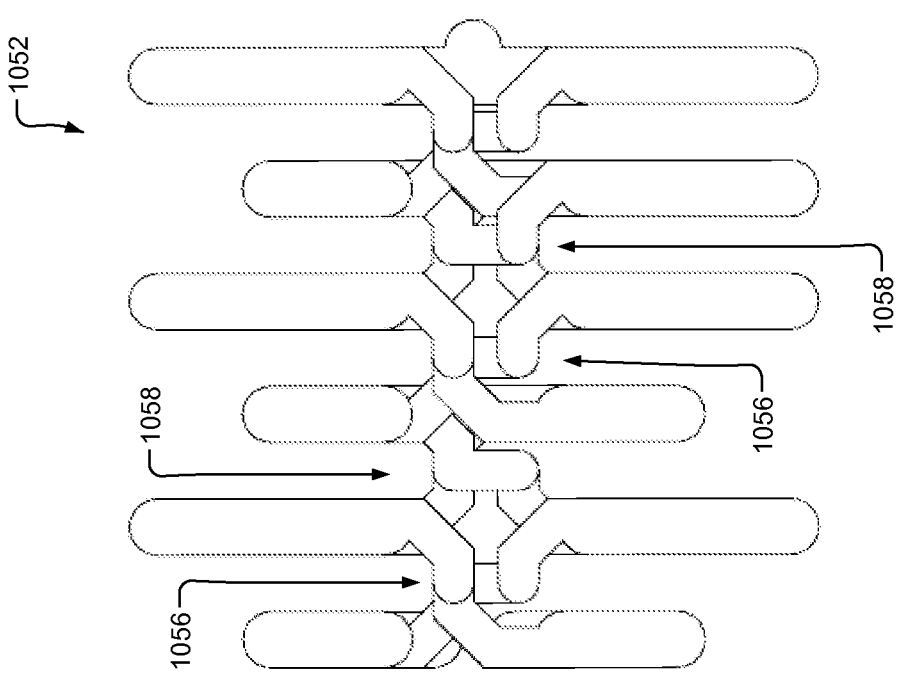
FIG. 44 is a top view of a primary inductance of the double-loop 3D balun of FIG. 33.
Figure 47:
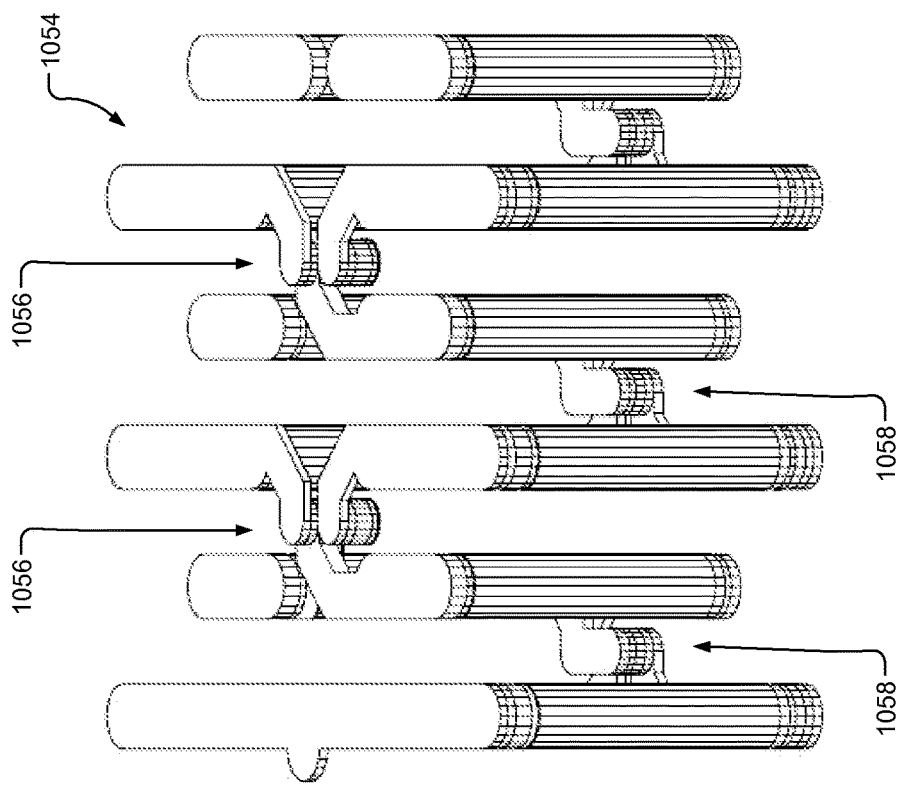
FIG. 47 is a perspective view of the secondary inductance of FIG. 45.
Figure 46:
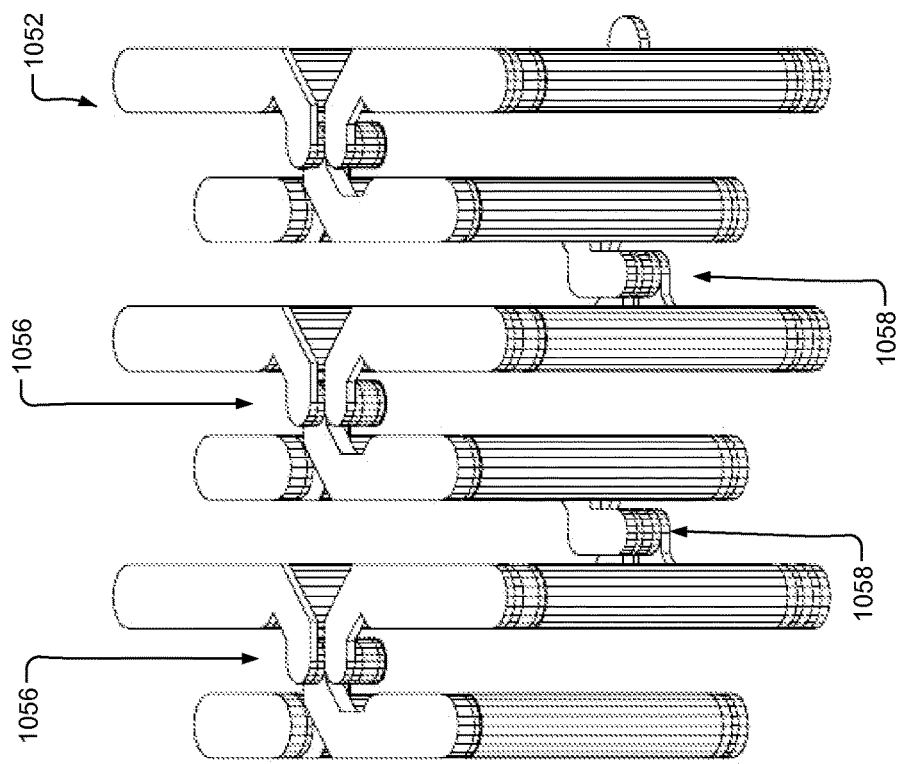
FIG. 46 is a perspective view of the primary inductance of FIG. 44.

FIG. 43 shows a double-loop 3D balun 1050 that includes two inductances 1052, 1054. The first inductance 1052 may be a primary coil and is shown in FIGS. 44 and 46. The secondary inductance 1054 may be a secondary coil and is shown in FIGS. 45 and 47. Loops of the first inductance 1052 alternates with the loops of the second inductance 1054, such that every other loop of the first inductance 1052 is in the every other loop of the second inductance 1054. The remaining every other loop of the second inductance 1054 is within the remaining every other loop in the first inductance 1052. The inductances 1052, 1054 cross each other at crossovers 1056, 1058. The crossovers 1056 may be in upper layers of a corresponding IPD and the crossovers 1058 may be in lower layers of the IPD. Although the balun 1050 has more than two loops, the balun 1050 is referred to as a double-loop balun due to the alternating inner and outer loop configuration of the balun 1050. The balun 1050 is a fully differential balun.

Figure 48:
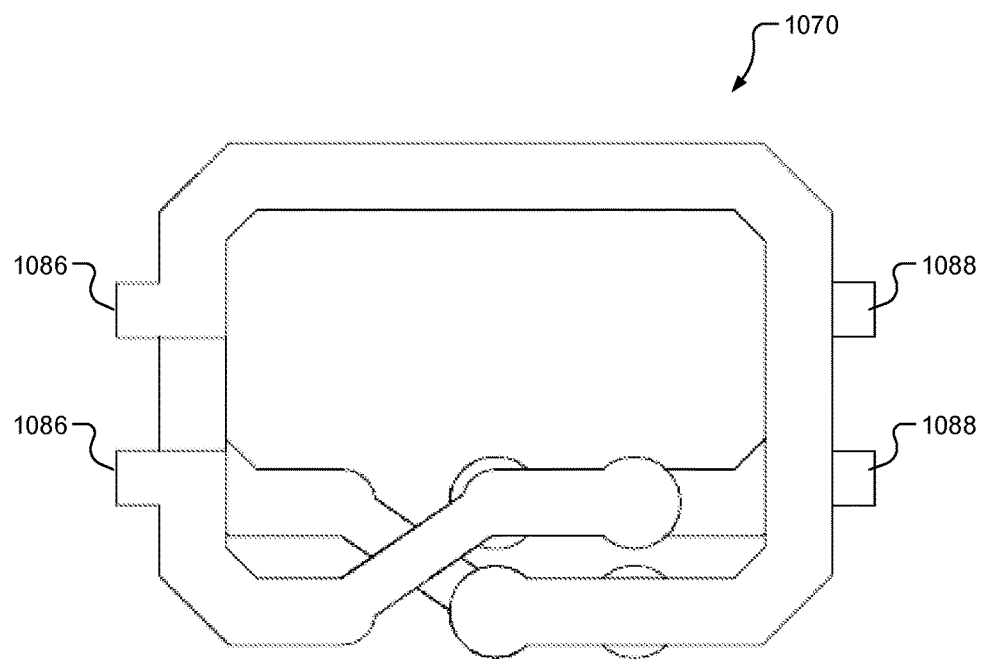
FIG. 48 is a top view of a burger balun according to an embodiment of the present disclosure.
Figure 49:
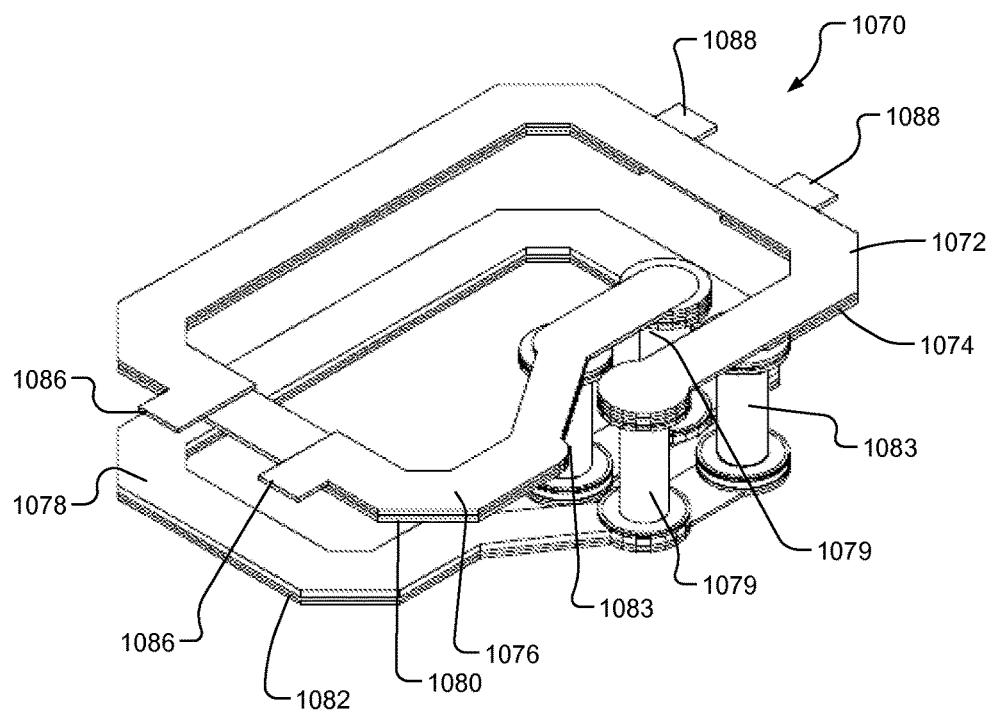
FIG. 49 is a perspective view of the burger balun of FIG. 48.
Figure 50:
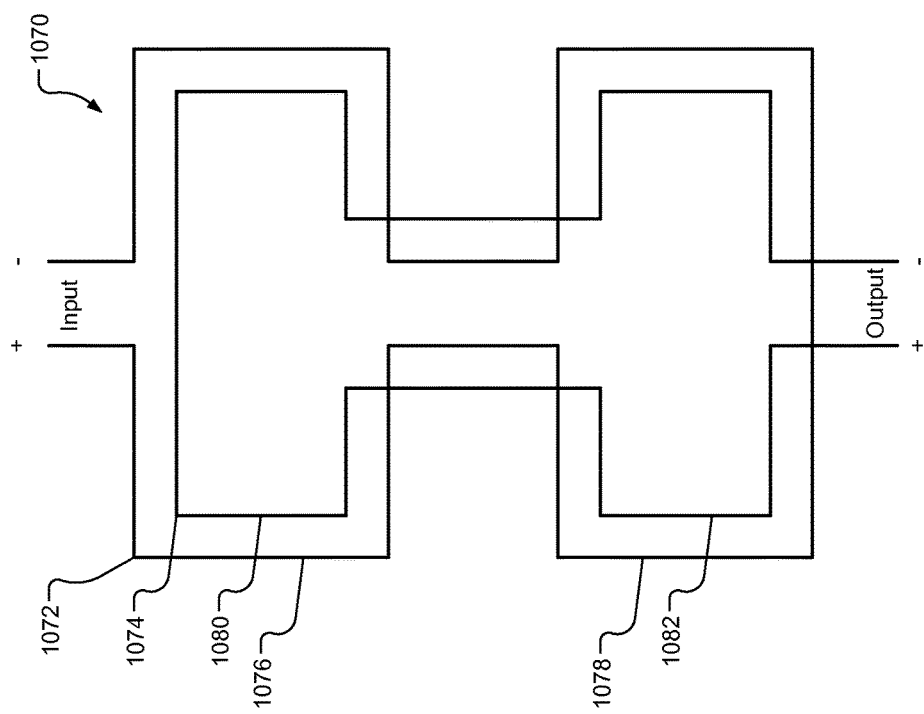
FIG. 50 is a planar schematic view of a figure-8 representation of the burger balun of FIG. 48.

FIGS. 48-49 show a burger balun 1070 that includes two figure-8 structures 1072, 1074. The figure-8 structure 1072 includes loops 1076, 1078 and vias 1079. The figure-8 structure 1074 includes loops 1080, 1082 and vias 1083. The loop 1076 is stacked on and is in alignment with the loop 1080. The loop 1078 is stacked on and is in alignment with 1082. Portions of the loops 1076, 1080 may be stacked over and may be in alignment with portions of the loops 1078, 1082, as shown. Each of the loops 1076, 1078, 1080, 1082 may be implemented in respective layers of an IPD. The vias 1079, 1083 may be implemented in a substrate of the IPD. The loop 1076 has inputs 1086. The loop 1080 has outputs 1088. FIG. 50 is a planar schematic view of a figure-8 representation of the burger balun 1070. As shown in FIG. 50, the burger balun 1070 includes the figure-8 structures 1072, 1074, where the loops 1080 and 1082 are represented as being located respectively in the loops 1076, 1078.

Figure 52:
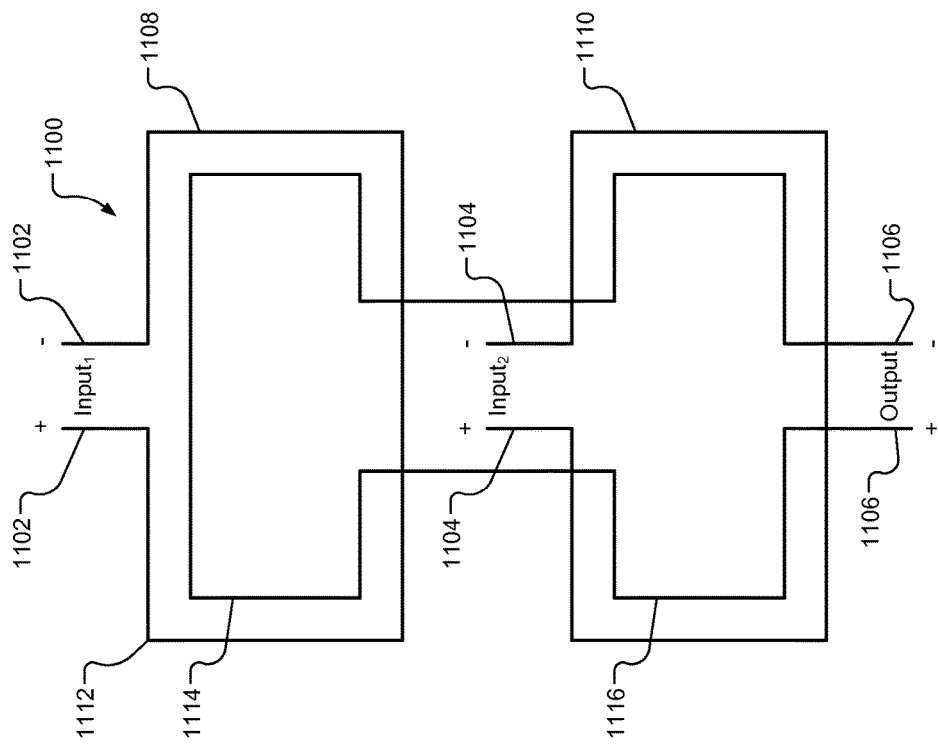
FIG. 52 is a planar schematic view of a figure-8 representation of the burger power combiner of FIG. 51.
Figure 51:
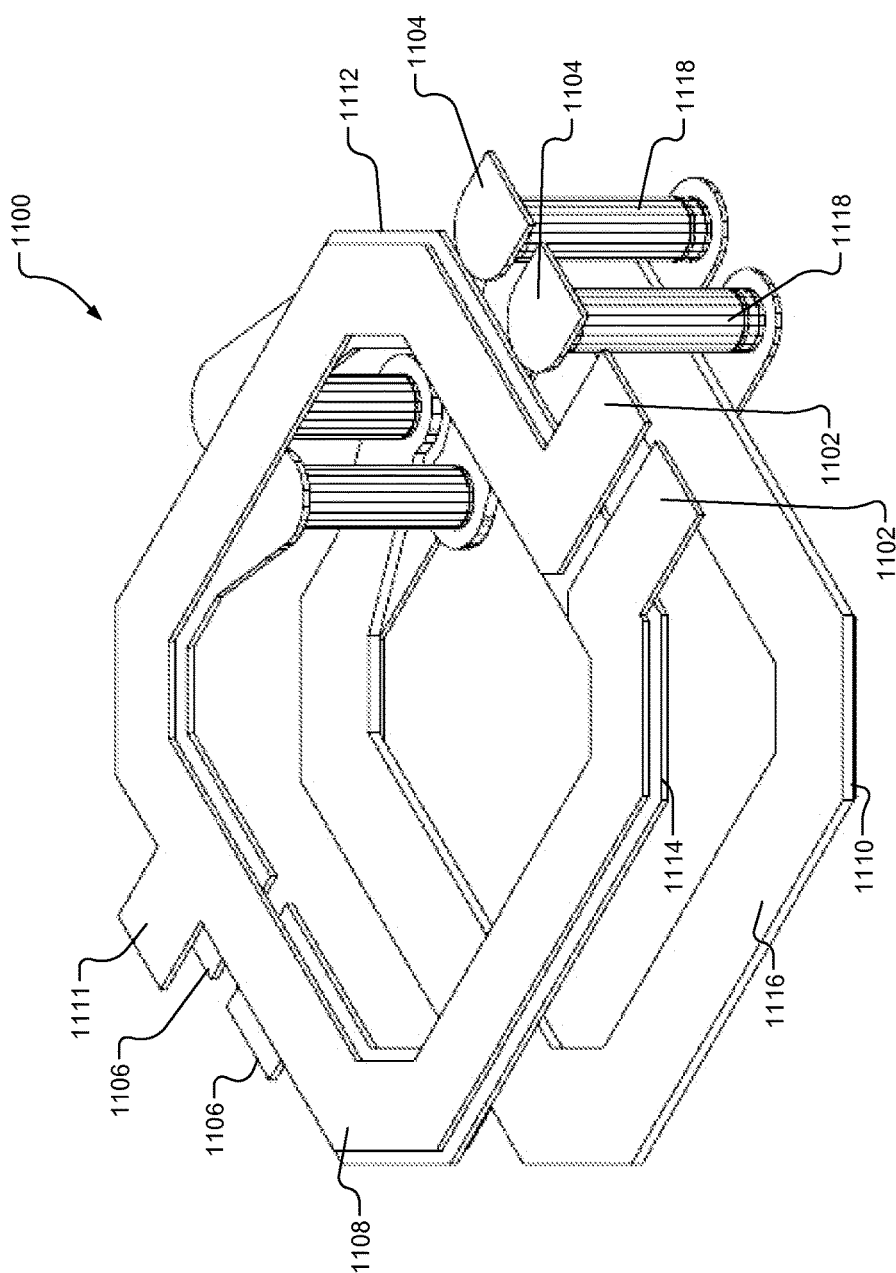
FIG. 51 is a perspective view of a burger power combiner according to an embodiment of the present disclosure.

FIG. 51 shows a burger power combiner or splitter 1100 (referred to as a burger power combiner below but may operate as a splitter). FIG. 52 shows a planar schematic view of a figure-8 representation of the burger power combiner 1100. The burger power combiner has 2 sets of inputs 1102, 1104 and a set of outputs 1106. The inputs 1102, 1104 have corresponding loops 1108, 1110. The loop 1108 has a center tap 1111. The outputs 1106 are connected to a figure-8 structure 1112 having loops 1114, 1116 and vias 1118. In FIG. 52, the loops 1114, 1116 of the figure-8 structure 1112 are represented as being located respectively in the loops 1108, 1110.

Figure 53:
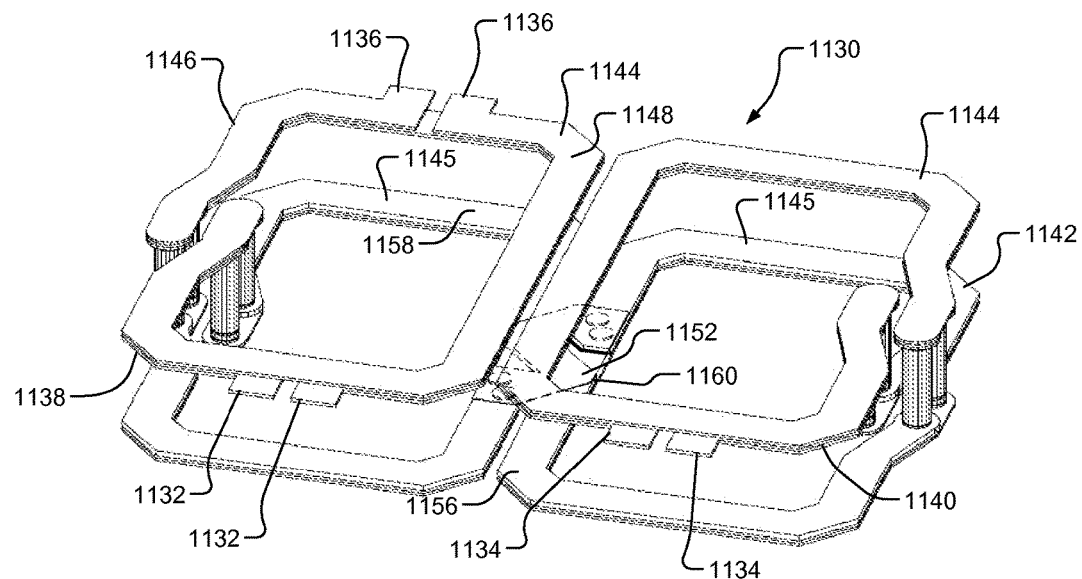
FIG. 53 is a top view of a burger power combiner having a multi-figure-8 structure according to an embodiment of the present disclosure.
Figure 54:
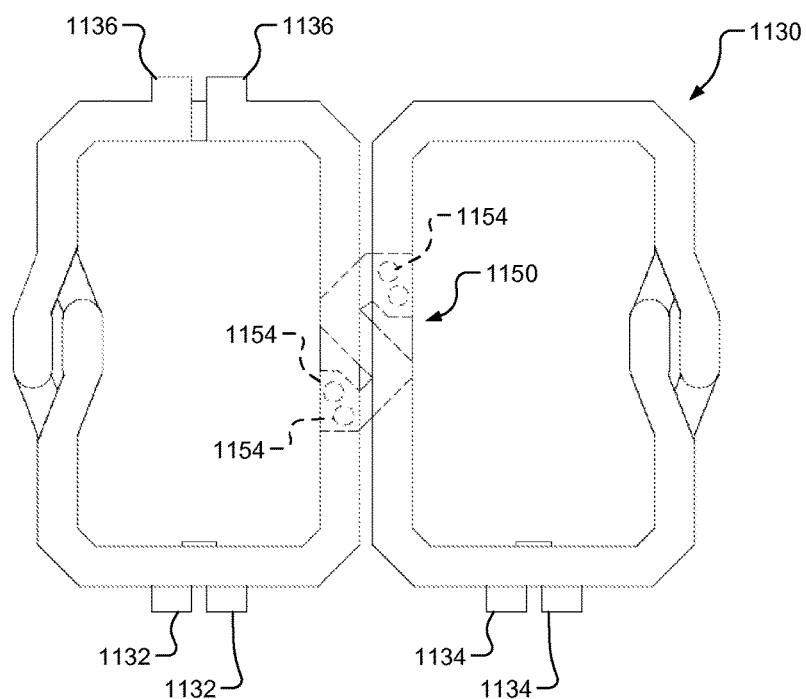
FIG. 54 is a perspective view of the burger power combiner of FIG. 53.
Figure 55:
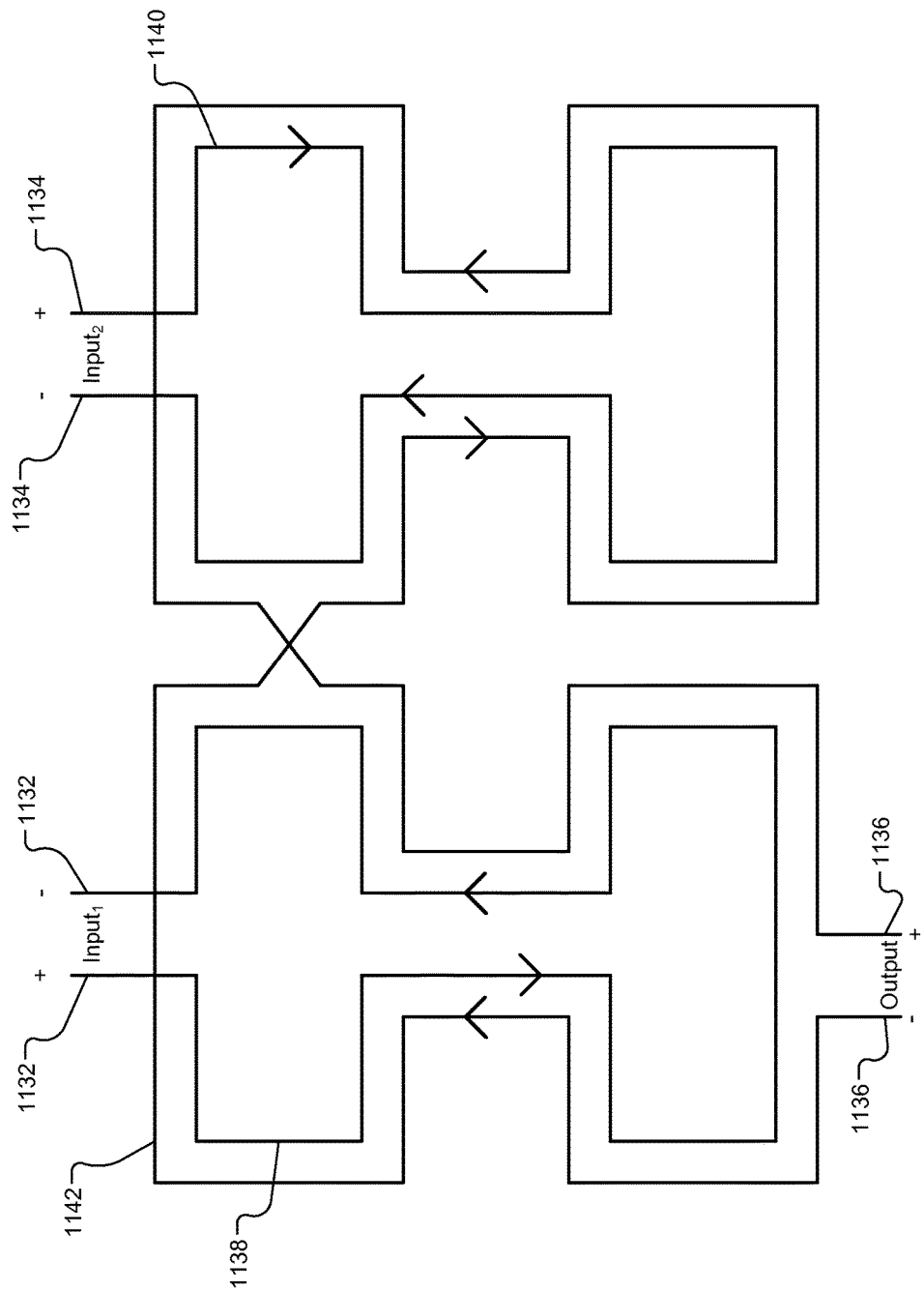
FIG. 55 is a planar schematic view of the burger power combiner of FIG. 53.

FIGS. 53-54 show a burger power combiner or splitter 1130 (referred to as a burger power combiner below but may operate as a splitter) having a multi-figure-8 structure. FIG. 55 shows a planar schematic view of the burger power combiner 1130. The burger power combiner 1130 has multiple inductances with a figure-8 configuration. The burger power combiner 1130 includes two sets of inputs 1132, 1134 and a set of outputs 1136. The inputs 1132, 1134 have corresponding figure-8 structures 1138, 1140. The outputs 1136 have a corresponding figure-8 structure 1142 with corresponding upper loops 1144 and lower loops 1145. One of the upper loops has two conductors 1146, 1148. The lower loops 1145 are connected via a crossover 1150 which includes a crossover conductor 1152 that connects conductors of the lower loops 1145. Conductive elements 1154 may be disposed between and connect the lower loops 1145 to the crossover conductor 1152. Conductors 1156 and 1158 are connected via a crossover conductor 1160, which extends under and does not contact the crossover conductor 1152. An insulative layer may be disposed between (i) the crossover conductor 1152 and (ii) the conductors 1156, 1158 and the crossover conductor 1160. In FIG. 55, loops of the figure-8 structures 1138, 1140 are represented as being located in loops of the figure-8 structure 1142.

Figure 56:
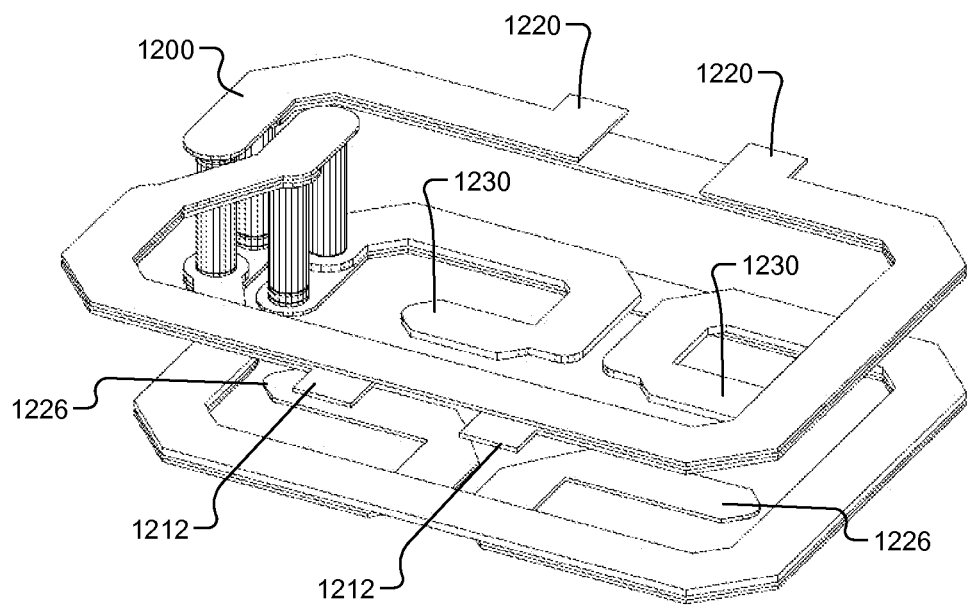
FIG. 56 shows a perspective view of a burger balun.
Figure 57:
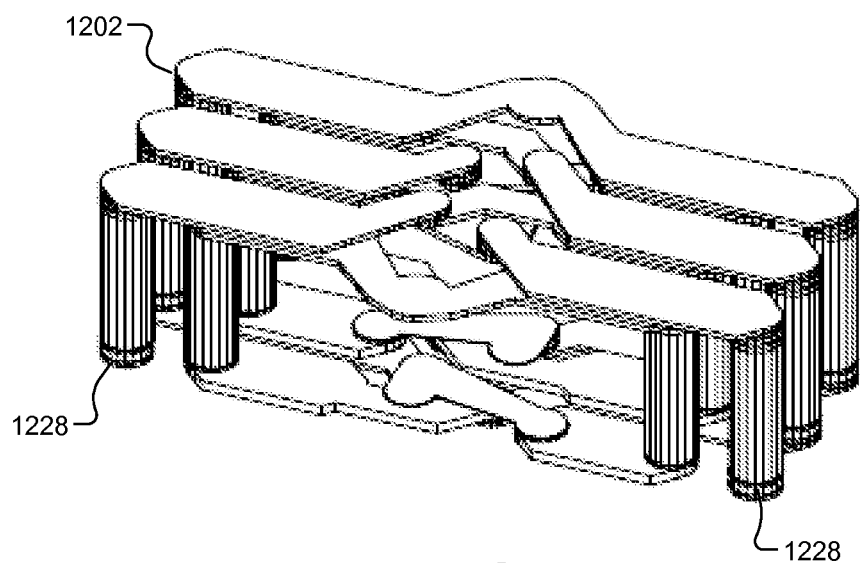
FIG. 57 shows a perspective view of another double-loop 3D balun.
Figure 58:
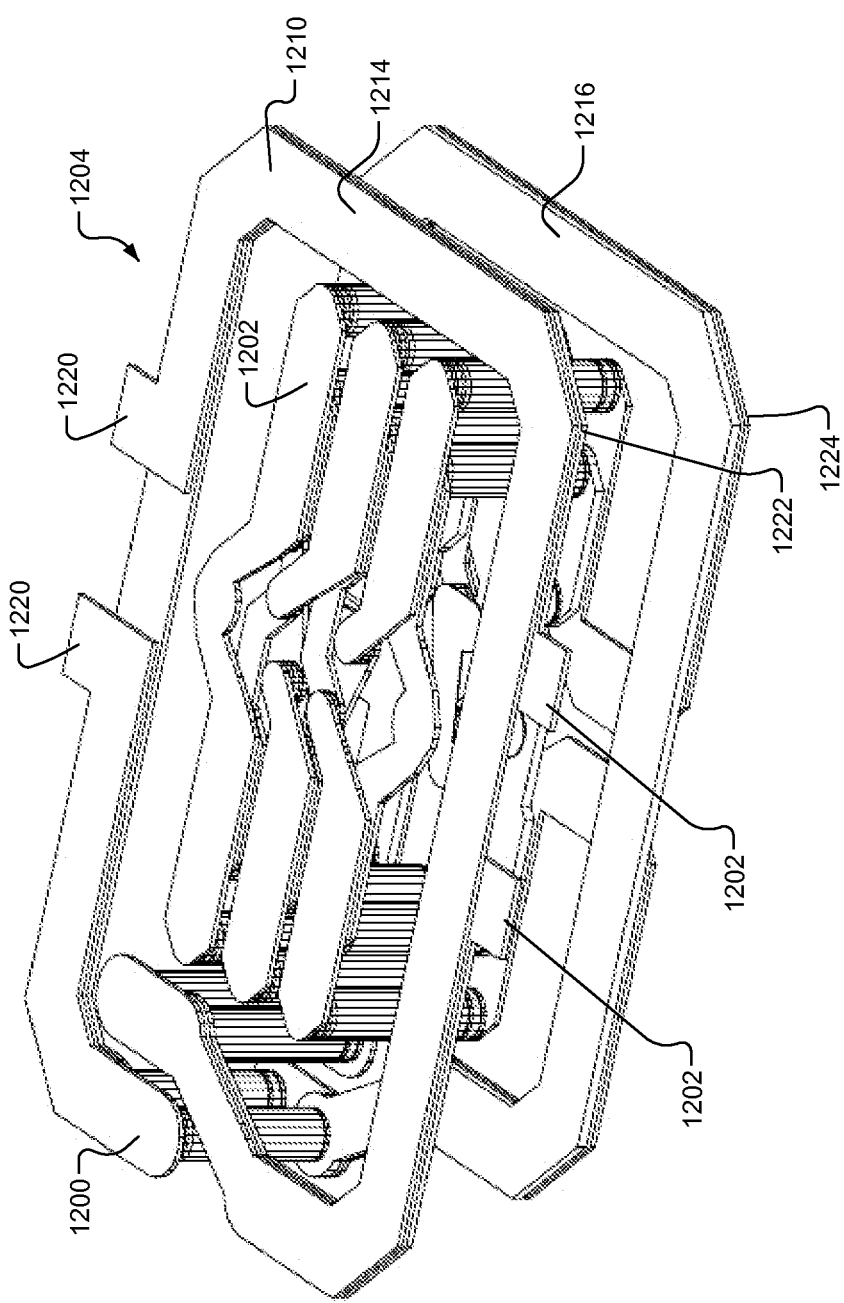
FIG. 58 shows a 3D hybrid balun incorporating the burger balun of FIG. 56 and the double-loop 3D balun of FIG. 57.

FIG. 56 shows a burger balun 1200. FIG. 57 shows a type of double-loop 3D balun 1202 similar to the double-loop 3D balun of FIG. 43-47. FIG. 58 shows a 3D hybrid balun 1204 that includes the burger balun 1200 and the double-loop 3D balun 1202. Loops of the burger balun 1200 are extended by inductances of the double-loop 3D balun 1202. The burger balun 1200 includes figure-8 structures 1210, 1211. The figure-8 structure has inputs 1212 and loops 1214, 1216. The figure-8 structure has outputs 1220 and loops 1222, 1224. The loop 1224 has conductors 1226 that connect to inputs 1228 of a first inductance of the double-loop 3D balun 1202. The loop 1216 has conductors 1230 that are connected to outputs of the second inductance of the double-loop 3D balun 1202.

Figure 59:
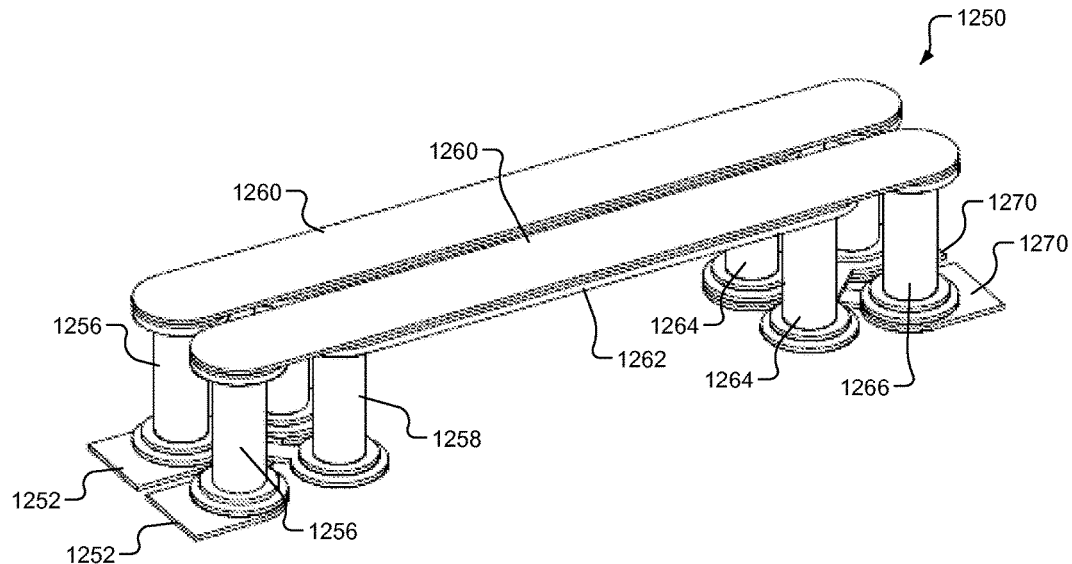
FIG. 59 a top perspective view of a directional coupler/balun according to an embodiment of the present disclosure.
Figure 60:
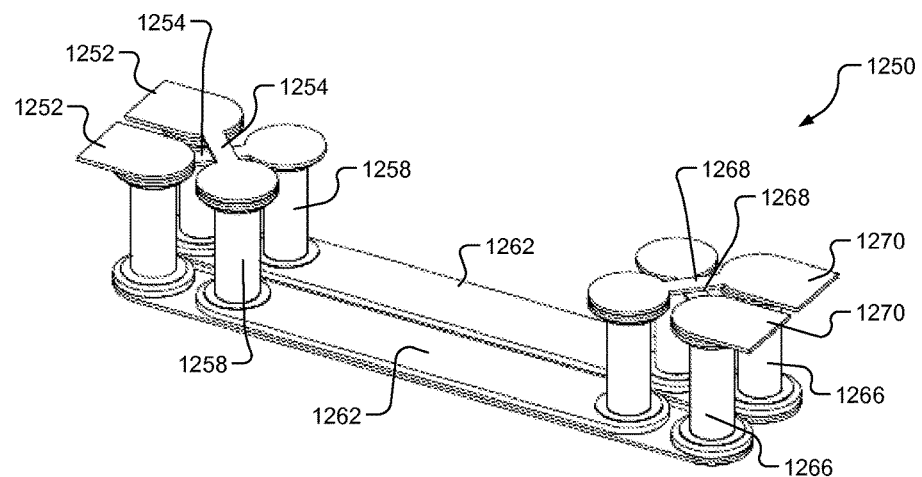
FIG. 60 is bottom perspective view of the directional coupler/balun of FIG. 59.

FIGS. 59-60 show a passive device 1250 that may be configured to be a directional coupler or a balun. The passive device 1250 includes first end conductors 1252, first crossover conductors 1254, two input sets of vias 1256, 1258, two sets of intermediate conductors 1260, 1262, two output sets of vias 1264, 1266, second crossover conductors 1268, and second end conductors 1270. Two conductive paths are provided by the elements of the passive device 1250. Each of the paths has an inductance. One of the inductances may be used as an input inductance and transfer energy to the other inductance, which may be used as an output conductance. Each of the conductive paths includes corresponding ones of the elements 1252, 1254, 1256, 1258, 1260, 1262, 1264, 1266, 1268, 1270. Each of the conductive paths includes one of each of the vias 1256, 1258, 1264, 1266 and one of each of the conductors 1260 and 1262, such that each of the paths includes 4 vias and 2 intermediate conductors. The vias 1258, the conductors 1262 and the vias 1264 are disposed under the conductors 1260 and between the vias 1256 and the vias 1266.

When the passive device 1250 is configured as a directional coupler, widths of the conductors 1252, 1254, 1260, 1262, 1268 and 1270 are larger than when configured as a balun. An example width W is shown in FIG. 60.

The wireless communications described in the present disclosure can be conducted in full or partial compliance with IEEE standard 802.11-2012, IEEE standard 802.16-2009, IEEE standard 802.20-2008, and/or Bluetooth® Core Specification v4.0. In various implementations, Bluetooth® Core Specification v4.0 may be modified by one or more of Bluetooth® Core Specification Addendums 2, 3, or 4. In various implementations, IEEE 802.11-2012 may be supplemented by draft IEEE standard 802.11ac, draft IEEE standard 802.11ad, and/or draft IEEE standard 802.11ah.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. As used herein, the phrase at least one of A, B, and C should be construed to mean a logical (A OR B OR C), using a non-exclusive logical OR, and should not be construed to mean "at least one of A, at least one of B, and at least one of C." It should be understood that one or more steps within a method may be executed in different order (or concurrently) without altering the principles of the present disclosure.

In this application, including the definitions below, the term "module" or the term "controller" may be replaced with the term "circuit." The term "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

The term code, as used above, may include software, firmware, and/or microcode, and may refer to programs, routines, functions, classes, data structures, and/or objects. The term shared processor circuit encompasses a single processor circuit that executes some or all code from multiple modules. The term group processor circuit encompasses a processor circuit that, in combination with additional processor circuits, executes some or all code from one or more modules. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple modules. The term group memory circuit encompasses a memory circuit that, in combination with additional memories, stores some or all code from one or more modules.

The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general purpose computer to execute one or more particular functions embodied in computer programs. The functional blocks, flowchart components, and other elements described above serve as software specifications, which can be translated into the computer programs by the routine work of a skilled technician or programmer.

The computer programs include processor-executable instructions that are stored on at least one non-transitory, tangible computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language) or XML (extensible markup language), (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective C, Haskell, Go, SQL, R, Lisp, Java®, Fortran, Perl, Pascal, Curl, OCaml, Javascript®, HTML5, Ada, ASP (active server pages), PHP, Scala, Eiffel, Smalltalk, Erlang, Ruby, Flash®, Visual Basic®, Lua, and Python®.

None of the elements recited in the claims are intended to be a means-plus-function element within the meaning of 35 U.S.C. §112(f) unless an element is expressly recited using the phrase "means for," or in the case of a method claim using the phrases "operation for" or "step for."

What is claimed is:

1. A circuit comprising:
    a die comprising a first substrate and at least one active device;
    an integrated passive device comprising a first layer, a second substrate, a second layer and an inductance, wherein the inductance comprises a plurality of vias, wherein the plurality of vias are implemented in the second substrate, and wherein the inductance is implemented on the first layer, the second substrate, and the second layer, and wherein a resistivity per unit area of the second substrate is greater than a resistivity per unit area of the first substrate; and
    a third layer disposed between the die and the integrated passive device, wherein the third layer comprises a plurality of pillars, wherein the plurality of pillars respectively connect ends of the inductance to the at least one active device,
    wherein the die, the integrated passive device and the third layer are disposed relative to each other to form a stack.

2. The circuit of claim 1, wherein the ends of the inductance are connected to a same one of the at least one active device.

3. The circuit of claim 1, wherein the ends of the inductance are connected to different ones of the at least one active device.

4. The circuit of claim 1, wherein the inductance comprises:
    a first via;
    a second via;
    a first conductor implemented in the first layer and connecting the first via to the second via; and
    a second conductor implemented in the second layer.

5. The circuit of claim 1, wherein the inductance comprises:

a first set of vias;
a second set of vias;
a first set of conductors implemented in the first layer and connecting the first set of vias respectively to the second set of vias; and
a second set of conductors implemented in the second layer and connecting the first set of vias respectively to the second set of vias.

6. The circuit of claim 5, wherein:
the first set of conductors and the second set of conductors are configured such that a plurality of angles between consecutive pairs of the conductors of the inductance are symmetric;
the plurality of angles comprise first angles and second angles;
the second angles are opposite a centerline of the inductance from the first angles;
each consecutive pair of the conductors comprises one of the conductors in the first set of conductors and one of the conductors in the second set of conductors; and
the first angles are symmetric to the second angles such that a center of a magnetic field, extending through a center of the inductance between the first set of vias and the second set of vias and between the first set of conductors and the second set of conductors, is equidistant from the each of the first set of vias and each of the second set of vias.

7. The circuit of claim 5, wherein the first set of conductors extend parallel to and opposite the first set of conductors.

8. The circuit of claim 5, wherein:
each of the second set of conductors comprises a first portion and a second portion; the first portions extend parallel to each other and parallel to the first set of conductors; and
each of the second portions extend parallel to each other and do not extend parallel to the first set of conductors.

9. The circuit of claim 8, wherein some of the first set of conductors extend between corresponding pairs of the second set of vias.

10. The circuit of claim 9, wherein:
the inductance is an electrostatic discharge inductance;
the first set of conductors comprises first portions and second portions;
the second set of conductors comprises first portions and second portions;
the first portions of the first set of conductors and the first portions of the second set of conductors provide a first magnetic field;
the second portions of the first set of conductors and the second portions of the second set of conductors provide a second magnetic field; and
the first magnetic field extends perpendicular to the second magnetic field.

11. The circuit of claim 8, wherein:
the first set of vias comprises a first series of vias and a second series of vias;
the second series of vias is offset from the first series of vias;
the second set of vias comprises a third series of vias and a fourth series of vias;
the third series of vias is offset from the fourth series of vias; and each of the second portions of the second set of conductors connects one of the first portions of the second set of conductors to one of the third series of vias.

12. The circuit of claim 5, wherein a pitch between adjacent ones of the plurality of vias is less than:
a pitch between adjacent ones of the first set of conductors; and
a pitch between adjacent ones of the second set of conductors.

13. The circuit of claim 5, wherein the first set of conductors and the second set of conductors are arranged in a saw-tooth pattern.

14. The circuit of claim 1, comprising a balun, wherein:
the inductance is a first inductance;
the balun comprises the plurality of vias, the first inductance, a second inductance, a first set of conductors and a second set of conductors;
the plurality of vias comprise first vias and second vias;
the first inductance comprises the first vias and the first set of conductors; and the second inductance comprises the second vias and the second set of conductors.

15. The circuit of claim 14, wherein:
some of the first set of conductors is implemented on the first layer;
some of the first set of conductors is implemented on the second layer;
some of the second set of conductors is implemented on the first layer; and some of the second set of conductors is implemented on the second layer.

16. The circuit of claim 14, wherein the balun is a single-turn balun such that:
the first inductance comprises only a single loop; and
the second inductance comprises only a single loop.

17. The circuit of claim 14, wherein:
each of the first set of conductors and each of the second set of conductors extends between the first vias and the second vias; and
the first set of conductors overlaps respectively the second set of conductors.

18. The circuit of claim 17, wherein:
the first layer comprises a first sub-layer and a second sub-layer;
the second layer comprises a third sub-layer and fourth sub-layer;
the first set of conductors comprises a first conductor and a second conductor;
the second set of conductors comprises a third conductor and a fourth conductor;
the first conductor is implemented in the first sub-layer;
the third conductor is implemented in the second sub-layer;
the second conductor is implemented in the third sub-layer; and the fourth conductor is implemented in the fourth sub-layer.

19. The circuit of claim 14, wherein the balun is a multi-turn balun such that:
the first inductance comprises a plurality of loops; and
the second inductance comprises a plurality of loops.

20. The circuit of claim 19, wherein:
the balun comprises a plurality of crossovers;
the plurality of crossovers are connected to the first set of conductors and the second set of conductors; and
two of the plurality of crossovers extends between each consecutive pair of the turns of the balun.

21. The circuit of claim 14, wherein the balun is a single-turn figure-8 balun.

22. The circuit of claim 14, wherein the balun is a multi-turn figure-8 balun.

23. The circuit of claim 22, wherein:
the first inductance comprises a first crossover, a first set of loops and a second set of loops; and
the second inductance comprises a second crossover, a third set of loops and a fourth set of loops.

24. The circuit of claim 14, wherein the balun is a stacked balun such that:
the first inductance is within the second inductance; and
the second set of conductors overlap respectively the first set of conductors.

25. The circuit of claim 24, wherein the first vias extend parallel to the second vias.

26. The circuit of claim 14, wherein the balun is a double loop balun such that:
every other loop of the first inductance is within every other loop of the second inductance; and
every other loop of the second inductance is within every other loop of the first inductance.

27. The circuit of claim 14, wherein:
the balun comprises a plurality of loops; and
the plurality of loops are stacked, overlap each other, and are on respective layers of the integrated passive device.

28. The circuit of claim 14, wherein:
the balun comprises a first loop, a second loop, a third loop, and a fourth loop the first set of conductors comprises a first conductor and a second conductor; the second set of conductors comprises a third conductor and a fourth conductor;
the first conductor provides the first loop;
the second conductor provides the third loop;
the third conductor provides the second loop;
the fourth conductor provides the fourth loop;
the first loop is stacked on the second loop;
the third loop is stacked on the fourth loop; and
the plurality of vias are disposed between the second loop and the third loop.

29. The circuit of claim 14, comprising a hybrid circuit comprising:
the balun, wherein the balun is a first balun; and
a second balun connected to the first balun, wherein the first balun and the second balun collectively have a single differential input and a single differential output.

30. The circuit of claim 1, comprising a combiner, wherein:
the inductance is a first inductance;
the combiner comprises the plurality of vias, the first inductance, a second inductance, a third inductance, a first set of conductors, a second set of conductors, and a third set of conductors;
the plurality of vias comprise first vias, second vias and third vias;
the first inductance comprises the first vias and the first set of conductors;
the second inductance comprises the second vias and the second set of conductors; and
the third inductance comprises the third vias and the third set of conductors.

31. The circuit of claim 30, wherein the combiner is a single-turn figure-8 combiner.

32. The circuit of claim 31, wherein the combiner is a multi-turn figure-8 combiner.

33. The circuit of claim 32, wherein the combiner comprises:
only two differential inputs implemented respectively via the first inductance and the second inductance; and
the third inductance comprises only a single crossover.

34. The circuit of claim 32, wherein the combiner comprises:
a plurality of inputs implemented by the first inductance, the second inductance and the third inductance; and
a fourth inductance comprising a plurality of crossovers.

35. The circuit of claim 30, wherein:
the combiner comprises a plurality of loops; and
the plurality of loops are stacked, overlap each other, and are on respective layers of the integrated passive device.

36. The circuit of claim 30, wherein:
the first inductance comprises a first loop;
the second inductance comprises a second loop;
the third inductance comprises a third loop and a fourth loop;
the first loop is stacked on the third loop; and
the fourth loop is stacked on the second loop.

37. The circuit of claim 30, wherein the combiner is a figure-8 power combiner such that:
the first inductance comprises a first loop and a second loop;
the second inductance comprises a third loop and a fourth loop;
the third inductance includes a first pair of loops and a second pair of loops;
the first pair of loops are stacked respectively on the first loop and the second loop; and
the second pair of loops is stacked respectively on the third loop and the fourth loop.

38. The circuit of claim 1, comprising a directional coupler or a balun, wherein the directional coupler or the balun includes the inductance.

39. A method of forming a stack of a circuit, the method comprising:
providing a die comprising a first substrate and at least one active device;
providing an integrated passive device comprising a first layer, a second substrate, a second layer and an inductance, wherein the inductance comprises a plurality of vias, wherein the plurality of vias are implemented in the second substrate, and wherein the inductance is implemented on the first layer, the second substrate, and the second layer, and wherein a resistivity per unit area of the second substrate is greater than a resistivity per unit area of the first substrate;
disposing a third layer between the die and the integrated passive device, wherein the third layer comprises a plurality of pillars, wherein the plurality of pillars respectively connect ends of the inductance to the at least one active device; and
disposing the die, the integrated passive device and the third layer relative to each other to form the stack.

40. The method of claim 39, further comprising providing a combiner, wherein the combiner comprises the inductance.

41. The method of claim 39, further comprising providing a directional coupler or a balun, wherein the directional coupler or the balun comprise the inductance.

* * * * *